United States Patent
Coyne et al.

(10) Patent No.: US 10,338,132 B2
(45) Date of Patent: Jul. 2, 2019

(54) WEAR-OUT MONITOR DEVICE

(71) Applicant: Analog Devices Global, Hamilton (BM)

(72) Inventors: Edward John Coyne, Athenry (IE); Alan J. O'Donnell, Castletroy (IE); Colm Patrick Heffernan, Annacotty (IE); Kevin B. Manning, Andover, MA (US); Mark Forde, Nenagh (IE); David J. Clarke, Patrickswell (IE); Thomas G. O'Dwyer, Arlington, MA (US); David Aherne, Limerick (IE); Michael A. Looby, Ballysheedy (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/291,742

(22) Filed: Oct. 12, 2016

(65) Prior Publication Data
US 2017/0299649 A1    Oct. 19, 2017

Related U.S. Application Data

(60) Provisional application No. 62/324,828, filed on Apr. 19, 2016.

(51) Int. Cl.
*G01R 31/28* (2006.01)

(52) U.S. Cl.
CPC ..... *G01R 31/2879* (2013.01); *G01R 31/2874* (2013.01)

(58) Field of Classification Search
CPC ........................ G01R 31/2879; G01R 31/2874
(Continued)

(56) References Cited

U.S. PATENT DOCUMENTS

| 5,666,127 A | 9/1997 | Kochiyama et al. |
| 5,784,242 A | 7/1998 | Watt |

(Continued)

FOREIGN PATENT DOCUMENTS

| CN | 102576774 | 7/2012 |
| CN | 103490493 | 1/2014 |

(Continued)

OTHER PUBLICATIONS

Haus, Hermann A. and James R. Melcher, Electromagnetic Fields and Energy, Chapter 6 (Massachusetts Institute of Technology: MIT OpenCourseWare). Available at: http://ocw.mit.edu.resources/res-6-001-electromagnetic-fields-and-energy-spring-2008/chapter-6/06.pdf (accessed Jul. 27, 2015). License: Creative Commons Attribution-NonCommercial-Share-Alike. Also available from Prentice-Hall: Englewood Cliffs, NJ, 1989. ISBN: 9780132490207.

(Continued)

*Primary Examiner* — Farhana A Hoque
(74) *Attorney, Agent, or Firm* — Knobbe, Martens, Olson & Bear LLP

(57) ABSTRACT

The disclosed technology generally relates to integrated circuit devices with wear out monitoring. An integrated circuit device includes a core circuit and a wear-out monitor device. The wear-out monitor device configured to adjust an indication of wear out of the core circuit regardless of whether the core circuit is activated The integrated circuit further includes a sensing circuit coupled to the wear-out monitor device and configured to detect an electrical property of the wear-out monitor device that is indicative of a wear-out level of the core-circuit.

33 Claims, 45 Drawing Sheets

(58) Field of Classification Search
USPC .................................. 324/762.01; 438/14
See application file for complete search history.

(56) References Cited

U.S. PATENT DOCUMENTS

| | | | |
|---|---|---|---|
| 5,946,175 A | 8/1999 | Yu | |
| 6,236,087 B1 | 5/2001 | Daly et al. | |
| 6,249,410 B1 | 6/2001 | Ker et al. | |
| 6,411,544 B1 | 6/2002 | Devin | |
| 6,645,309 B1 | 11/2003 | Myers | |
| 6,819,539 B1 | 11/2004 | Wright et al. | |
| 6,898,061 B1 | 5/2005 | Kimber et al. | |
| 6,920,026 B2 | 7/2005 | Chen et al. | |
| 7,142,400 B1 | 11/2006 | Williams et al. | |
| 7,268,517 B2 | 9/2007 | Rahmel et al. | |
| 7,274,545 B2 | 9/2007 | Marum et al. | |
| 7,411,767 B2 | 8/2008 | Huang et al. | |
| 7,514,804 B2 | 4/2009 | Wang | |
| 7,570,468 B2 | 8/2009 | Bernard et al. | |
| 7,593,202 B2 | 9/2009 | Khazhinsky et al. | |
| 7,630,184 B2 | 12/2009 | Crain et al. | |
| 7,791,481 B2 | 9/2010 | Landt et al. | |
| 7,989,936 B2 | 8/2011 | McCain | |
| 8,000,067 B1 | 8/2011 | Jin et al. | |
| 8,068,319 B1 | 11/2011 | Chan et al. | |
| 8,112,138 B2 | 2/2012 | Reggiardo | |
| 8,164,113 B2 | 4/2012 | Lin et al. | |
| 8,169,760 B2 | 5/2012 | Chang et al. | |
| 8,238,068 B2 | 8/2012 | Shannon et al. | |
| 8,354,300 B2 | 1/2013 | Henderson et al. | |
| 8,373,559 B2 | 2/2013 | McCain | |
| 8,400,743 B2 | 3/2013 | Kosonocky et al. | |
| 8,520,351 B2 | 8/2013 | Hong | |
| 8,582,261 B2 | 11/2013 | Salcedo et al. | |
| 8,630,072 B2 | 1/2014 | Smith | |
| 8,755,195 B2 | 6/2014 | Savory et al. | |
| 8,796,729 B2 | 8/2014 | Clarke et al. | |
| 8,853,799 B2 | 10/2014 | O'Donnell | |
| 8,957,488 B2 | 2/2015 | Keysar et al. | |
| 9,311,807 B2 | 4/2016 | Schultz et al. | |
| 9,380,949 B2 | 7/2016 | Schuessler | |
| 9,389,681 B2 | 7/2016 | Sankar et al. | |
| 9,871,373 B2 | 1/2018 | O'Donnell et al. | |
| 10,032,683 B2 | 7/2018 | Davis et al. | |
| 2002/0076840 A1* | 6/2002 | Englisch | G03F 1/40 438/14 |
| 2004/0027159 A1 | 2/2004 | Oertle et al. | |
| 2005/0127953 A1 | 6/2005 | Oertle et al. | |
| 2006/0274799 A1 | 12/2006 | Collins et al. | |
| 2006/0284302 A1 | 12/2006 | Kim et al. | |
| 2007/0174011 A1 | 7/2007 | Enta | |
| 2007/0230073 A1 | 10/2007 | Ker et al. | |
| 2007/0297105 A1 | 12/2007 | Brennan et al. | |
| 2008/0074817 A1 | 3/2008 | Crain et al. | |
| 2008/0129523 A1 | 6/2008 | Assimos | |
| 2008/0266730 A1 | 10/2008 | Viborg et al. | |
| 2008/0297939 A1 | 12/2008 | Amemiya | |
| 2009/0287435 A1 | 11/2009 | Ker | |
| 2010/0141094 A1 | 6/2010 | Lee et al. | |
| 2010/0271742 A1 | 10/2010 | Shannon et al. | |
| 2011/0209744 A1 | 9/2011 | Hu | |
| 2011/0261489 A1 | 10/2011 | Zupcau et al. | |
| 2012/0001163 A1 | 1/2012 | Kobayashi et al. | |
| 2012/0006122 A1* | 1/2012 | Aitken | H01L 22/12 73/763 |
| 2012/0017962 A1 | 1/2012 | Skotnicki et al. | |
| 2012/0077291 A1 | 3/2012 | Pasveer et al. | |
| 2012/0153437 A1 | 6/2012 | Chen et al. | |
| 2012/0162849 A1 | 6/2012 | Tang | |
| 2012/0174582 A1 | 7/2012 | Moussavi | |
| 2013/0057111 A1 | 3/2013 | Mukter-Uz-Zaman et al. | |
| 2014/0062381 A1 | 3/2014 | Teggatz et al. | |
| 2014/0246066 A1 | 9/2014 | Chen et al. | |
| 2014/0362481 A1 | 12/2014 | Prabhu et al. | |
| 2015/0040677 A1 | 2/2015 | Hammerschmidt | |
| 2016/0009547 A1 | 1/2016 | Mason et al. | |
| 2016/0172849 A1 | 6/2016 | Dibra | |
| 2016/0285255 A1 | 9/2016 | O'Donnell et al. | |
| 2017/0126229 A1 | 5/2017 | Tan et al. | |
| 2018/0115155 A1 | 4/2018 | Kuo | |

FOREIGN PATENT DOCUMENTS

| | | |
|---|---|---|
| DE | 41 26 376 A1 | 2/1993 |
| DE | 4126376 * | 2/1993 |
| EP | 2 280 458 | 2/2011 |
| EP | 2 333 925 | 6/2011 |
| JP | H04-152664 | 5/1992 |
| JP | 2000-223685 | 8/2000 |
| JP | 2002-111041 | 4/2002 |
| JP | 2002-246514 | 8/2002 |
| JP | 2005-283389 | 10/2005 |
| JP | 2006-352136 | 12/2006 |
| JP | 2008-173462 | 7/2008 |
| JP | 2009-081160 | 4/2009 |
| JP | 2009-200189 | 9/2009 |
| TW | 200912555 | 3/2009 |
| TW | 201222830 | 6/2012 |
| TW | 201234138 | 8/2012 |
| TW | 201317559 | 5/2013 |
| TW | 201347002 | 11/2013 |
| TW | 201517213 | 5/2015 |
| WO | WO 2010/053997 | 5/2010 |
| WO | WO 2010/100929 | 9/2010 |
| WO | WO 2010/136919 | 12/2010 |

OTHER PUBLICATIONS

Huang, Gregory T., "Electroactive Polymers", MIT Technology Review, Dec. 1, 2002. Available at: http://www.technologyreview.com/article/401750/electroactive-polymers/ (accessed Jul. 27, 2015).

Jones, Scotten W., "Diffusion in Silicon", IC Knowledge LLC, 2000, 71 pgs.

Lee, Sanghyo, et al. "Triboelectric Energy Harvester Based on Wearable Textile Platforms Employing Various Surface Morphologies", Nano Energy, Mar. 2015, vol. 12, pp. 410-418.

Mhira, S., et al. "Mission Profile Recorder: An Aging Monitor for Hard Events",Reliability Physics Symposium (RPS), 2016 IEEE International, IEEE, 2016, pp. 4C-3-1-4C-3-5.

Suzuki, Yuji, "Development of a Mems Energy Harvester With High-Performance Polymer Electrets." Department of Mechanical Engineering, The University of Tokyo, Bunkyo-ku, Japan, Jan. 2010, 6 pages. Available at: http://blog.nus.edu.sg/a0066807/files/2011/03/047_Suzuki_9922.pdf (accessed Jul. 27, 2015).

Tasca, Dante M., "Pulse Power Failure Modes in Semiconductors", IEEE Transactions on Nuclear Science, vol. 17, Issue 6, Dec. 1970, pp. 364-372.

Wang, Xiaofei et al. "Silicon Odometers: Compact In Situ Aging Sensors for Robust System Design", IEE Micro, vol. 34, No. 6, Nov./Dec. 2014, pp. 74-86.

Wunsch, D.C., et al., "Determination of Threshold Failure Levels of Semiconductor Diodes and Transistors Due to Pulse Voltages, "IEEE Transactions on Nuclear Science, vol. 15, Issue 6, Dec. 1968, pp. 244-259.

"ESD Patent Report—Additional Search for Concepts in 3 US Patents and Ideas in Alan's May 5, 2014 email", Innography, 2013, 9 pages.

European Search Report dated Aug. 5, 2016 for European Patent Application No. 16160442.6 filed Mar. 15, 2016, 7 pages.

"Improvements to ESD Structures—Alternate Uses of ESD—Patent Report", Innography, 2013, 16 pgs.

U.S. Department of Transportation, Federal Highway Administration Research and Technology, "Chapter 2, Traffic Detector Handbook: Third Edition—vol. 1", May 2006. Available at: http:www.fhwa.dot.gov/publications/research/operations/its/06108/02a.cfm (accessed Jul. 27, 2015).

International Search Report and Writing Opinion dated Aug. 8, 2017 in PCT Application No. PCT/US2017/027988.

(56) References Cited

OTHER PUBLICATIONS

Search Report issued in Taiwan application No. 106113115 dated Oct. 19, 2017.
Bailey, Brian, "Minimizing Chip Aging Effects," Sep. 13, 2018 downloaded from https://semiengineering.com/minimizing-chip-aging-effects/ on Sep. 19, 2018, 24 pgs.
Bailey, Brian, "Chip Aging Becomes Design Problem," Aug. 9, 2018 downloaded from https://semiengineering.com/chip-aging-becomes-design-problem/ on Sep. 19, 2018, 30 pgs.
Mutschler, Ann Steffora, "Ensuring Chip Reliability from the Inside," May 31, 2018, downloaded from https://semiengineering.com/ensuring-chip-reliability-from-the-inside/ on Sep. 19, 2018, 22 pgs.
Mutschler, Ann Steffora, "Aging in Advanced Nodes," Sep. 17, 2018, downloaded from https://semiengineering.com/a-turning-point-for-aging/ on Sep. 19, 2018, 25 pgs.
Haghbayan et al., "Can dark silicon be exploited to prolong system lifetime?" ResearchGate, Article in IEEE Design and Test—Nov. 2016; IEEE CEDA, IEEE CASS, IEEE SSCS, and TTTC; Mar./Apr. 2016 2017; 10 pages.

\* cited by examiner

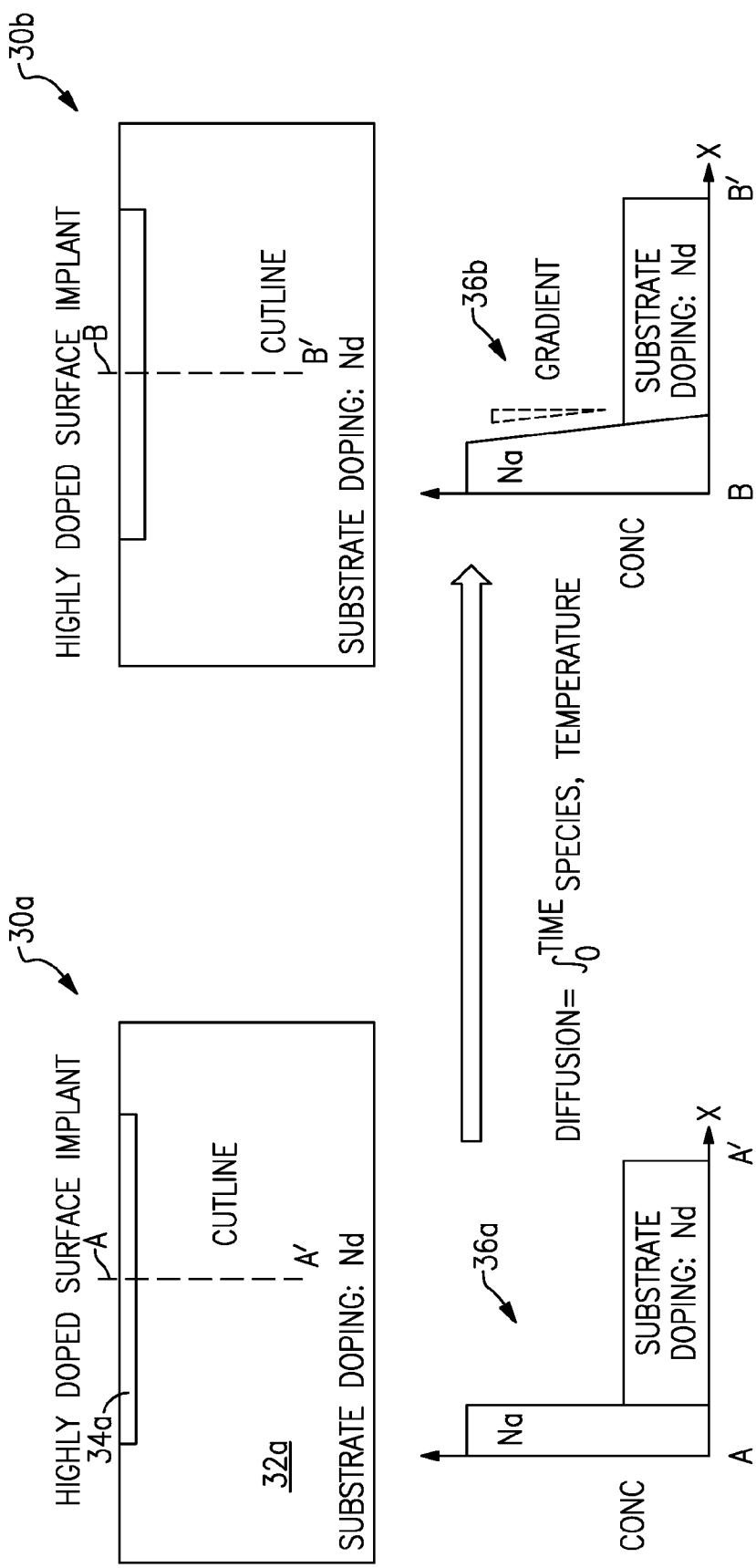

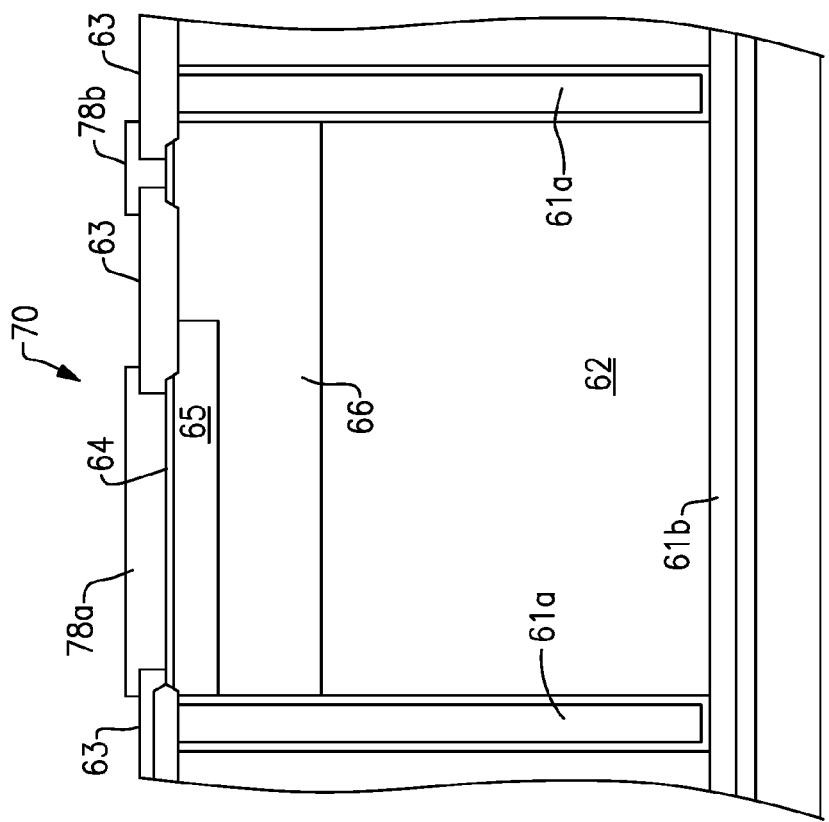
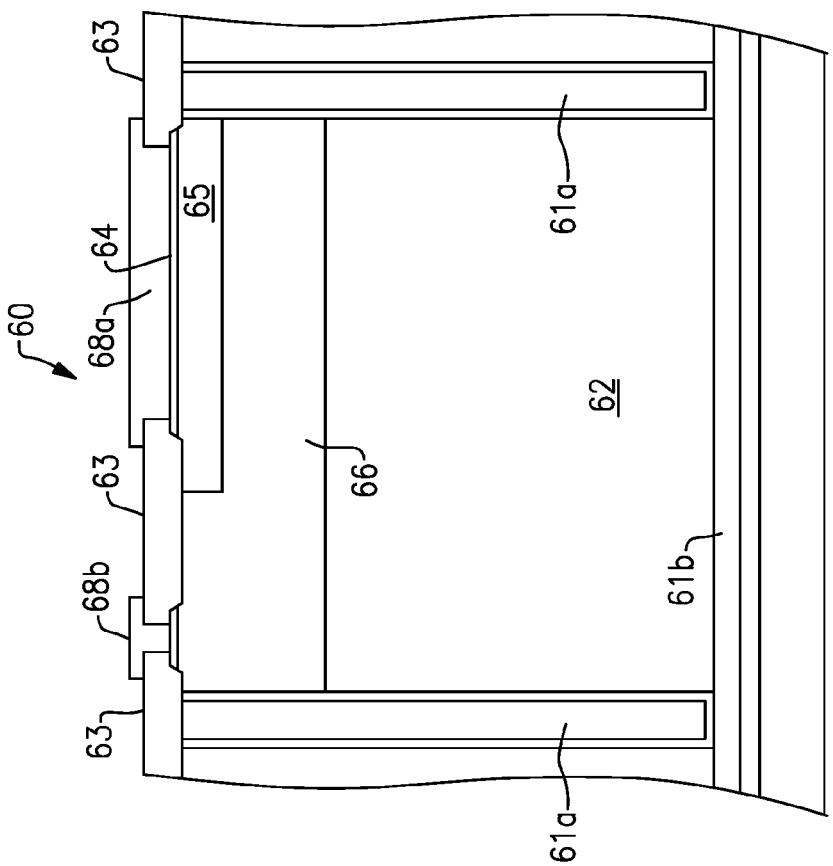

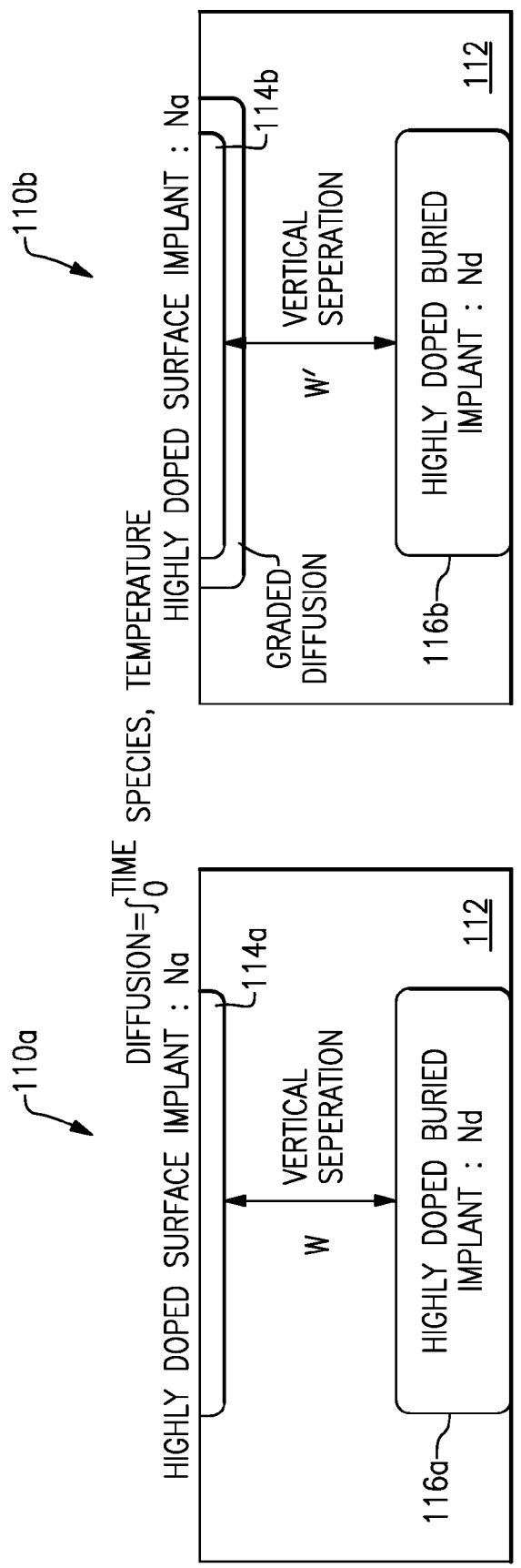

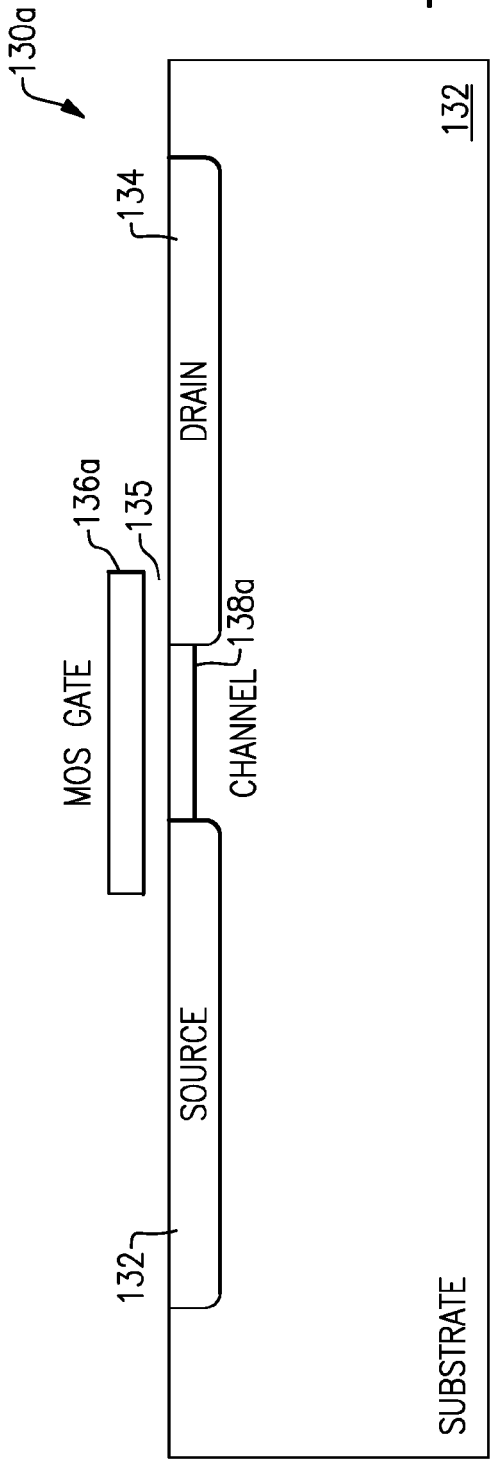
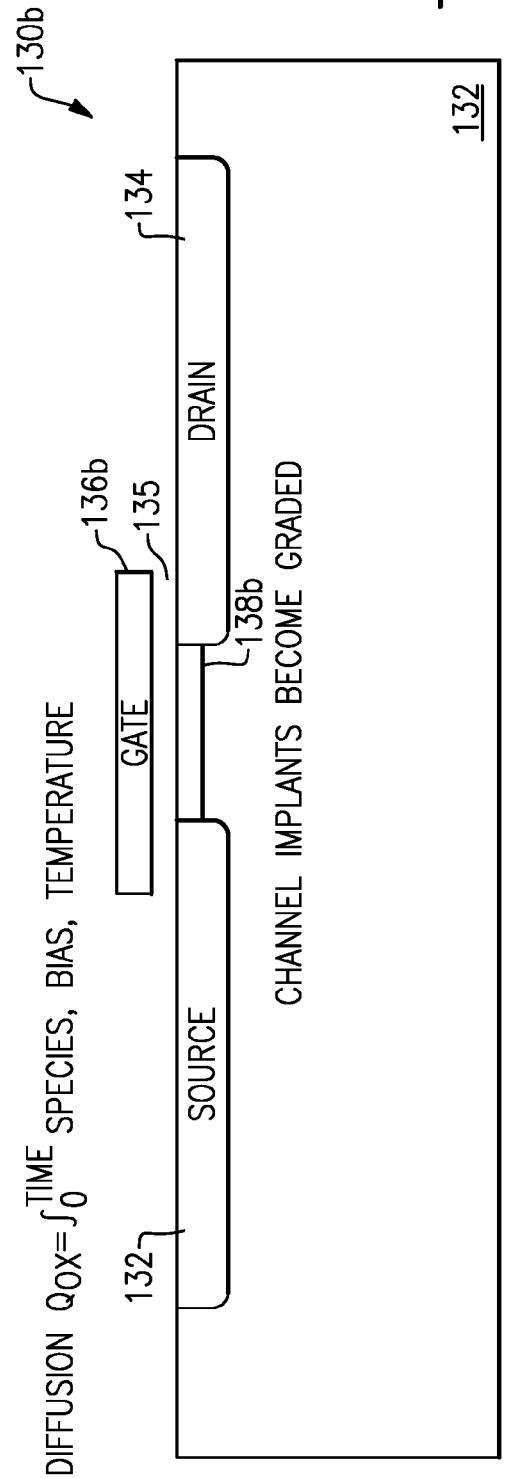
FIG.13A
FIG.13B

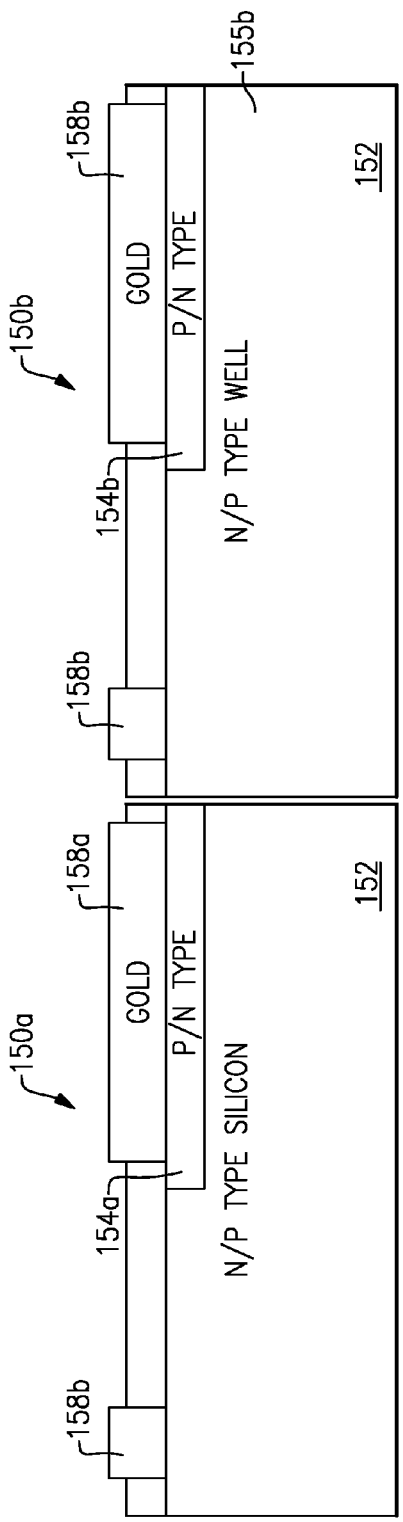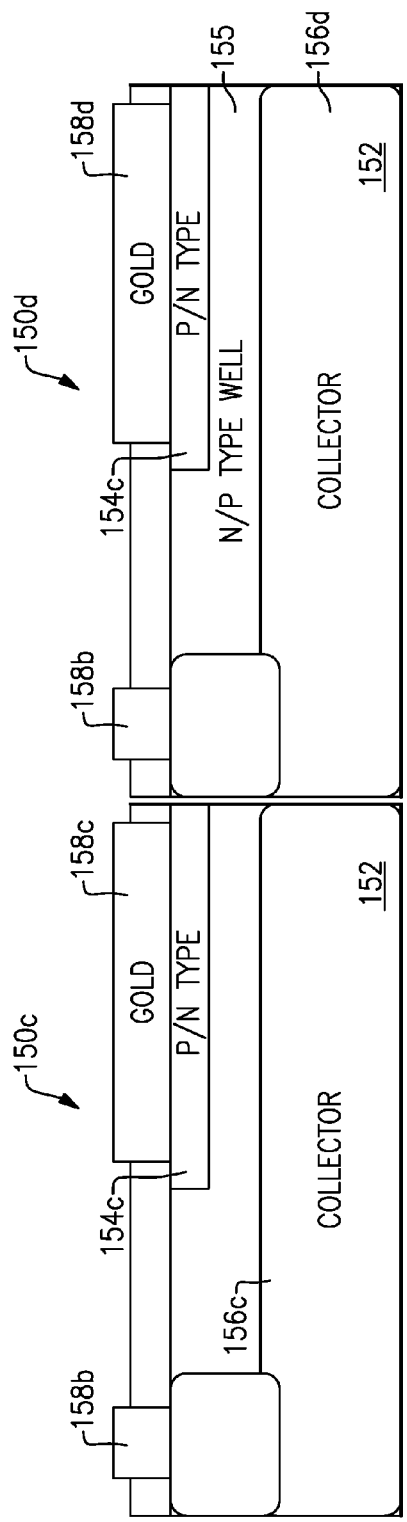

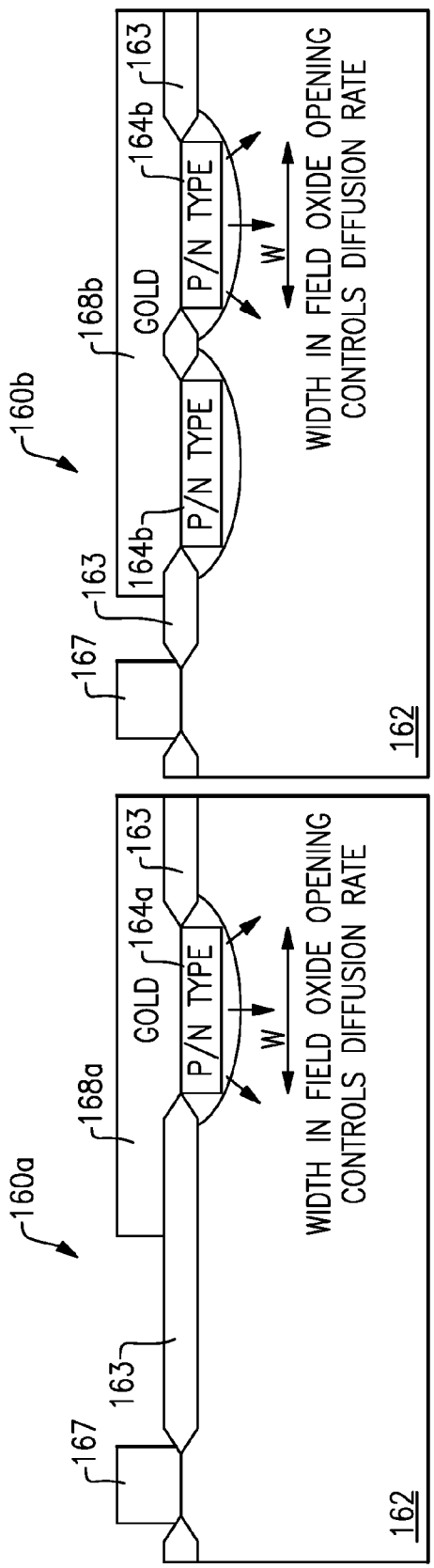
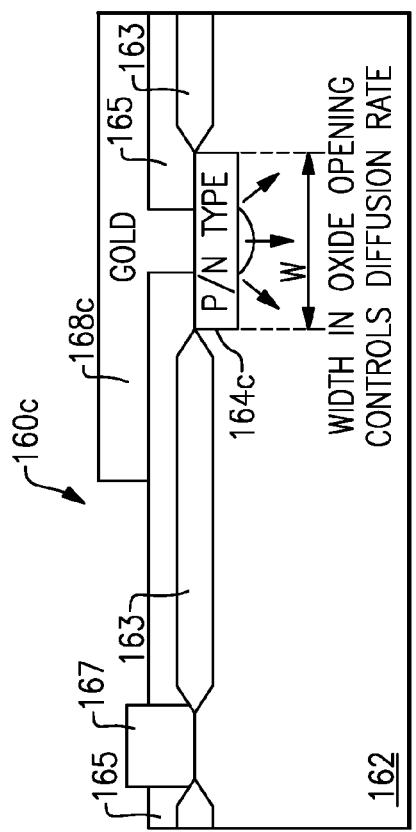
FIG.16A
FIG.16B
FIG.16C

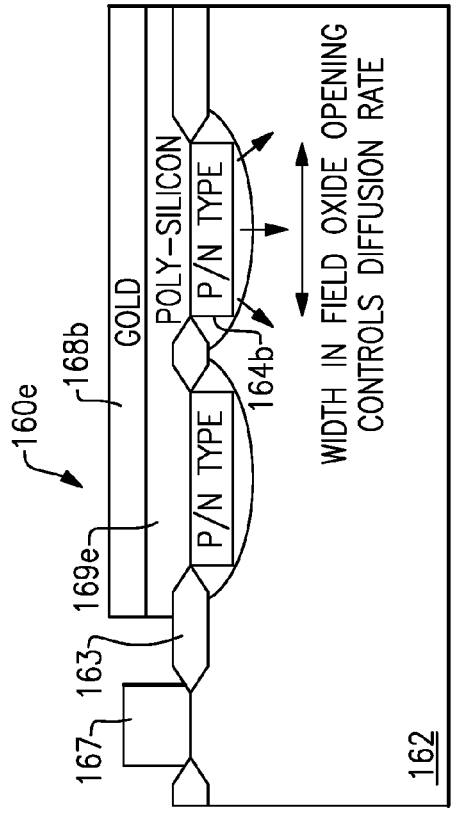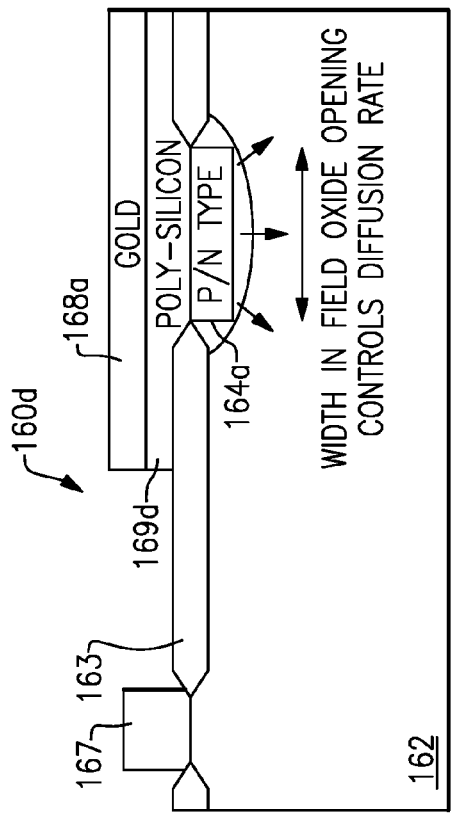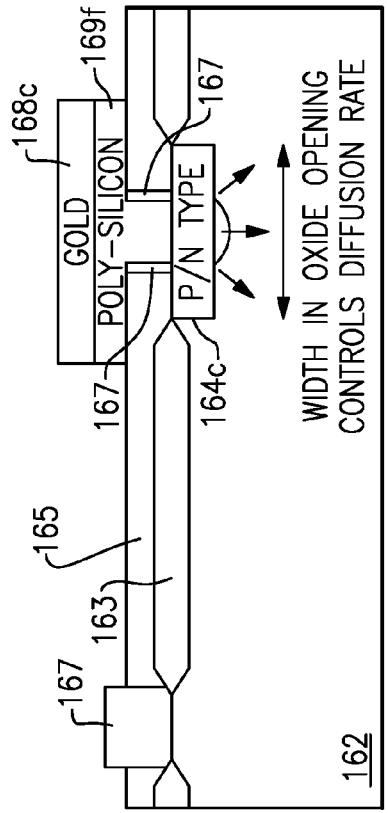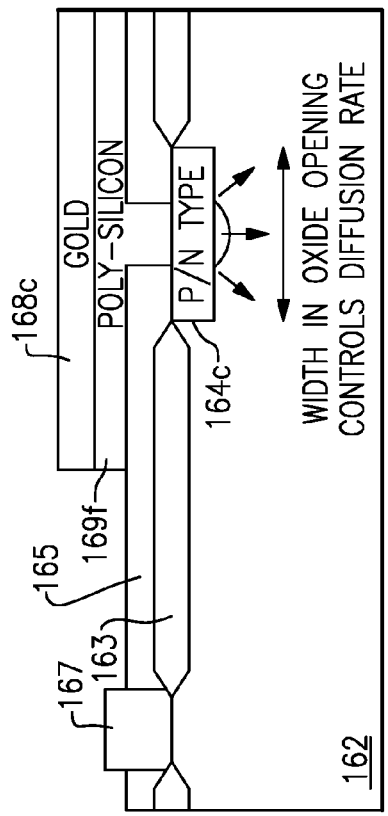

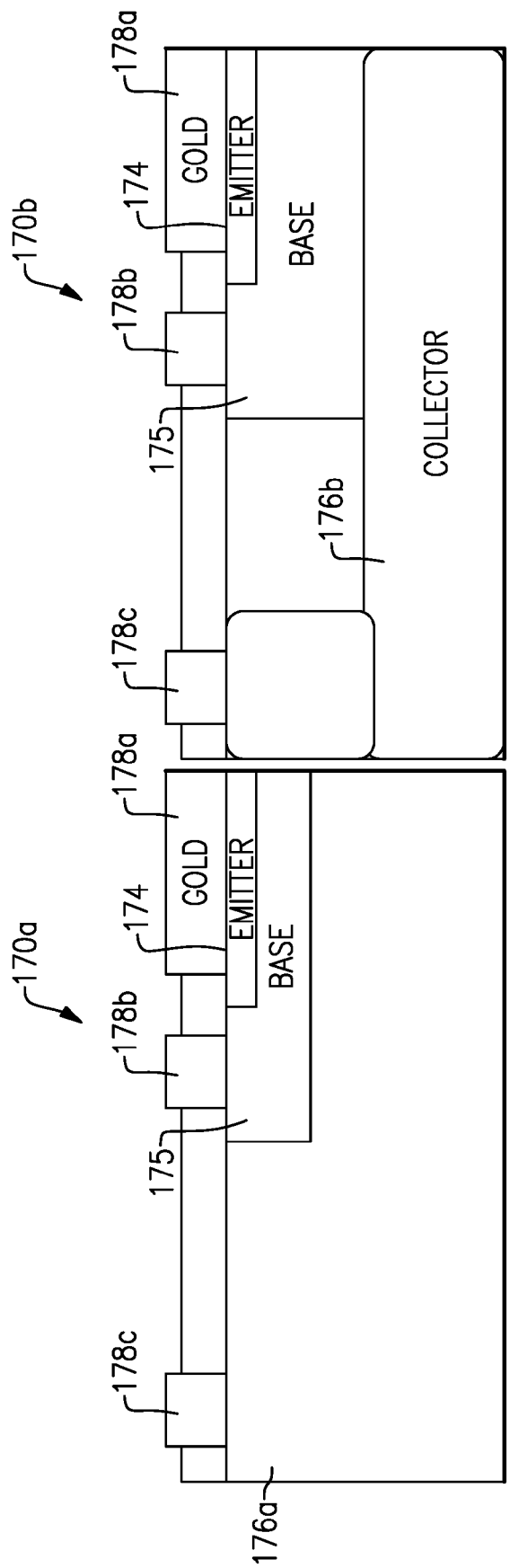

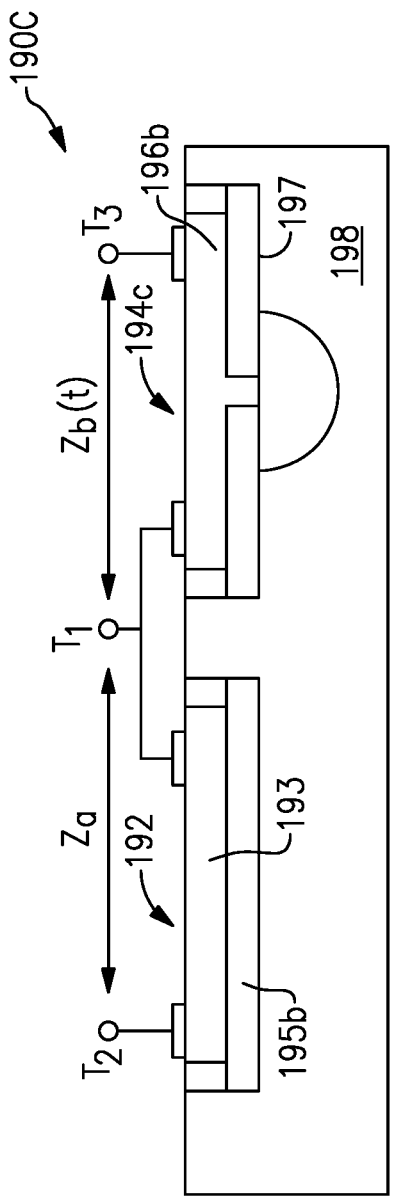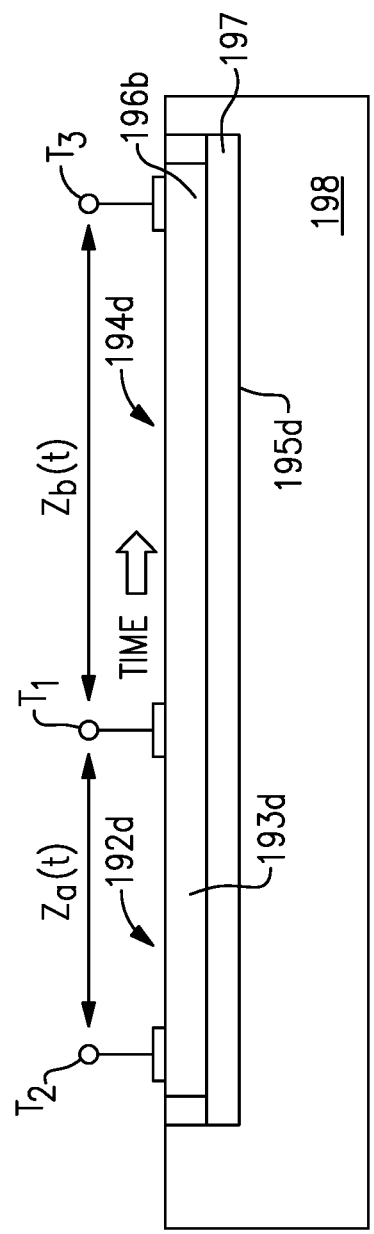

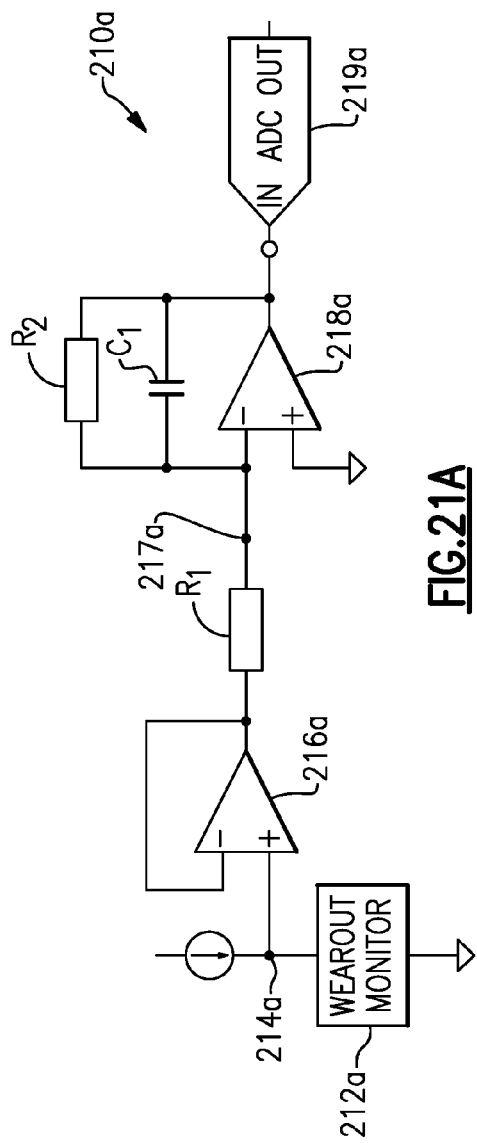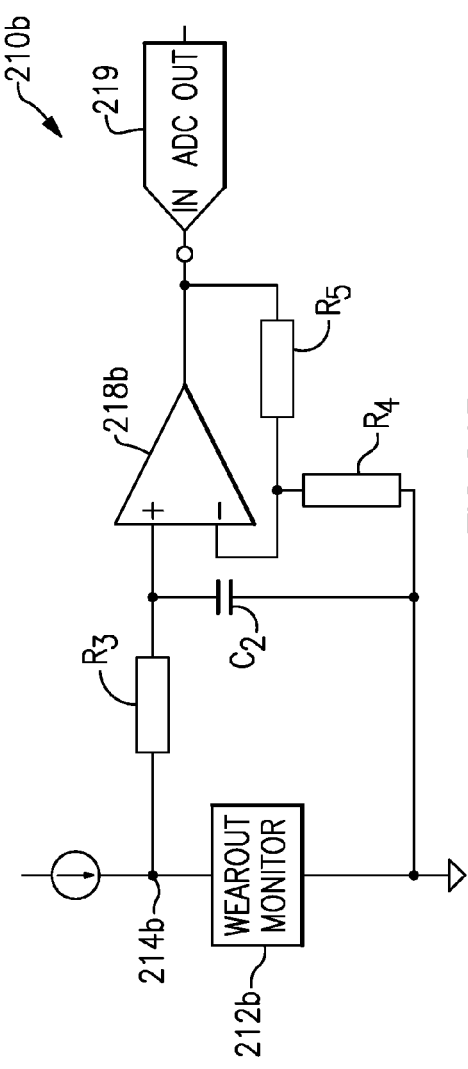
FIG.21A
FIG.21B

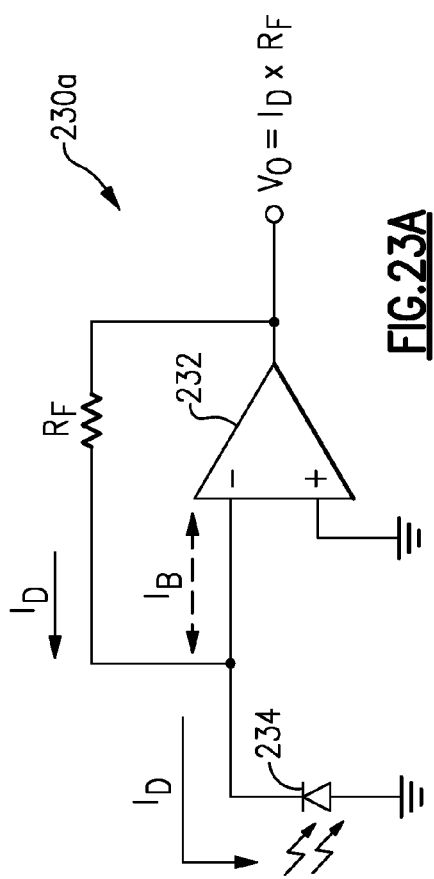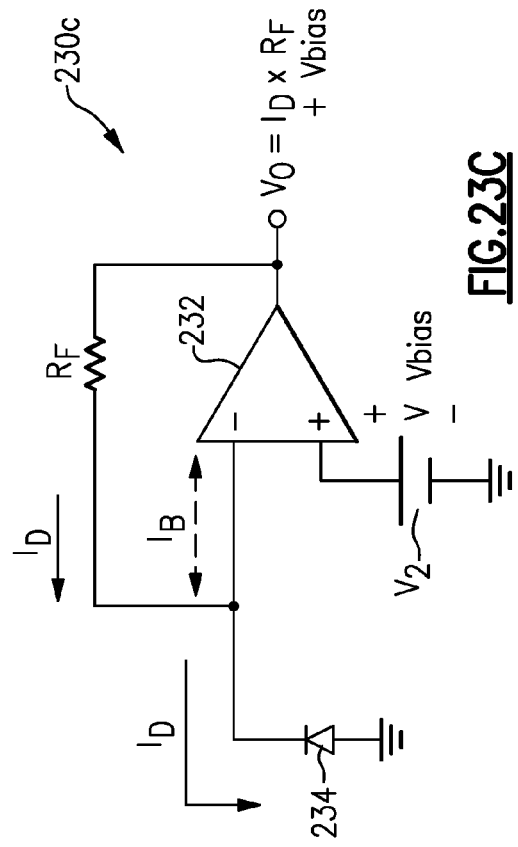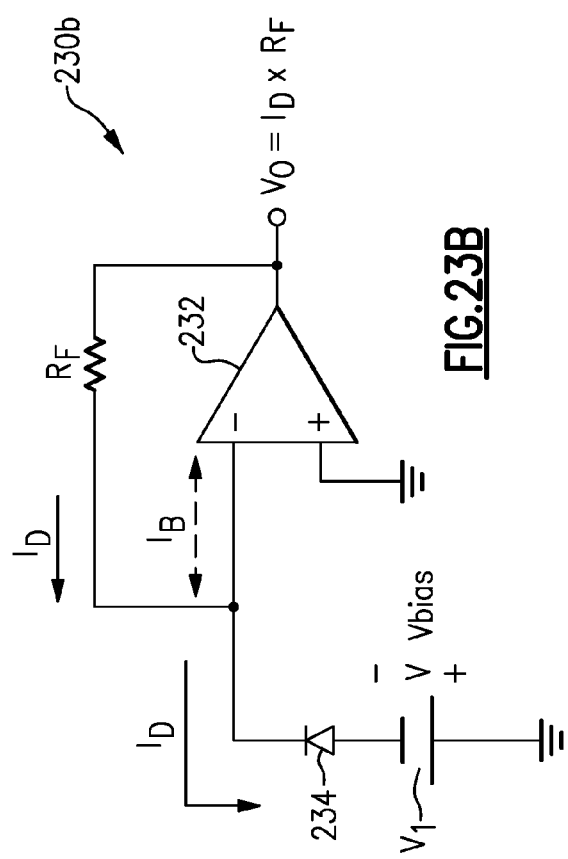
FIG.23A
FIG.23B
FIG.23C

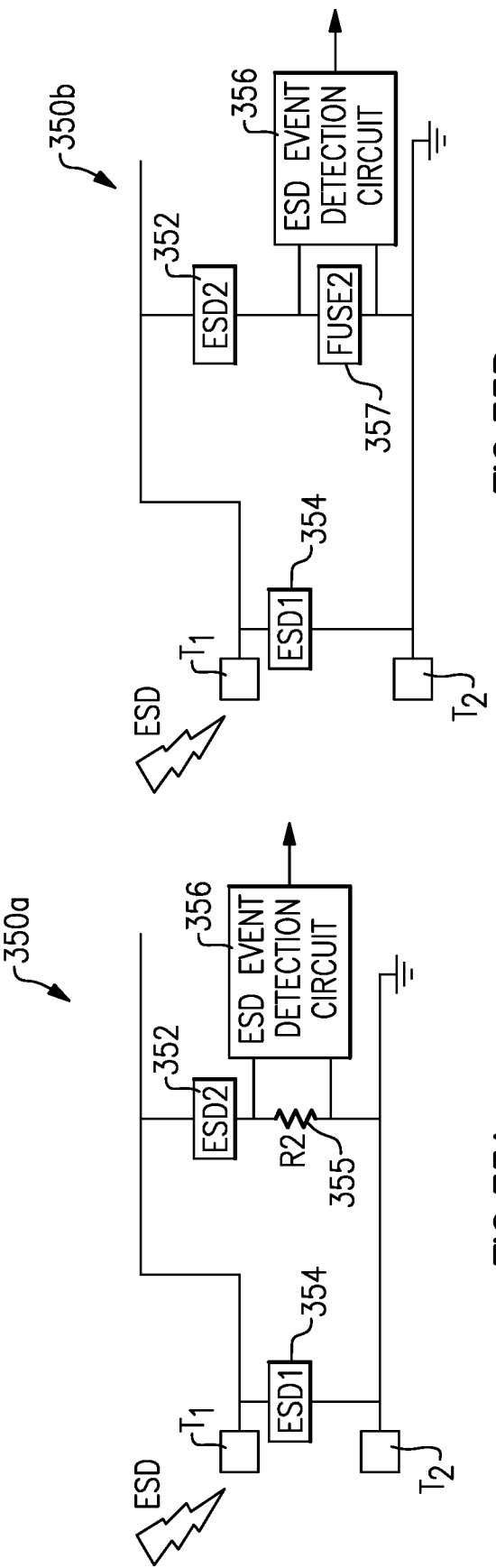

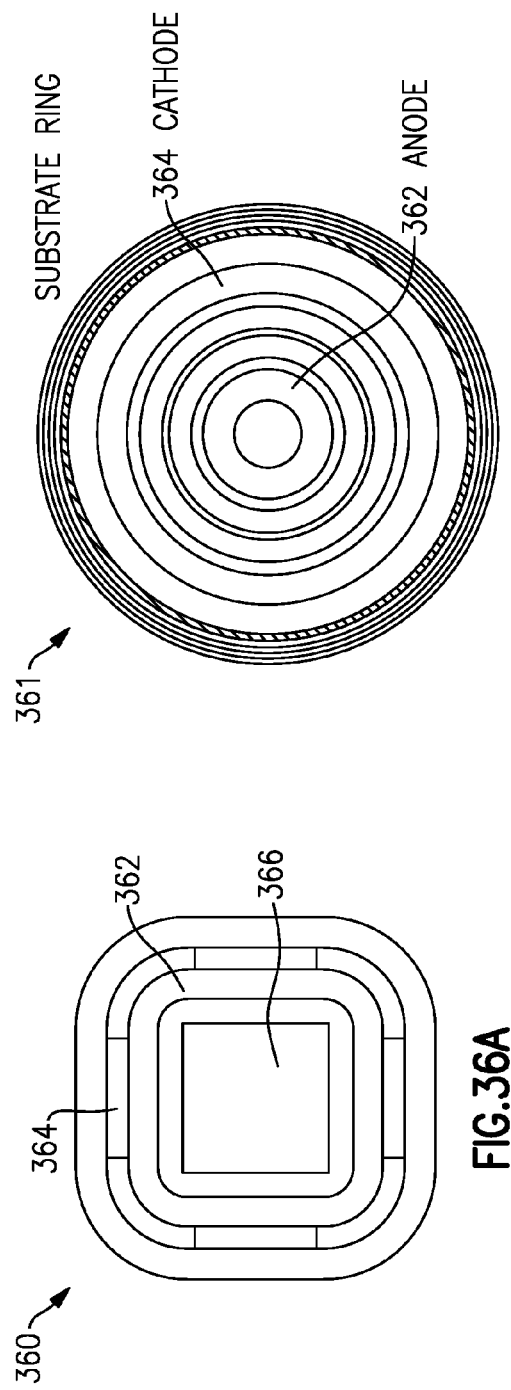

WEAR-OUT MONITOR DEVICE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

FIELD OF THE DISCLOSURE

The disclosed technology generally relates to wear-out monitor devices for integrated circuit devices.

BACKGROUND

Mission lifetimes of some integrated circuit (IC) devices can be predicted based on, e.g., theoretical, empirical or semi-empirical models of failure mechanisms. Failure mechanisms, in turn, depend on the type(s) of wear-out stress(es) that cause failure of the IC devices. Stresses that cause wear-out of the IC devices include thermal stress, voltage (or electromagnetic field) stress, current stress, and mechanical stress, among other types of stresses. Some failures are caused by acute stresses, e.g., an electrical overstress (EOS) or an electrostatic discharge (ESD) event, while other failures are caused by cumulative stresses, e.g., thermal, voltage or current stresses during operation. The IC devices that are subjected to these wear-out stresses beyond their predicted mission lifetimes can be subject to increased probability of reliability failures, which can be sudden and catastrophic. For example, certain thermally activated failure mechanisms, e.g., data retention of memory devices, have predictable time-to-fail at a given temperature. However, the stresses that cause wear-out can be intermittent and variable. As a result, it can be difficult to predict a time-to-fail even when the failure mechanisms are relatively well-known. Therefore, it is desirable to monitor cumulative stresses real-time, such that a user can monitor, e.g., automatically, how close to the end of the mission lifetime the IC device actually is, to avoid sudden failures.

One approach to monitor wear-out stresses may be to implement a sensor system. The sensor system can include one or more sensors, e.g., a temperature sensor and a current sensor, for measuring the stresses and the associated circuitry for converting the measured stresses. The measured values associated with the stresses can then be recorded and tracked for possible excursions outside a prescribed limit. Such monitoring can be performed over a lifetime of a product to alert the user of a predicted failure. However, there can be a number of restrictions for such a system. For example, the sensor system may include a power supply for continuous sensing over the lifetime of the product. In addition, the sensed signal, e.g., voltage or current signal, may be volatile and be lost if not stored. A wear-out level of a component being monitored may then be calculated from the stored information. As a result, a built-in memory and/or an ability to transmit information to an external memory may be implemented. Furthermore, the range of monitored conditions may be limited by the sensors themselves. For example, if the sensor is a semiconductor-based device, the range of temperature, voltage and/or current that can be monitored for the monitored component may be limited by the operating parameters of the semiconductor-based device. Outside of the range, excursions may not be monitored and recorded because of possible failures of the sensor system itself. Thus, there is a desire for improved wear-out monitor devices.

SUMMARY OF THE DISCLOSURE

The innovations described in the claims each have several aspects, no single one of which is solely responsible for its desirable attributes. Without limiting the scope of the claims, some prominent features of this disclosure will now be briefly described.

In one aspect, an integrated circuit device with wear out monitoring includes a core circuit and a wear-out monitor device. The wear-out monitor device is configured to adjust an indication of wear out of the core circuit regardless of whether the core circuit is activated. The integrated circuit device additionally includes a sensing circuit configured to detect an electrical property associated with the wear-out monitor device, wherein the electrical property is indicative of the wear out of the core circuit.

In some embodiments, the wear-out monitor device comprises a substrate and monitor atoms configured to diffuse in the substrate, wherein a doping profile of the monitor atoms in the substrate is indicative of wear out of the core circuit.

In some embodiments, the monitor atoms have a diffusion activation energy between 0.75 eV and 2.5 eV in the substrate.

In some embodiments. the monitor atoms includes one or more elements selected from the group consisting of aluminum (Al), cobalt (Co), platinum (Pt), sulfur (S), nickel (Ni), silver (Ag), zinc (Zn), gold (Au), chromium (Cr), copper (Cu), iron (Fe), sodium (Na), and potassium (K).

In some embodiments. the core circuit and the wear-out monitor device are formed in the substrate that is a common substrate formed of a semiconductor material and configured such that the monitor atoms remain in the wear-out monitor device under a wear-out stress without diffusing into the core circuit.

In some embodiments. the wear-out monitor device includes a reservoir of the monitor atoms formed on a surface of the substrate, wherein the reservoir serves as a first electrode of the wear-out monitor device, and wherein the wear-out monitor device further comprises a second electrode on the surface formed of a different material than the first electrode.

In some embodiments. the substrate includes a semiconductor material as a diffusing medium for the monitor atoms.

In some embodiments. the monitor device includes a PN junction, wherein the reservoir physically contacts one of a p-doped region or an n-doped region of the PN junction, and wherein the second electrode electrically contacts the other of the p-doped region or the n-doped region.

In some embodiments. the electrical property includes a reverse bias current of the PN junction.

In some embodiments. the monitor device comprises a first doped region and a second doped region that are separated from each other and configured to punch-through under a bias between the first doped region and the second doped region, wherein the first doped region and the second doped region have opposite conductivity types, and wherein the monitor atoms are configured to diffuse from the first doped region towards the second doped region under the bias.

In some embodiments. the second doped region is a buried region that is vertically separated from the first doped region that is formed at a surface of the semiconductor material.

In some embodiments. the first doped region and the second doped region are formed at a surface region of the semiconductor material and are laterally separated from each other.

In some embodiments. the monitor device includes a field effect transistor comprising a source region and a drain region that are separated from each other by a channel region, and wherein, under a bias, the monitor atoms are configured to diffuse from one of the source region or the drain region into the channel towards the other of the source region or the drain region.

In some embodiments, the integrated circuit device further includes a reference device coupled to the sensing circuit, wherein the sensing circuit is configured to provide an indication of wear-out based on a comparison of the electrical property of the wear-out monitor device with a corresponding electrical property of the reference device.

In some embodiments, the reference device includes the same type of device as the wear-out monitor device while having at least one electrode formed of a material different than a corresponding electrode of the wear-out monitor device having the monitor atoms.

In some embodiments, the indication of wear-out is indicative of one or more of a thermal stress, a voltage stress, or a current stress.

In some embodiments. the monitor atoms are configured such that a wear-out stress causes a change in a rate at which the monitor atoms diffuse in the substrate.

In some embodiments. the wear-out monitor device includes a p-doped region and an n-doped region, wherein the p-doped region comprises a p-type dopant different from the diffusing material and the n-doped region comprises an n-type dopant different from the diffusing material.

In another aspect, a method of monitoring a wear-out of an integrated circuit device including a core circuit and a wear-out monitor device includes detecting an electrical property of a wear-out monitor device, wherein the wear-out monitor device includes a semiconductor material and monitor atoms configured to diffuse into the semiconductor material, and wherein the electrical property corresponds to a concentration profile of the monitor atoms in the semiconductor material that is indicative of wear-out of the core circuit. The method additionally includes reporting the electrical property of the wear-out monitor device.

In some embodiments. prior to detecting, the method includes subjecting the integrated circuit device to a stress condition that causes the monitor atoms diffuse in the semiconductor material.

In some embodiments, the method further includes determining whether the wear-out of the core circuit has reached a predetermined level based on the detected electrical property of the wear-out device.

In some embodiments. the monitor device comprises a plurality of doped regions and a reservoir of the monitor atoms physically contacting one of the doped regions and serving as an electrode, and detecting the electrical property includes measuring a current or a voltage using the electrode.

In some embodiments. wherein the stress condition comprises one or more of a thermal stress condition, a voltage stress condition, or a current stress condition.

In another aspect, an integrated circuit device with wear-out monitoring includes a core circuit and means for recording wear-out of the core circuit as a doping profile of a diffusing material in a substrate. The integrated circuit device additionally includes means for detecting an indication of wear-out of the core circuit, the means for recording wear-out being in communication with the means for recording the indication of wear-out.

In some embodiments, the diffusing material has a diffusion activation energy in the substrate between 0.75 eV and 2.5 eV.

In some embodiments. the substrate is a semiconductor substrate.

In some embodiments. the means for recording includes a first doped region doped with a first dopant of a first type and a second doped region doped region doped with a second dopant of a second type.

In some embodiments. the means for recording further includes a reservoir comprising atoms of the diffusing material, wherein the reservoir contacts one of the first doped region or the second doped region.

In some embodiments, the means for recording includes a PN junction having a p-doped region and an n-doped region, wherein the p-doped region comprises a p-type dopant different from the dopant and the n-doped region comprises an n-type dopant different from the diffusing material.

In some embodiments. the means for recording includes a metal-oxide-silicon transistor having a source region and a drain region, wherein the source region and the drain region are doped with an n-type dopant or a p-type dopant different from the diffusing dopant.

In some embodiments. the means for recording comprises a monitoring region and a reference region formed in the substrate, wherein each of the monitoring region and the reference region comprises the diffusing material and at least the reference region comprises a barrier configured to restrict diffusion of the diffusing material into the substrate.

In some embodiments. the means for detecting is configured to measure impedance values from each of the monitoring region and the reference region and to determine the wear-out of the core circuit based on a comparison of the measured impedance values.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIGS. 3A and 3B illustrate a wear-out monitor device having monitor atoms whose rate of diffusion changes in response to a wear-out stress, according to embodiments.

FIG. 7A is an illustration of a wear-out monitor device comprising monitor atoms configured to diffuse in a semiconductor material, according to embodiments.

FIG. 7B is an illustration of a reference device configured to provide reference measurement for the monitor device of FIG. 7A, according to embodiments.

FIGS. 11A and 11B are illustrations of a wear-out monitor device configured as a vertical punch-through wear-out monitor device, according to embodiments.

FIGS. 13A and 13B are illustrations of a wear-out monitor device configured as a metal-oxide-silicon (MOS) wear-out monitor device, according to embodiments.

FIGS. 15A-15D illustrate various configurations of wear-out monitor devices comprising a PN junction and a layer of monitor atoms configured to diffuse into the PN junction, according to embodiments.

FIGS. 16A-16G illustrate various configurations of wear-out monitor devices for controlling diffusion rate of monitor atoms into the underlying substrate, according to embodiments.

FIGS. 17A and 17B illustrate wear-out monitor devices configured as bipolar junction transistors (BJTs), according to embodiments.

FIGS. 19A and 19C-19D illustrate wear-out monitor devices configured as impedance measurement devices, according to embodiments.

FIGS. 21A-21B illustrate conversion circuits configured to be used with wear-out monitor devices, according to some other embodiments.

FIGS. 23A-23C illustrate trans-impedance amplifiers (TIAs) configured to amplify and to convert current output of wear-out monitor devices to a voltage signal, according to embodiments.

FIGS. 35A and 35B illustrate schematic diagrams ESD event detection circuits configured as wear-out monitor devices, respectively, according to embodiments.

FIGS. 36A-36C illustrate example physical layouts of an ESD protection devices configured as wear-out monitor devices, according to embodiments.

DETAILED DESCRIPTION

Figure 1:
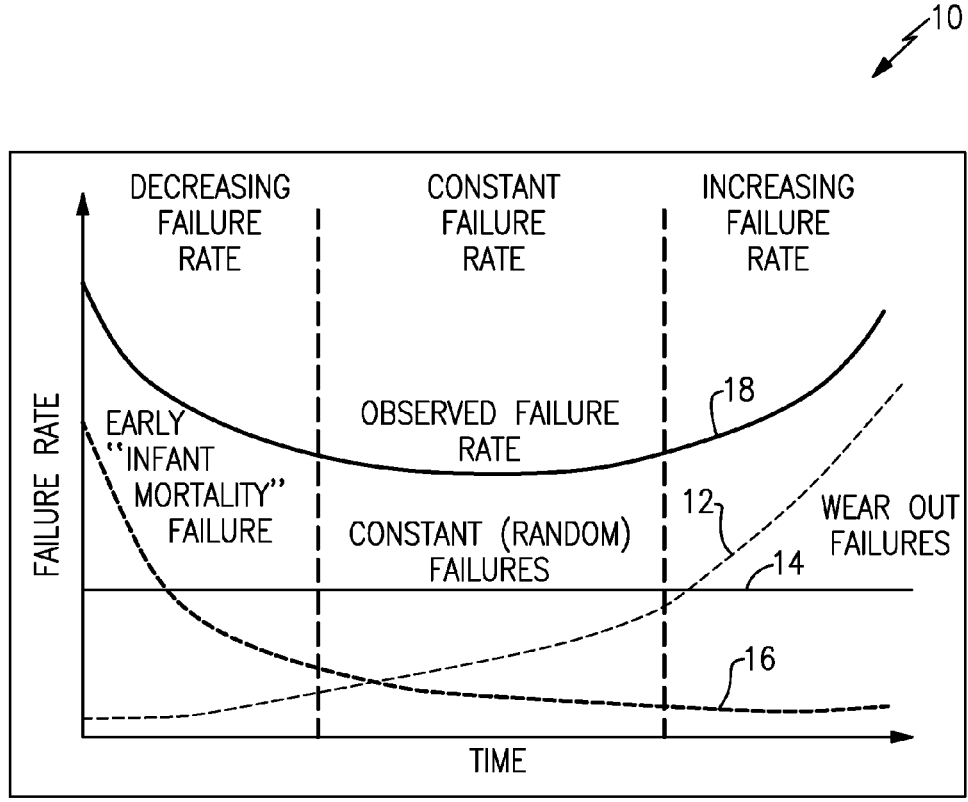
FIG. 1 is a graph illustrating failure rate versus time for a population of integrated circuit devices.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate substantially identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and do not necessarily affect the scope or meaning of the claims.

As described herein, wear-out of an IC device refers to a degradation phenomenon of any component or subcomponent of the IC device caused by usage or environmental factors. As disclosed herein, wear-out monitor devices according to embodiments can monitor wear-out of core circuitry, with or without a power supply, and are capable of monitoring a relatively large range of physical conditions. In addition, wear-out monitors according to embodiments disclosed herein can be integrated, e.g., monolithically integrated, in the same substrate as a core circuit of an IC. The wear-out monitor devices according to embodiments utilize atomic diffusion of certain diffusing atoms or monitor atoms in a semiconductor substrate, e.g., a silicon substrate, to monitor, record, and store electrical signatures associated with wear-out mechanisms (e.g., temperature, voltage, current, or any combination thereof) over a lifetime of the product. The monitor atoms can be integrated as part of a wear-out monitor device, where the net movement of monitor atoms caused by wear-out stresses alters the an electrical signature of the wear-out monitor device. The electrical signature can be monitored at any point during the lifetime of the product to quantify the degree of wear-out of core devices in the IC. Since the movement of the monitor atoms can occur without a separate power supply, the wear-out monitor device can be considered to be "passive."

Embodiments of this disclosure can provide many advantages. For example, electrical signatures associated with the wear-out state of an IC device over its lifetime can be recorded without a power supply because the effective "power supply" for the monitor device is provided by the concentration gradient of the dopant concentration, which provides the driving force for the diffusion of monitor atoms. Alternatively or additionally, the movement of the monitor atoms, which can be irreversible, provides a method to "record" cumulative stress(es) the product has been exposed to over a period of time. Alternatively or additionally, because a diffusion mechanism can work over a wide range of conditions beyond the service temperatures of ordinary sensors and their supporting circuitry, the disclosed wear-out monitor devices can provide signatures of cumulative stresses at relatively extreme conditions. Alternatively or additionally, the choice of suitable monitor atoms as the diffusing species can advantageously be made in conjunction with the choice of a suitable device geometry to monitor different wear-out effects at different conditions, e.g., under different temperature and electric field ranges for different periods of time. In certain embodiments, a reference device can be used to provide a reference "initial condition" against which a quantitative monitoring of the time evolution of the monitor atoms can be made, as well as to differentiate drift and noise to enhance the accuracy of the wear-out monitor devices. For example, the wear-out monitor device can have monitor atoms (disclosed infra) that diffuse substantially in the substrate in addition to a "traditional" dopant (e.g., p-type dopants B and n-type dopants P and As in silicon) that does not diffuse substantially in the semiconductor substrate, while the reference device can omit the monitor atoms, such that the reference device provides a semi-permanent "initial condition" that can be provided as the concentration profile of the monitor atoms evolves under wear-out conditions.

FIG. 1 is a graph 10 schematically illustrating rates (y-axis) of failure of different failure mechanisms versus time (x-axis) for a given population of similarly manufactured IC devices. Wear-out failure mechanisms can generally be categorized into three categories: early "infant mortality" failure, whose failure rate dominates at early stages and decreases over a device service time, represented by the failure rate curve 16; random failure, whose failure rate is relatively independent of the device service time, represented by the failure rate curve 14; and wear-out failure, whose failure rate increases over the device service time, represented by the failure rate curve 12. The observed overall failure rate curve 18, sometimes referred to as a "bathtub curve," can be represented by the sum of the three failure rate curves 12, 14 and 16, and can be described as having three regions: a decreasing failure rate region, followed by a relative constant failure rate region, followed by an increasing failure rate region.

As wafer fab geometries/structures continue to shrink in feature size (e.g., critical lithography dimensions), it has been observed that the relative duration of the constant failure region decreases, and that the increasing failure region dominated by wear out failures is reached at an increasingly service time. Based on this observation, with decreasing feature size, there is an increasing need to be able to identify components, subcomponents or structures within a semiconductor die that are may be in the wear-out failure phase and to flag them sufficiently early such that appropriate action can be taken before catastrophic failure occurs. There is also an increasing need to be able to real-time monitor the actual mission profile/operating conditions of IC devices in the field (as opposed to supposed/theoretical), and where deviations occur, to be able to flag such that appropriate actions can be taken.

IC Apparatuses Comprising Wear-Out Monitor Devices

Figure 2A:
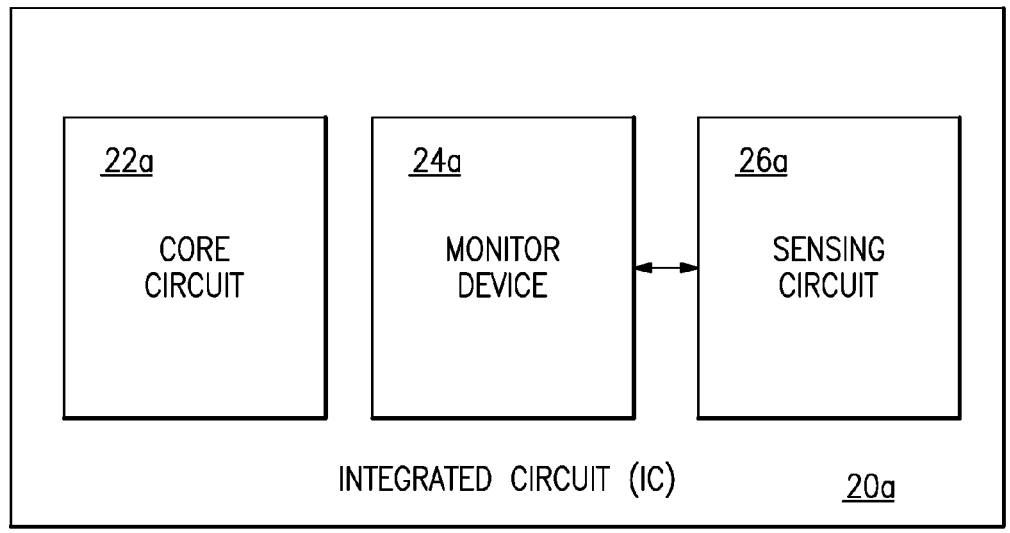
FIG. 2A illustrates an integrated circuit apparatus comprising an on-chip wear-out monitor device, according to embodiments.
Figure 2B:
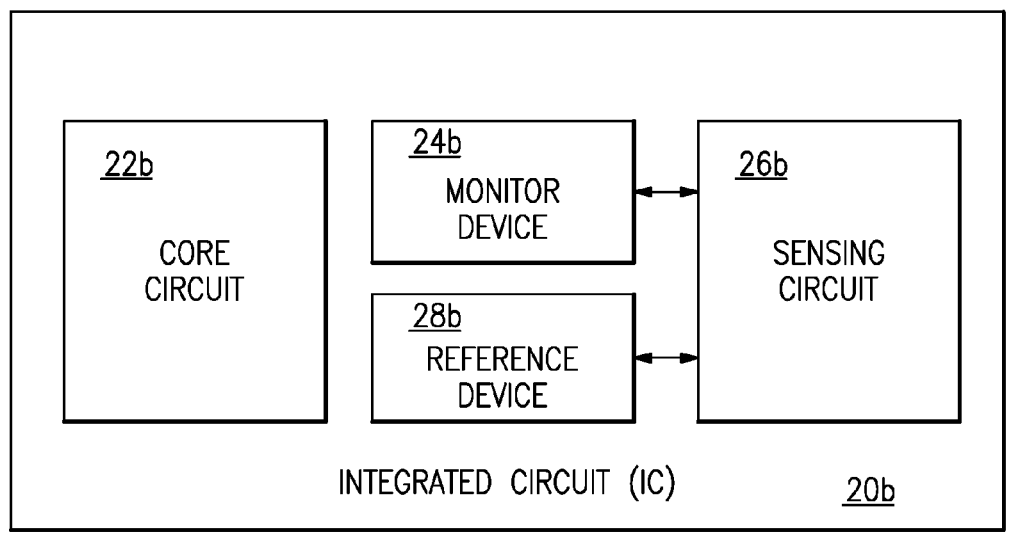
FIG. 2B illustrates an integrated circuit apparatus comprising an on-chip wear-out monitor device and a reference device, according to embodiments.

FIGS. 2A and 2B illustrate integrated circuit (IC) apparatuses 20a and 20b each comprising a wear-out monitor device 24a/24b, e.g., an on-chip wear-out monitor device, according to various embodiments. Each of the IC apparatuses 20a and 20b has a core circuit 22a/22b and a wear-out monitor device 24a/24b for monitoring various types of cumulative stresses (e.g., temperature, voltage, current, etc. or any combination thereof). In various embodiments, the wear-out monitor device 24a/24b is configured to adjust an indication of wear out of the core circuit 22a/22b regardless of whether the core circuit is activated. In some embodiments, the core circuit 22a/22b and the wear-out monitor device 24a/24b are formed in a common semiconductor substrate of the IC apparatuses 20a and 20b, such that they can be subject to common wear-out stresses. For example, for monitoring thermal wear-out, the core-circuit 22a/22b and the monitor device 24a/24b formed in a common substrate can be in thermal communication with each other. For monitoring electrical wear-out, the core-circuit 22a/22b and the monitor device 24a/24b formed in a common substrate can be electrically connected with each other in close proximity and fabricated using similar processes. For monitoring mechanical wear-out, the core-circuit 22a/22b and the monitor device 24a/24b formed in a common substrate can be subjected to similar mechanical stress, e.g., elongation, bending, thermal expansion, etc. As a result, cumulative physical stresses experienced by the monitor device 24a/24b are representative of the cumulative physical stresses experienced by the core circuit 22a/22b. Each of the IC apparatuses 20a and 20b includes a sensing circuit 26a/26b coupled to the wear-out monitor device 24a/24b. Unlike the IC apparatus 20a of FIG. 2A, the IC apparatus 20b of FIG. 2B additionally has a reference device 28b electrically connected to the sensing circuit 26b for quantitative determination of the wear-out state of devices in the core circuit 22b.

As described herein and throughout the specification, it will be appreciated that the semiconductor substrates in which IC apparatuses are fabricated can be implemented in a variety of ways, including, but not limited to, a doped semiconductor substrate, which can be formed of an elemental Group IV material (e.g., Si, Ge, C or Sn) or an alloy formed of Group IV materials (e.g., SiGe, SiGeC, SiC, SiSn, SiSnC, GeSn, etc.); Group III-V compound semiconductor materials (e.g., GaAs, GaN, InAs, etc.) or an alloy formed of Group III-V materials; Group II-VI semiconductor materials (CdSe, CdS, ZnSe, etc.) or an alloy formed of Group II-VI materials. The semiconductor substrate can be formed of high temperature materials such as SiC for applications where monitoring temperature is expected to exceed about 500° C.

According to certain embodiments, the substrate can be implemented as a semiconductor on insulator, such as silicon on insulator (SOI) substrate. An SOI substrate typically includes a silicon-insulator-silicon structure in which the various structures described above are isolated from a support substrate using an insulator layer such as a buried $SiO_2$ layer. In addition, it will be appreciated that the various structures described herein can be at least partially formed in an epitaxial layer formed at or near a surface region.

Wear-Out Monitor Device Structures

FIGS. 3A and 3B illustrate a wear-out monitor device 30a/30b having monitor atoms whose rate of diffusion changes in response to a stress condition, according to embodiments. The wear-out monitor device 30a represents an initial monitor device prior to being subjected to a wear-out stress, e.g., a thermal stress, and the wear-out monitor device 30b represents the monitor device after being subjected to the wear-out stress. The wear-out monitor device 30a/30b comprises a semiconductor material 32a/32b, e.g., a semiconductor substrate that is doped with dopant of first type, e.g., a donor-type dopant to a concentration $N_d$, and monitor atoms 34a, e.g., an acceptor-type dopant to a concentration $N_a$. The monitor atoms 34a are configured to diffuse in or into the semiconductor material 32a under a wear-out stress, and the rate at which the monitor atoms 34a diffuse change according to the level of the wear-out stress.

Referring to FIG. 3A, an initial schematic concentration profile 36a through a section AA' of the initial wear-out monitor device structure 30a shows a relatively abrupt concentration profile of the monitor atoms $N_a$ in the vertical direction (x). Referring to FIG. 3B, after the initial wear-out device structure 30a (FIG. 3A) is subjected to a wear-out stress, e.g., a thermal wear-out stress, the monitor atoms 34a diffuse into the semiconductor material 32a, resulting in post-stress wear-out monitor device structure 30b (FIG. 3B), in which the monitor atoms 34b has diffused into the semiconductor material 32b. The resulting schematic concentration profile 36b through a section BB' of the post-stress wear-out monitor device structure 30b shows a relatively diffused concentration profile of $N_a$ in the vertical direction (x). As described infra, the change in concentration profile of monitor atoms $N_a$ can be electrically detected using various methods. Such change, which results from the cumulative wear-out stress on the wear-out monitor device 30a, can induce a corresponding change in electrical properties of the monitor device structure 30a/30b, from which the wear-out level of the core circuit 22a/22b (FIGS. 2A/2B) can be determined.

Of course, in FIGS. 3A and 3B and throughout the specification, it will be appreciated that while monitor atoms 34a may be represented as acceptor-type dopants, the embodiments are not so limited. The monitor atoms can be donor-type dopants, or not be dopants at all, but rather impurities. Furthermore, monitor atoms 34a may be present in addition to dopants, which may be acceptor-type or donor-type dopants.

It will further be appreciated in FIGS. 3A/3B and throughout the specification that monitor atoms 34a may include one or more chemical elements.

Figure 4B:
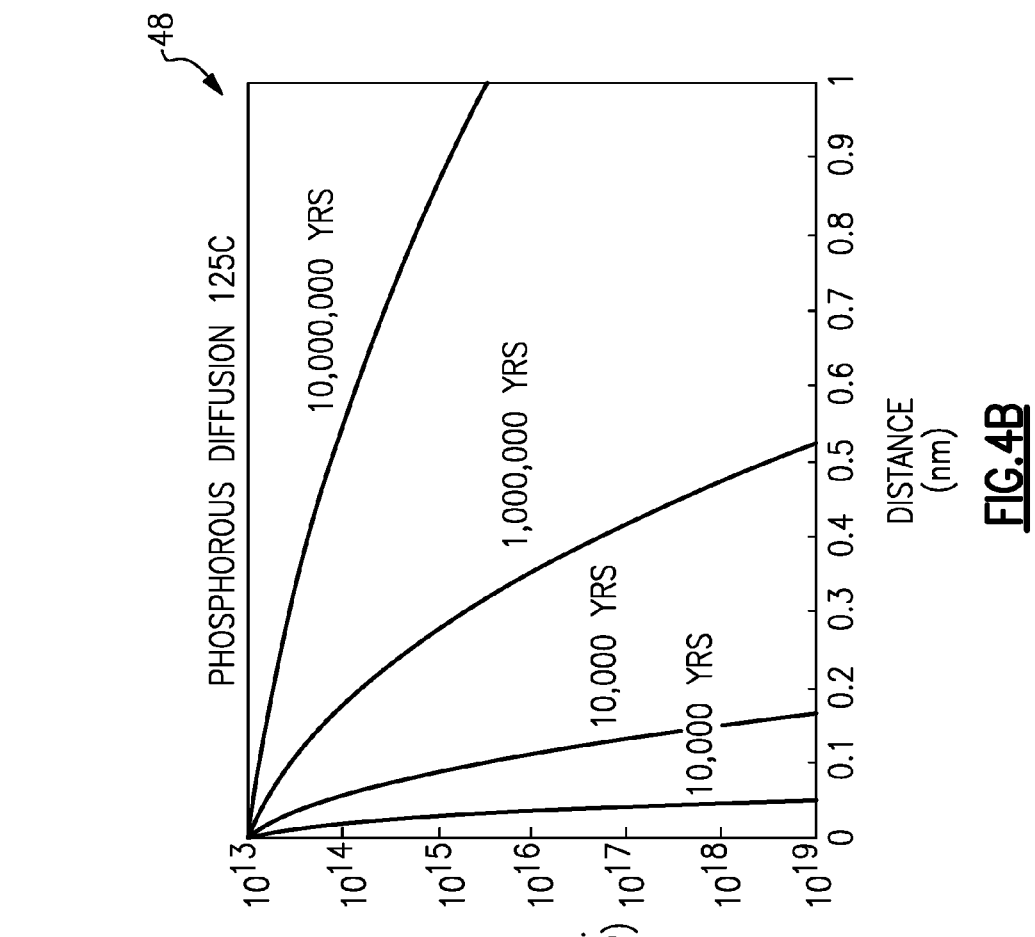
FIG. 4B is a graph illustrating calculated concentration profiles of phosphorus in silicon substrate of the wear-out monitor device in FIG. 4A, after diffusing at 125° C. for various times.
Figure 4A:
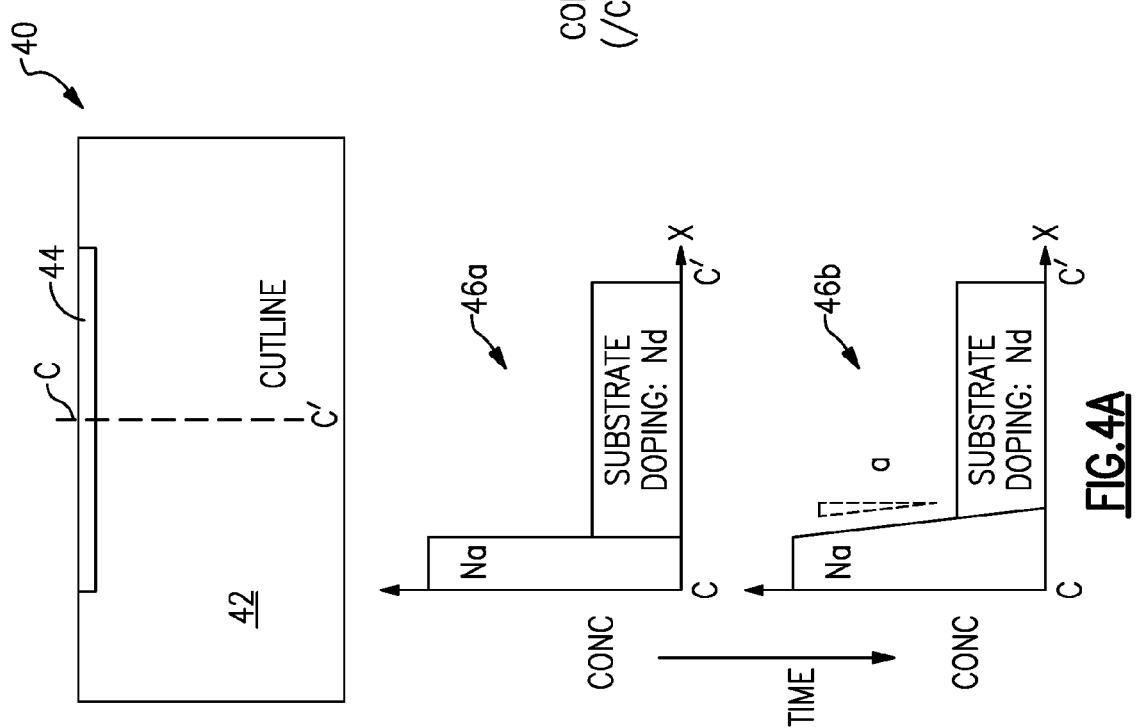
FIG. 4A illustrates a wear-out monitor device having phosphorus as monitor atoms, according to embodiments.

FIG. 4A illustrates a wear-out monitor device 40 according to embodiments. The wear-out monitor device 40 comprises a semiconductor substrate 42 doped with a dopant of a first type, e.g., a donor, to a concentration of $N_d$, and monitor atoms 44 having a concentration $N_a$. A schematic initial concentration profile 46a through a section CC' shows a relatively abrupt concentration profile of $N_a$ in a vertical direction (x), while a schematic post-stress concentration profile 46b through the section CC' shows a relatively diffused concentration profile of $N_a$ in the vertical direction (x). In the particular illustrated embodiment, the simulated monitor atoms 44 are phosphorus atoms diffusing in silicon at 125° C.

FIG. 4B is a graph 48 of calculated concentration profiles of monitor atoms 44 of the monitor device 40 of FIG. 4A, according to embodiments. In the illustrated embodiment, the calculated concentrations are those of phosphorus (P) atoms in silicon after diffusing for various times ranging from $10^4$ years to $10^7$ years, in which the x-axis represents the x-axes of schematic concentration profiles 46a and 46b of FIG. 4A, and in which the origin corresponds to the initial interface between the $N_d$ profile and the $N_a$ profile of the concentration profile 46a. As the graph 48 illustrates, because of relatively low diffusion rate of P in Si at 125° C., appreciable diffusion as measured by, e.g., a diffusion length at which the concentration has fallen to about 1% of an initial concentration, is less than 0.1 nm after 10,000 years. That is, based on the calculation, under some circumstances, e.g., ideal conditions, phosphorus may not be monitor atoms for monitoring changes in the rate of diffusion under thermal wear-out stress.

As illustrated by FIGS. 4A/4B, it will be appreciated that selecting appropriate monitor atoms for a given diffusing medium, e.g., semiconductor substrate, can be important for effective wear-out monitor devices. Diffusivity can be expressed as:

$$D(T) = D_0 \exp\left[\frac{E_a}{kT}\right].$$ Eq. [1]

Inventors have found that selecting a monitor atom/diffusing medium combination to have the diffusion activation energy (Ea) in a certain range, is desirable. For example, the diffusivity of phosphorus in silicon is activated by an activation energy of 3.66 eV, which results in a wear-out monitor device that may impractical for use as a thermal stress monitor under ideal circumstances, as described above. For illustrative purposes and without being bound to any theory or accuracy of the parameters, diffusivities of selected atoms in silicon are as listed in TABLE 1:

TABLE 1

Diffusivity of Selected Atoms and Molecules in Crystalline Si

| Element | Diffusivity, D(T) (cm²/sec) | Diffusion Activation Energy (eV) |
|---|---|---|
| B | $0.76 \times 10^{-4} \exp(-3.46/kT)$ | 3.46 |
| P | $3.85 \times 10^{-4} \exp(-3.66/kT)$ | 3.66 |
| Sb | $0.214 \times 10^{-4} \exp(-3.65/kT)$ | 3.65 |
| Al | $0.5 \times 10^{-4} \exp(-3.0/kT)$ | 3.0 |
| Co | $(9.2 \times 10^{-4}) \exp(-2.8/kT)$ | 2.8 |
| Pt | $(1.5 \times 10^2) \exp(-2.22/kT)$ | 2.22 |
| S | $(0.92) \exp(-2.2/kT)$ | 2.2 |
| Ni | $(0.1) \exp(-1.9/kT)$ | 1.9 |
| Ag | $(2.0 \times 10^{-3}) \exp(-1.6/kT)$ | 1.6 |
| Zn | $(0.1) \exp(-1.4/kT)$ | 1.4 |
| Au | $(1.1 \times 10^{-3}) \exp(-1.12/kT)$ | 1.12 |
| Cr | $(0.01) \exp(-1.0/kT)$ | 1.0 |
| Cu | $(4.0 \times 10^{-3}) \exp(-1.0/kT)$ | 1.0 |
| Fe | $(6.2 \times 10^{-3}) \exp(-0.87/kT)$ | 0.87 |
| Na | $(1.6 \times 10^{-3}) \exp(-0.76/kT)$ | 0.76 |
| K | $(1.1 \times 10^{-3}) \exp(-0.76/kT)$ | 0.76 |
| $H_2$ | $(9.4 \times 10^{-3}) \exp(-0.48/kT)$ | 0.48 |

The inventors have found that the activation energy Ea of diffusivity can be one criteria for choosing the monitor atoms to be used in the wear-out monitor devices according to embodiments. In some embodiments, the monitor atoms have a diffusion activation energy in the semiconductor substrate that is between about 0.5 eV and about 3.5 eV, between about 0.75 eV and about 2.5 eV, or between about 1.0 eV and about 1.6 eV, depending on the anticipated thermal and/or electrical wear-out stresses. Based on TABLE 1 above, suitable atoms can include Al, Co, Pt, S, Ni, Ag, Zn, Au, Cr, Cu, Fe, Na and K, to name a few. Moreover, suitable monitor atoms can include two or more elements in certain embodiments. For instance, monitor atoms can include two or more of the following elements: Al, Co, Pt, S, Ni, Ag, Zn, Au, Cr, Cu, Fe, Na or K.

Figure 5A:
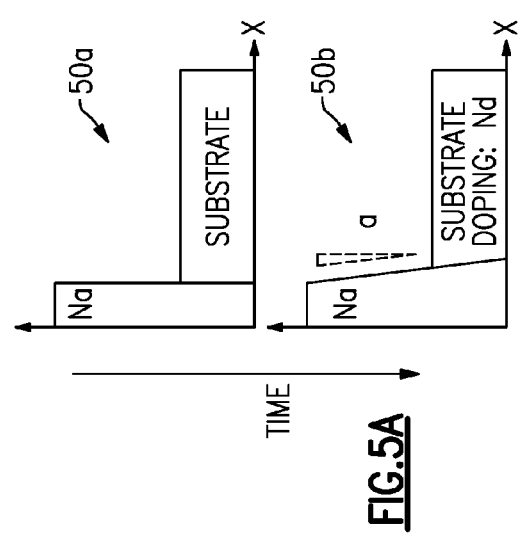
FIG. 5A illustrates a wear-out monitor device having gold as monitor atoms, according to embodiments.
Figure 5B:
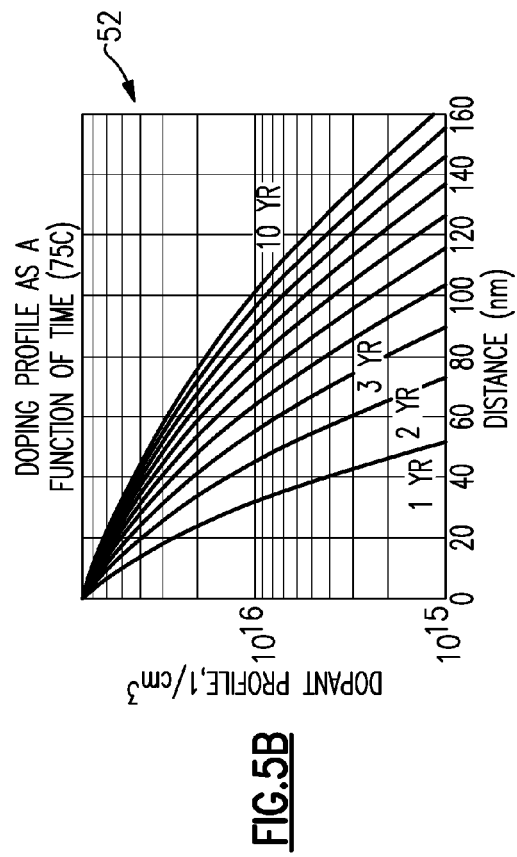
FIGS. 5B-5D are graphs illustrating calculated concentration profiles of gold in silicon substrate of the wear-out monitor device in FIG. 5A, after diffusing at 75° C., 100° C. and 125° C., respectively, for various times.
Figure 5D:
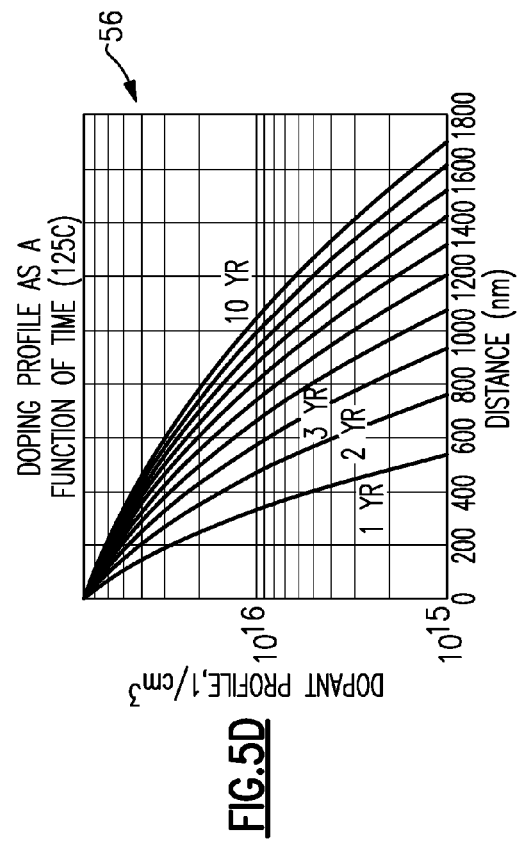
Figure 5C:
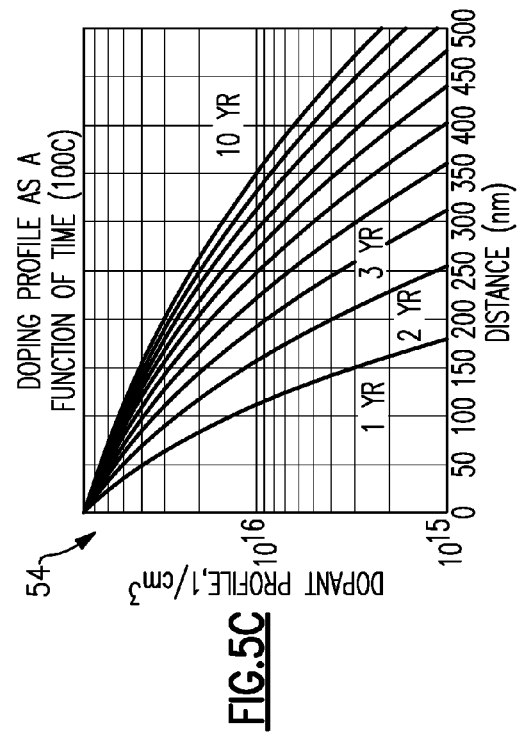

By way of example, FIGS. 5A-5D illustrate time evolution of concentration profiles of gold (Au) in silicon at temperatures of 75° C., 100° C. and 125° C. for durations ranging from 1 year to 10 years. Referring to FIG. 5A, a schematic initial concentration profile 50a and a schematic post-stress concentration profile 50b of a wear-out monitor device structure (not shown) similar to the wear-out monitor device structure 40 of FIG. 4A are illustrated. Unlike the schematic concentration profiles 46a and 46b of FIG. 4A in which the monitor atoms are phosphorus (P) atoms with an activation energy of 3.66 eV, the schematic concentration profiles 50a and 50b represent those in which the monitor atoms are gold (Au) atoms. Referring to FIGS. 5B-5D, graphs 52, 54 and 56 illustrate calculated concentration profiles of gold in silicon at 75° C., 100° C. and 125° C., respectively, after diffusing for various times ranging from 1 year to 10 years, in which the x-axes represents the vertical diffusing direction similar to the x-direction through the section CC' of FIG. 4A, and in which the origin corresponds to the initial interface between the $N_d$ profile and the $N_a$ profile. As the graphs 52, 54 and 56 illustrate, Au has diffusion rate in Si at temperatures of 75° C., 100° C. and 125° C. that are more practical for monitoring changes in rate of diffusion under thermal stress. For example, for Au, a diffusion length at which the concentration has fallen to about 1% of an initial concentration is between about 160 nm and about 1600 nm after about 10 years at 75° C. and 125° C., respectively. That is, based on FIGS. 5B-5D, Au in Si can be a more practical diffusion system for monitoring changes in rate of diffusion under thermal wear-out stress.

Figure 6C:
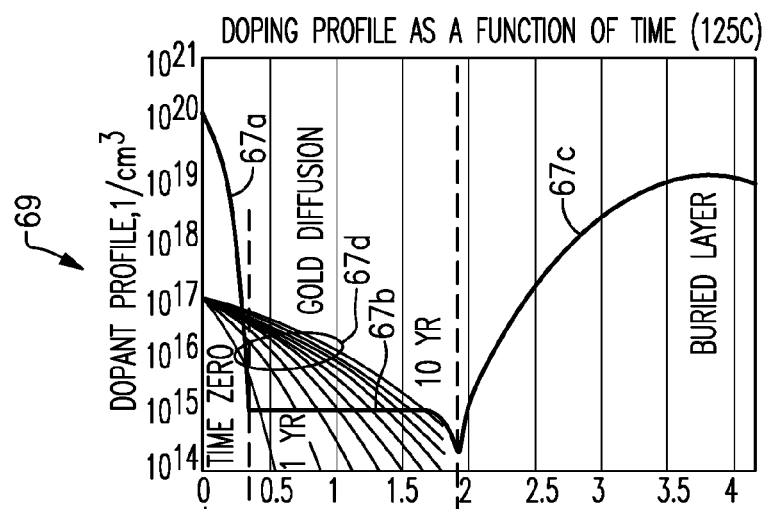
FIG. 6C is a graph illustrating calculated concentration profiles of gold in silicon device substrate of the wear-out monitor device in FIGS. 6A/6B after diffusing at 125° C. for various times.
Figure 6B:
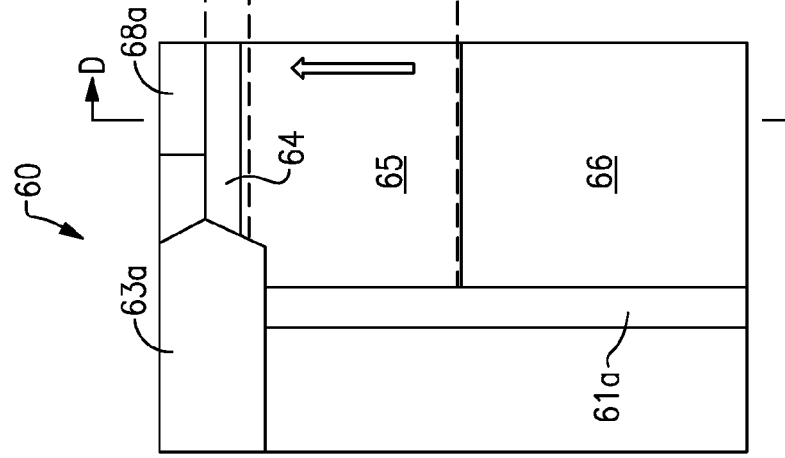
FIG. 6B illustrates a close up view of the boxed region of FIG. 6A.
Figure 6A:
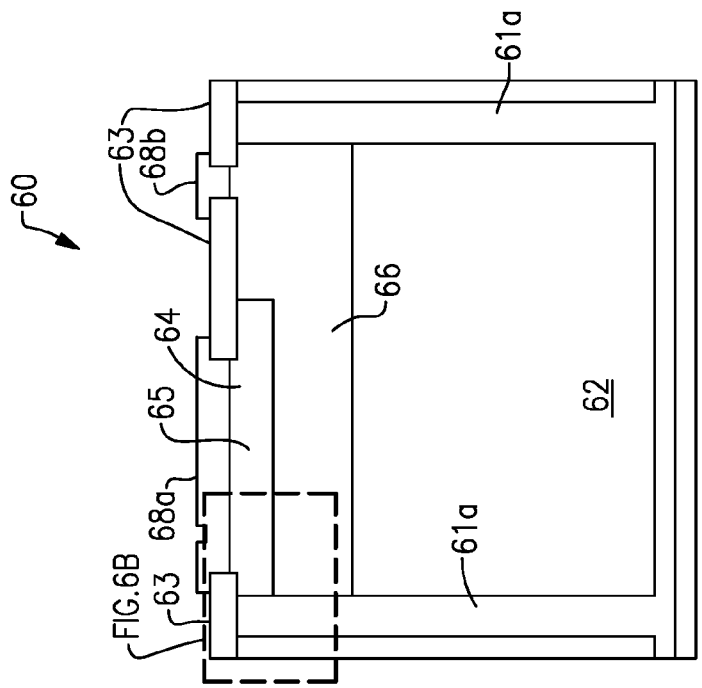
FIG. 6A is an illustration of a wear-out monitor device comprising a semiconductor material and monitor atoms configured to diffuse in the semiconductor material, according to embodiments.

FIG. 6A illustrates a wear-out monitor device 60 having monitor atoms having a diffusion activation energy in the substrate that is between about 0.5 eV and about 3.5 eV, according to embodiments. FIG. 6B is a close up view of the region in the dotted box of FIG. 6A. Similar to IC devices 20A and 20B of FIGS. 2A and 2B, the wear-out monitor device 60 comprises a semiconductor substrate 62 and monitor atoms configured to diffuse therein, wherein the monitor atoms are configured such that a stress condition causes a change in the rate at which the monitor atoms diffuse in the semiconductor substrate 62.

The wear-out monitor device 60 includes a first doped region 64 doped with a first dopant type, which can be n-type or p-type. In the illustrated embodiment of FIGS. 6A/6B, the first doped region 64 is a heavily doped p-doped region, e.g., a heavily doped ($p^+$) region.

The wear-out monitor device 60 additionally includes a second doped region 66 that is doped with a second dopant type opposite to the first dopant type, i.e., p-doped when the first doped region 64 is n-doped, and vice versa. In the illustrated embodiment, the second doped region 66 is an n-doped region, e.g. a heavily doped (n+) region.

In some embodiments, the wear-out monitor device 60 additionally may include an intervening region 65 interposed between the first and second doped regions 64, 66 that is doped either with the first or second dopant types, at a concentration substantially lower than the first or second doped regions 64 or 66. In the illustrated embodiment, the intervening region 65 is a p-doped region. Thus, the wear-out monitor device 60 can include first and second doped regions 64 and 66 and the intervening region 65 configured as a P+PN+ or a structure.

FIG. 6C is a graph showing dopant profiles along the section DD' of FIG. 6B. The profiles 67a and 67c represent p type and n type dopant profiles of the first and second doped regions 64, 66, respectively. In addition, the profile 67b is a p-type dopant profile of the substrate 62.

The doped regions of the wear-out monitor device 60 of FIGS. 6A and 6B are illustrated by way of example only, and other embodiments are possible, where the first and second doped regions 64 and 66 are respectively doped such that the first regions 64 is doped to form any one of $P^+$, P, $P^-$, $N^+$, N or $N^-$ regions, while the second doped region 66 is doped to form any one of $P^+$, P, $P^-$, $N^+$, N or $N^-$ regions that opposite in dopant type to the first doped region 64.

When the intervening region 65 is present between the first and second doped regions 64 and 66, any one of an $N^+NP$ structure, an $N^+N^-P$ or an $N^+IP$ structure, an $NN^-P$ structure, an NIP structure, a $P^+PN$ structure, $P^+P^-N$ structure, a $P^+IN$ structure, a $PP^-N$ structure, or a PIN structure can be formed.

As described herein and throughout the disclosure, a doped region can generally have a peak dopant concentration between about $1\times10^{13}$ cm$^{-3}$ and about $1\times10^{22}$ cm$^{-3}$. In addition, heavily doped regions denoted as $N^+$ or $P^+$ regions can have a peak doping concentration exceeding about $1\times10^{18}$ cm$^{-3}$ or about $1\times10^{19}$ cm$^{-3}$. In addition, lightly doped regions denoted as $N^-$ or $P^-$ regions can have a peak doping concentration lower than about $1\times10^{14}$ cm$^{-3}$ or about $1\times10^{13}$ cm$^{-3}$.

In the wear-out monitor device 60 of FIG. 6A, the first doped region 64 is formed by implanting dopants, e.g., p-type dopants, through an opening formed in the dielectric layer 63; however, embodiments are not so limited. For example, other masking (e.g., photoresist) and doping (e.g., diffusion) techniques may be used in lieu or in addition to using the dielectric layer 63 as an implantation mask.

Referring back to FIGS. 6A/6B, the wear-out monitor device 60 additionally includes a first electrode 68a and a second electrode 68b contacting the first doped region 64 and the second doped region 66, respectively, through openings in dielectric layer 63. In the illustrated embodiment, the first electrode 68a comprises or is formed of the monitor atoms and serves as a reservoir of the monitor atoms. The first electrode 68a is configured such that, when the wear-out monitor device is subjected to a set of predetermined conditions for a predetermined duration, some of the monitor atoms in the first electrode 68a diffuse into a depletion region formed between the first and second doped regions 64, 66. Depending on the concentration and/or depth of the diffused monitor atoms in the underlying semiconductor material, e.g., in the depletion region, a cumulative wear-out history, e.g., a cumulative thermal wear-out history, of the device 60 can be at least indirectly determined.

By way of example, FIG. 6C is a graph 69 illustrating calculated concentration profiles of gold in a silicon device substrate of the wear-out monitor device in FIGS. 6A/6B, after diffusing at 125° C. for various times. In particular, the concentration profiles 67d illustrate predicted concentration profiles of gold after diffusing for 1-10 years in at 125° C. By obtaining information regarding the depth and/or concentration of dopants in a depletion region, and using the known diffusivity equations such as those in TABLE 1, a cumulative thermal history, or thermal wear-out level, can be obtained.

It will be appreciated that, according to embodiments, the concentrations of dopants and the dimensions/configurations of the first doped region 64, the second doped region 66 and the intervening region 65 are selected such that desired device attributes are obtained. For example, in the illustrated embodiment, because the intervening region 65 is doped to a lower concentration compared to the second doped region 66, a relatively larger depletion region is formed therein. When the monitor atoms diffuse into the depletion region, various electrical properties of the depletion region can be made to determine, qualitatively and/or quantitatively, the relative concentration the monitor atoms in the depletion region, as discussed more in detail infra. Thus, the depletion can serve as a monitor region for quantifying the amount of monitor atoms that may have diffused, from which a cumulative thermal history can be determined.

Thus, as configured, the wear-out monitor device 60 of FIG. 6A/6B has a reservoir of monitor atoms (e.g., first electrode 68a) disposed on a surface of the substrate and a monitor region (e.g., depletion region in the intervening layer 65) formed in the substrate. The monitor atoms have diffusion characteristics in the semiconductor material of the substrate such that when the wear-out monitor device is subjected to a set of predetermined stress conditions for a predetermined duration, some of the monitor atoms diffuse into the monitor region. The reservoir can include, e.g., an electrode containing the monitor atoms or a layer formed of the monitor atoms. The monitor region can include a region in the substrate, e.g., a depletion region formed by a PN junction as described above, for example.

Various embodiments of the wear-out monitor device including the wear-out monitor device 60 of FIGS. 6A/6B, are configured such that an electrical property, or an electrical signature, associated with the presence of the monitor atoms in the monitor region can be measured. The electrical signature can be, for example, any one or more of: junction leakage, junction capacitance, junction built-in potential, junction reverse recovery time, bipolar base transit time (fT), metal-oxide-semiconductor (MOS) transistor threshold voltage, MOS transistor subthreshold swing, MOS channel leakage, punch-through breakdown voltage (BV) and impact ionization breakdown voltage (BV), to name a few.

The set of predetermined stress conditions and a predetermined duration, which causes some of the monitor atoms to diffuse into the monitor region can include, e.g., a temperature range between about 20° C. and about 250° C., between about 50° C. and about 200° C. or between about 75° C. and about 125° C.; an electric field, e.g., between 0.01 MV/cm and about 1000 MV/cm, between about 0.1 MV/cm and about 100 MV/cm, or between about 1 MV and about 10 MV/cm; and a time duration, e.g., between about 1 day and about 1000 years, between about 1 month and about 100 years, or between about 1 year and 10 years. In some embodiments, the wear-out monitor device can be configured such that a distance between the surface on which the monitor atoms are disposed and the monitor region can be any distance that is calculated to be a diffusion length, e.g., a distance at which the concentration decreases to about 1/e of the peak surface concentration, based on a combination of the predetermined conditions and the predetermined time duration.

Referring back to FIG. 2B, in some embodiments, some IC devices comprise a monitoring device and a reference device on the same semiconductor substrate. FIGS. 7A and 7B illustrate a wear-out monitor device 60 and a reference device 70 according to such embodiments. The wear-out monitor device 60 of FIG. 7A is similar or substantially identical to the wear-out monitor device 60 of FIGS. 6A/6B, except for relative positions of the first electrode 68a and first doped region 66 relative to the second electrode 68b, whose alterations do not alter the operation of the wear-out monitor device 60, and therefore a detailed description of the wear-out monitor device 60 is omitted herein. The reference device 70 of FIG. 7B is similar or substantially identical to the wear-out monitor device 60 of FIG. 7A, except for the electrodes.

The reference device 70 includes first and second doped regions 64, 66 that form a second PN junction, similar to the PN junction of the wear-out monitor device 60 described above with respect to FIGS. 6A/6B. The first electrode 78a of the reference device 70 may be formed of a material that has different diffusion property than monitor atoms of the first electrode 68a of FIG. 7A. Wear-out levels of a monitored device in an IC can be determined using the difference in diffusion properties between the monitor atoms and the electrode material of the first electrode 78a. Once fabricated, atoms of the first electrode 78a of the reference device 70 do not diffuse substantially into the underlying semiconductor material under the conditions in which monitor atoms diffuse in the monitor device 60 of FIG. 7A. For example, the first electrode 78a of the reference device 70 can be formed of heavily doped poly silicon, tungsten, W, TiN, WN, TaN, TaCN, NiSi, WSi, etc., to name a few. That is, when the IC device including both the wear-out monitor device 60 and the reference device 70 is subjected to a wear-out stress, the monitor atoms of the wear-out monitor device 60 have sufficient diffusion length such that they diffuse into the underlying semiconductor material, e.g., into the depletion region formed in the PN junction. In contrast, the atoms of the first electrode 78a of the reference device 70 have a diffusion length that is negligible (e.g., less than a few angstroms), such that the underlying semiconductor material is essentially free of the atoms of the first electrode 78a after the IC device is subjected to the wear-out stress.

Thus, in the illustrated embodiment of FIGS. 7A and 7B, the IC device has integrated therein the reference device 70 and the wear-out monitor device 60 that are similar, e.g., essentially identical, except for the materials of the respective first electrodes 78a, 68a. For example, each of the wear-out monitor device 60 and the reference device 70 includes a PN junction such as a P$^+$PN$^+$ junction or an N$^+$NP$^+$ junction, in which a junction having formed therein a depletion region, from which electrical signals associated with monitor atoms diffused thereto can be detected using various techniques, e.g. reverse bias leakage. However, other embodiments are possible. For example, the materials of the respective second electrodes 78b, 68b may be different instead of or in addition to the respective first electrodes 78a, 68a. For example, the second electrode 78b may contain the monitor atoms instead of or in addition to the first electrode 78a.

As described above with respect to embodiments of FIGS. 2A and 2B, the monitor atoms, while being configured to diffuse into the underlying semiconductor material, may also be integrated in the same substrate of an IC that also has a core circuit and/or a reference device, according to some embodiments. However, without proper precaution, the monitor atoms can undesirably diffuse from the wear-out monitor device to other parts of the IC, such as to the core circuit and/or to the reference device. In addition, some monitor atoms may diffuse faster than their expected velocities based on bulk diffusivities, due to the presence of crystal imperfections such as grain boundaries, dislocations or interfaces. However, many monitor atoms are known to severely degrade semiconductor devices. For example, many metals that may be good candidates for monitor atoms, e.g., gold and copper, are known to form what are known as mid-gap or deep level traps in silicon. Mid-gap centers or deep level traps occupy energy states near the middle of the band gap of the semiconductor material. In operation, when excess minority carriers, e.g., electrons in a p-type semiconductor region or holes in an n-type semiconductor region, are created in a semiconductor device in the core circuit, the mid-gap centers created by the unintended presence of monitor atoms can detrimentally affect the device performance by, among other things, degrading minority carrier lifetimes and increasing leakage. In addition, the presence of monitor atoms in the reference device may defeat its purpose as a reference device. Thus, in various embodiments, it may be desirable to block the diffusion of the monitor atoms such that they do not detrimentally affect semiconductor devices outside of the wear-out monitor device.

Referring to 6A/6B and 7A/7B, to limit undesirable diffusion of monitor atoms from the wear-out monitor devices to other parts of the IC device, each of the wear-out monitor device 60 and the reference device 70 may have, laterally on one or both sides, isolation regions 61a, e.g., shallow trench isolation regions. In addition, each of the wear-out monitor device 60 and the reference device 70 may have a buried isolation region 61b, e.g., a buried oxide (BOX) of a silicon-on-insulator (SOI), laterally extending between adjacent isolation regions 61a such that an isolation tub formed of the isolation regions 61a and 61b encloses the first and second doped regions 64 and 66 and the intervening region 65. The isolation tub is configured to prevent unintended lateral and vertical diffusion of monitor atoms from the wear-out monitor device 60 into other parts of the IC device, including, e.g., the reference device 70 and/or devices in the core circuitry (not shown for clarity, see FIGS. 2A/2B) formed in the same substrate.

As described above with respect to FIGS. 2A and 2B, the IC devices according to embodiments include a sensing circuit for sensing an electrical signature associated with atoms of the monitor atoms and determine therefrom a cumulative history of wear-out stresses, e.g., thermal or electrical wear-out stresses, that the IC device may have been subjected to. For example, for each of the wear-out monitor device 60 and the reference device described with respect to FIGS. 6A/6B and 7A/7B, a reverse bias may be applied between the first electrodes 68a, 78a and the second electrode 68b, 78b, such that a reverse bias leakage can be measured across the PN junction. By comparing the reverse bias currents between the wear-out monitor device 60 and the reference device 70, which may be proportional to the concentration of impurity atoms in the respective depletion regions, a determination of the degree of wear-out of monitored devices in the core circuitry can be determined.

Figure 8:
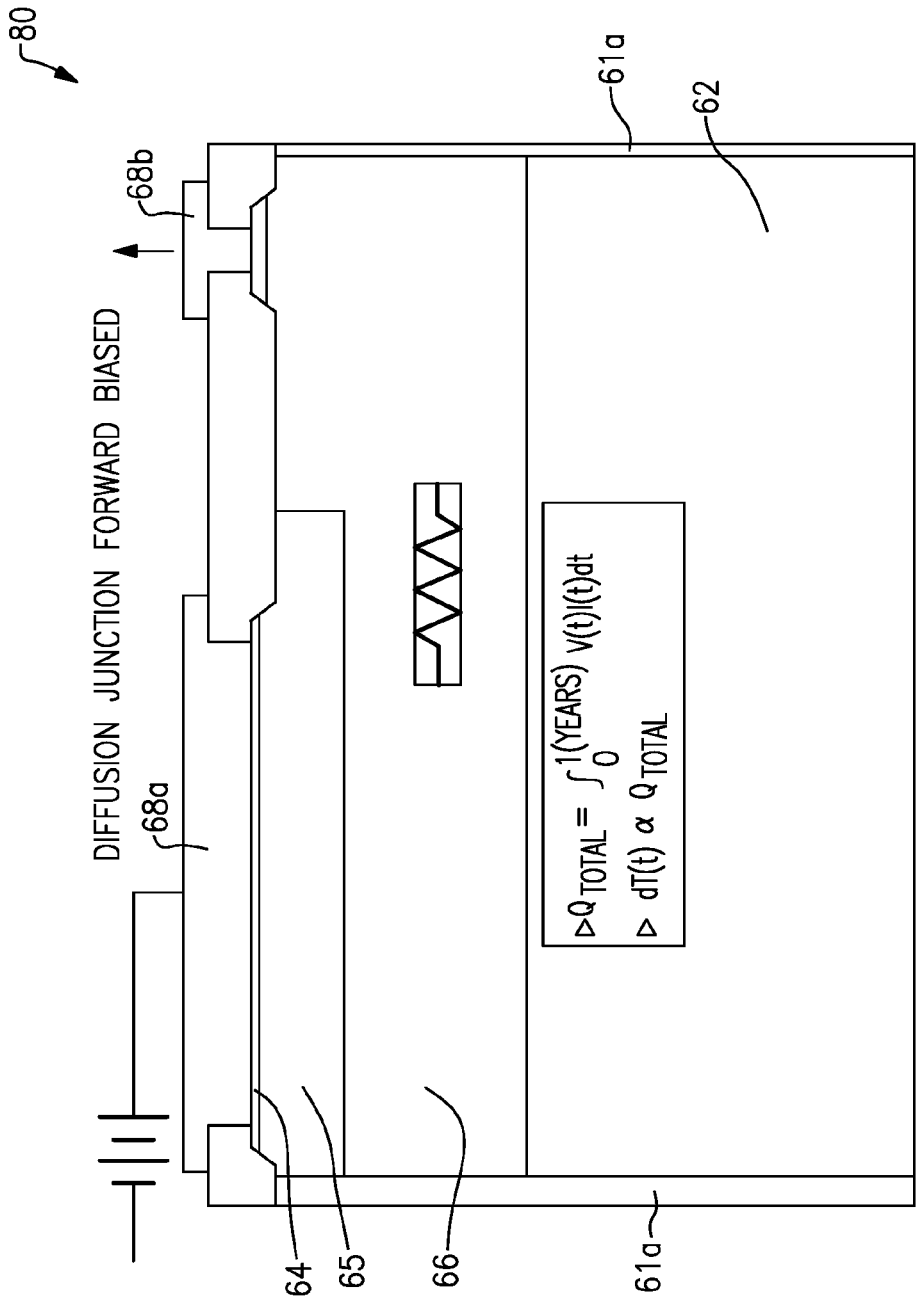
FIG. 8 is an illustration of a wear-out monitor device configured as a current-induced wear-out monitor device, according to embodiments.

Referring to FIG. 8, a wear-out monitor device 80 according to some other embodiments is illustrated. Structural features of the wear-out monitor device 80 are similar to corresponding features of the wear-out monitor device 60 of FIG. 6A/6B, and therefore a detailed description is omitted herein. The wear-out monitor device 80 is configured as a current monitor for monitoring, e.g., the degree of wear-out related to cumulative current passed through a monitored structure in the core circuitry (not shown for clarity, see FIGS. 2A/2B), which may be a similar device in the core circuitry. By placing the monitor structure in electrical series with the monitored structure, for example, the cumulative current passed through the monitored structure can be monitored. In the illustrated embodiment, the current is monitored indirectly by measuring the effect of diffusion rate of the monitor atoms caused by Joule-heating of the wear-out monitor device. In operation, the PN junction of the wear-out monitor device 80 is forward-biased in series with the monitored structure for repeated generation of current-based wear-out stress. In FIG. 8, the region in which Joule-heating occurs is represented as a resistor formed in series with the forward-biased PN junction between a first electrode 68a containing the diffusing material (e.g., Au) and a second electrode 68b. In response to the forward bias, the series resistor of the monitor structure generates the heat which causes the monitor atoms in the first electrode 68a to diffuse into the underlying substrate, e.g., a depletion region formed in the PN junction. While not shown, the IC may include a reference device (not shown for clarity, see FIG. 2B) similar to the reference device 70 of FIG. 7B, which is does not have monitoring atoms. Alternatively, a reference device may be similar or substantially identical to the wear-out monitor device 80 except that it not configured to receive the forward current-based wear-out stress. Subsequently, by comparing reverse bias currents between the wear-out monitor device 80 and the reference device, the wear-out state of the monitored structure can be determined therefrom, in a similar manner as described above.

Figure 9:
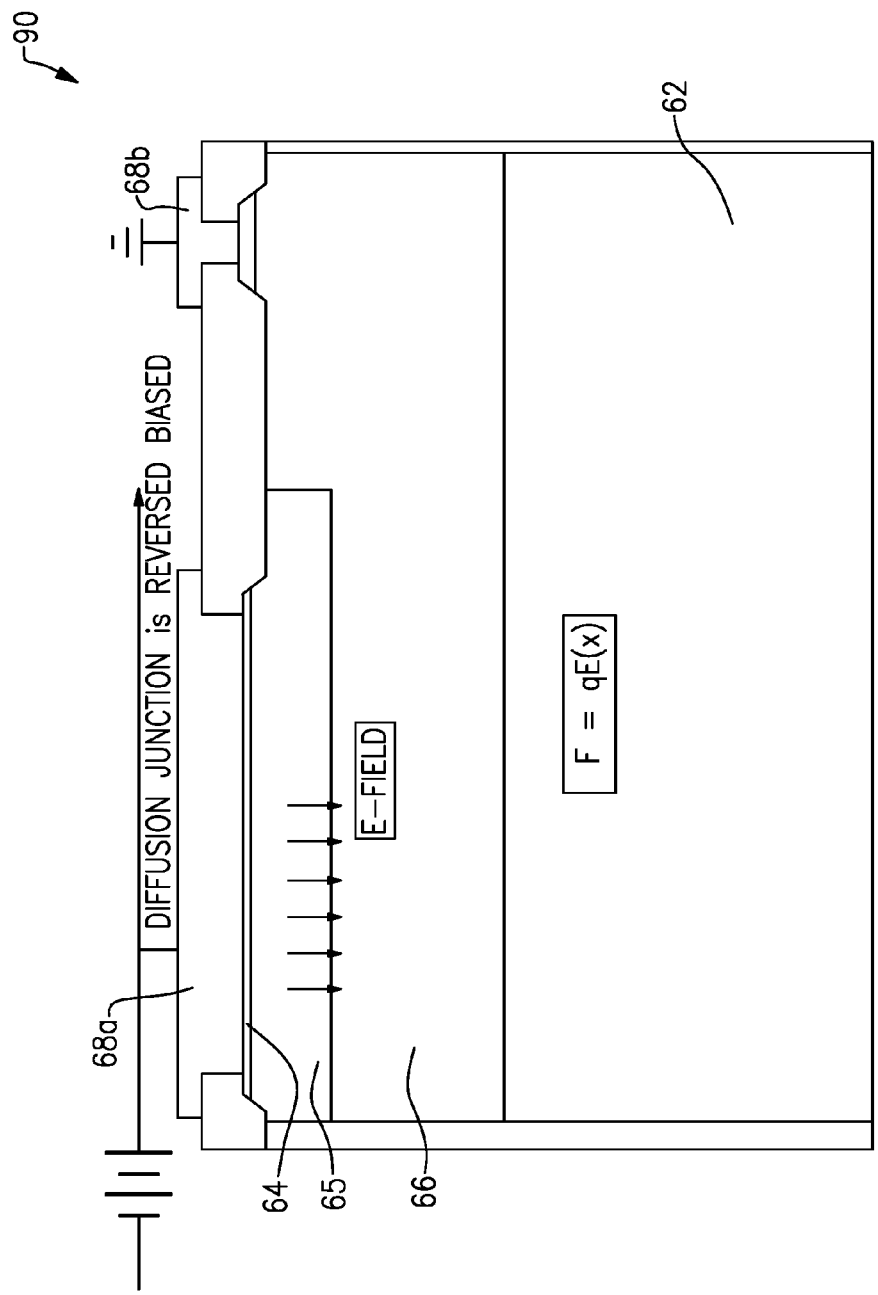
FIG. 9 is an illustration of a wear-out monitor device configured as a voltage-induced wear-out monitor device, according to embodiments.

Referring to FIG. 9, a wear-out monitor device 90 according to some other embodiments is illustrated. The wear-out monitor device 90 is configured as a voltage monitor or electric field monitor for monitoring, e.g., cumulative electric field-based wear-out stress applied to a monitored device in the core circuitry (not shown for clarity, see FIGS. 2A/2B). Structural features of the wear-out monitor device 90 are similar to corresponding features of the wear-out monitor device 60 of FIG. 6A/6B, and therefore a detailed description is omitted herein. The wear-out monitor device 90 is configured to be reverse-biased and electrically connected, e.g., electrically in parallel, with the monitored device to receive repeated electric field-based wear-out stress from electric field generated by the reverse-biased PN junction. In response to the electric field-based wear-out stress, the monitored impurity atoms, e.g., charged impurity atoms, may be caused to diffuse into a monitored region, e.g., the depletion region of the reverse biased PN junction. The IC device may include a reference device (not shown for clarity, see FIGS. 2A/2B) similar to the reference device 70 of FIG. 7B, which does not have monitoring atoms that diffuse. Alternatively, a reference device may be substantially identical to the wear-out monitor device 90 except that it not configured to receive the electric field wear-out stress caused by the reverse biased PN junction. Subsequently, by comparing reverse bias currents between the wear-out monitor device 90 and the reference device, the wear-out state of the monitored structure can be determined therefrom.

Figure 10B:
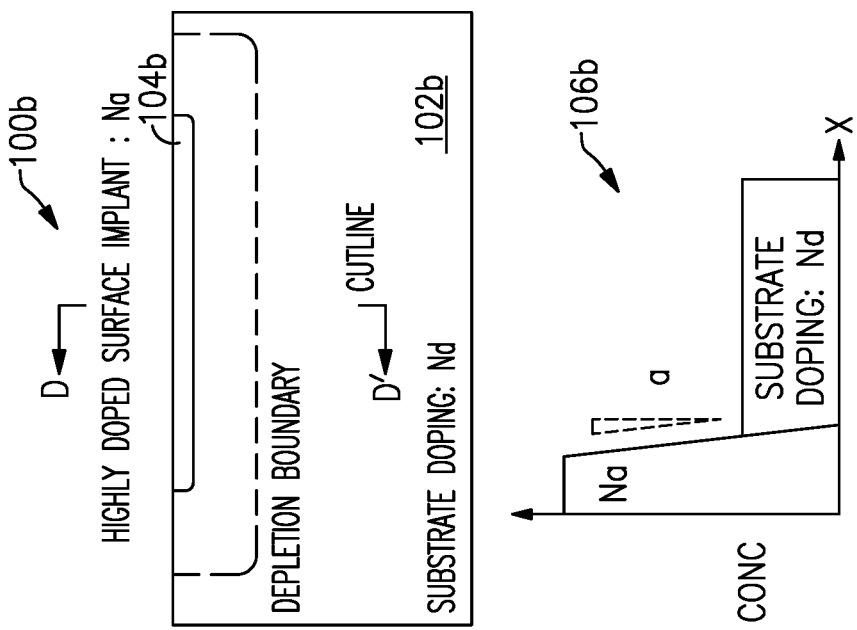
FIGS. 10A and 10B are illustrations of a wear-out monitor device configured as a PN junction wear-out monitor device, according to embodiments.
Figure 10A:
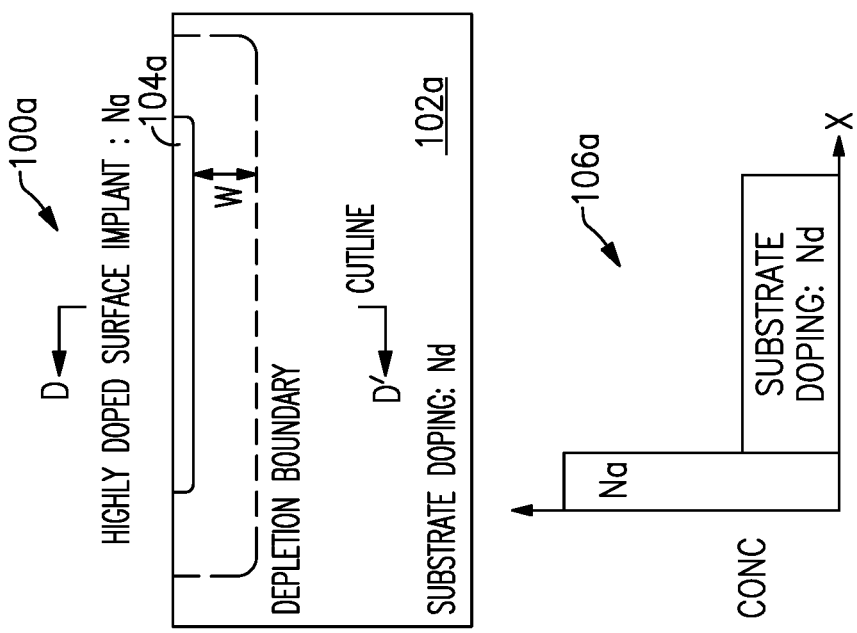

Referring to FIGS. 10A and 10B, a wear-out monitor device 100a/100b configured for monitoring the wear out level of a PN junction is illustrated. FIGS. 10A and 10B represent the wear-out monitor device prior to (100a) and subsequent to (100b) being subjected to usage-related wear-out stress, e.g., repeated wear-out stress. The wear-out monitor device 100a/100b comprises a first doped region 102a/102b doped with a first dopant type, e.g., a donor, to a concentration $N_d$, and a second doped region 104a/104b doped with a second dopant type, e.g., an acceptor, to a concentration $N_a$. The second doped region 104a/104b comprises monitor atoms, where the monitor atoms are configured to diffuse into the underlying semiconductor material, e.g., into the depletion region of the PN junction. In some embodiments, the monitor atoms may be present in addition to the acceptor atoms having the concentration $N_a$. In other embodiments, the monitor atoms may serve as acceptor atoms such that the acceptor atoms having the concentration $N_a$ may at least in part be the monitor atoms. In other embodiments, the monitor atoms may be present as part of an electrode layer, as described above with respect to FIGS. 6A/6B. As described above, a wear-out stress causes a change in a rate at which the monitor atoms diffuse into the underlying semiconductor material. An initial schematic concentration profile 106a through a section DD' of the initial wear-out monitor device 100a shows a relatively abrupt concentration profile of $N_a$ in a vertical direction (x). The wear-out monitor device 100a may be subjected to a wear-out stress, e.g., thermal wear-out stress as described in FIG. 6A-6C, in forward bias as described in FIG. 8, and/or reverse bias as described in FIG. 9. After being subjected to the wear-out stresses, the schematic concentration profile 106b through a section DD' of the cycled wear-out monitor device 100b shows a relatively diffuse concentration profile of $N_a$ in a vertical direction (x). By comparing the electrical signatures (e.g., reverse bias leakage) associated with the concentration profiles 106a and 106b, the wear-out state of the monitored structure 106b may be determined.

FIGS. 11A and 11B illustrate a wear-out monitor device 110a/110b configured for monitoring punch-through characteristics between adjacent heavily doped regions. As described herein, a punch-through effect refers to a phenomenon in which depletion regions of two separated but adjacent heavily doped regions merge. For example, in a metal-oxide-semiconductor (MOS) transistor, a punch-through effect between a source and a drain causes a rapid increase in channel current with increasing drain-source voltage, which can be undesirable because the voltage at which the punch-through occurs may limit the operating voltage of the IC device. FIGS. 11A and 11B represent the wear-out monitor device prior to (110a) and subsequent to (110b) being subjected to a usage-related wear-out stress. The wear-out monitor device 110a/110b comprises a first heavily doped region 116a/116b, which may be a buried doped region, that is doped with a first dopant type, e.g., a donor, to a concentration $N_d$, and a second heavily doped region 114a/114b doped with a second dopant type, e.g., an acceptor, to a concentration $N_a$. In some embodiments, the monitor atoms may be present in addition to the acceptor atoms having the concentration $N_a$. In other embodiments, the monitor atoms may serve as acceptor atoms, such that the acceptor atoms having the concentration $N_a$ may at least in part be the monitor atoms. In other embodiments, the monitor atoms may be present as part an electrode layer, as described above with respect to FIGS. 6A/6B. After repeated cycling of the monitor structure, e.g., by repeatedly reverse-biasing the first heavily doped region 116a/116b and the second heavily doped region 114a/114b, the effective width between the first heavily doped region 116a/116b and the second heavily doped region 114a/114b reduces from W to W' as illustrated, and the associated electrical signatures (e.g., punch-through voltage) may be used to determine therefrom a wear-out state of a monitored device in the core circuitry.

Figure 12:
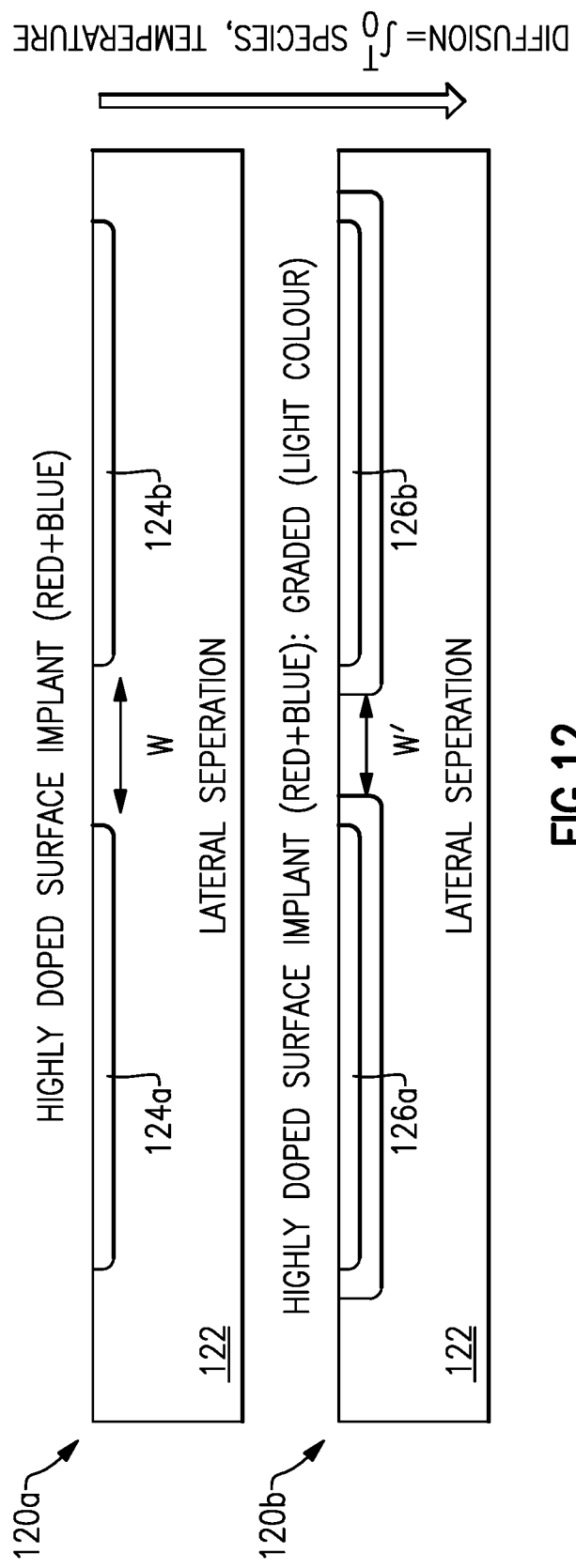
FIG. 12 is an illustration of a wear-out monitor device configured as a lateral punch-through wear-out monitor device, according to embodiments.

Referring to FIG. 12, a wear-out monitor device 120a/120b similar to the wear-out monitor device 110a/110b of FIGS. 11A and 11B and configured for monitoring punch-through characteristics between adjacent heavily doped regions is illustrated. However, in contrast to the wear-out monitor device 110a/110b of FIGS. 11A/11B, a first heavily doped region 124a/126a and a second heavily doped region 124b/126b are laterally separated instead of being vertically separated. Monitor atoms may be present in one or both of the first and second heavily doped regions 124a, 124b in a similar manner as described above with respect to the second heavily doped region 114a/114b of FIGS. 11A and 11B. FIG. 12 represents the wear-out monitor device prior to (120a) and subsequent to (120b) being subjected to the usage-related wear-out stress in an analogous manner as described above with respect to FIGS. 11A and 11B. In an analogous manner as described above with respect to FIGS. 11A and 11B, the effective width between the first heavily doped region 124a/126a and the second heavily doped region 124b/126b reduces from W to W' as illustrated, and the associated electrical signatures (e.g., punch-through voltage) may be used to determine therefrom a wear-out state of a monitored structure.

Referring to FIGS. 13A and 13B, a wear-out monitor device 130a/130b configured for monitoring channel degradation of metal-oxide-semiconductor (MOS) transistors is illustrated, according to embodiments. The wear-out monitor device 130a/130b comprises a source 132 and a drain 134 formed in a semiconductor substrate 132. The wear-out monitor device 130a/130b additionally comprises a gate dielectric 135 and a gate 136a/136b. FIGS. 13A and 13B represent the wear-out monitor device prior to (130a) and subsequent to (130b) being subjected to a usage-related wear-out stress. The wear-out monitor device 130a/130b can be used to monitor, e.g., usage-related wear of a monitored device (not shown for clarity, see FIG. 2B), which may be a similarly configured MOS transistor in the core circuit. In the wear-out monitor device 130a/130b, the monitor atoms may be disposed on any one of the source 132, the drain 134 or the gate 136a/136b of the wear-out monitor device 130a/130bconfigured as a MOS transistor. After subjecting to a wear-stress, e.g., a thermal stress or repeated cycling of the wear-out monitor device 130a/130b in a similar manner as the monitored structure, the level of wear-out of the monitored device may be determined. For example, by comparing the wear-out monitor device 130b that has been subjected to the wear-out stress to a reference device (not shown for clarity, see FIG. 2B), which may be another monitor structure that has not gone through the wear-out stress, the associated electrical signatures may be used to determine therefrom a wear-out state of a monitored structure 130a/130b. For example, the monitor atoms may diffuse into an initial channel region 138a of FIG. 13A to form a diffused channel region 138b of FIG. 13B. Such degradation can be detected, e.g., by measuring transistor parameters such as a current-voltage measurements.

Figure 14B:
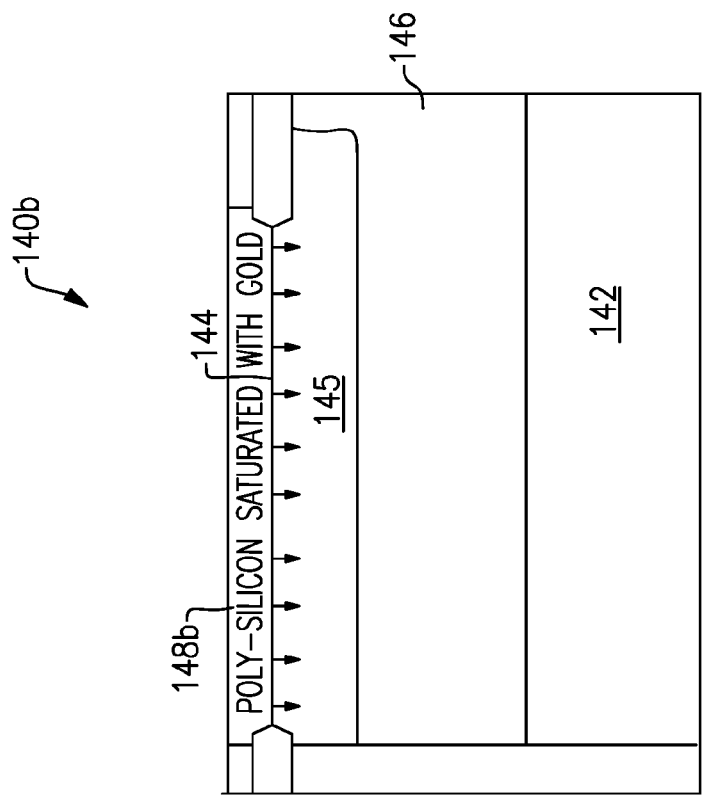
FIGS. 14A and 14B illustrate a method of forming an electrode incorporating monitor atoms for a wear-out monitor device, according to embodiments.
Figure 14A:
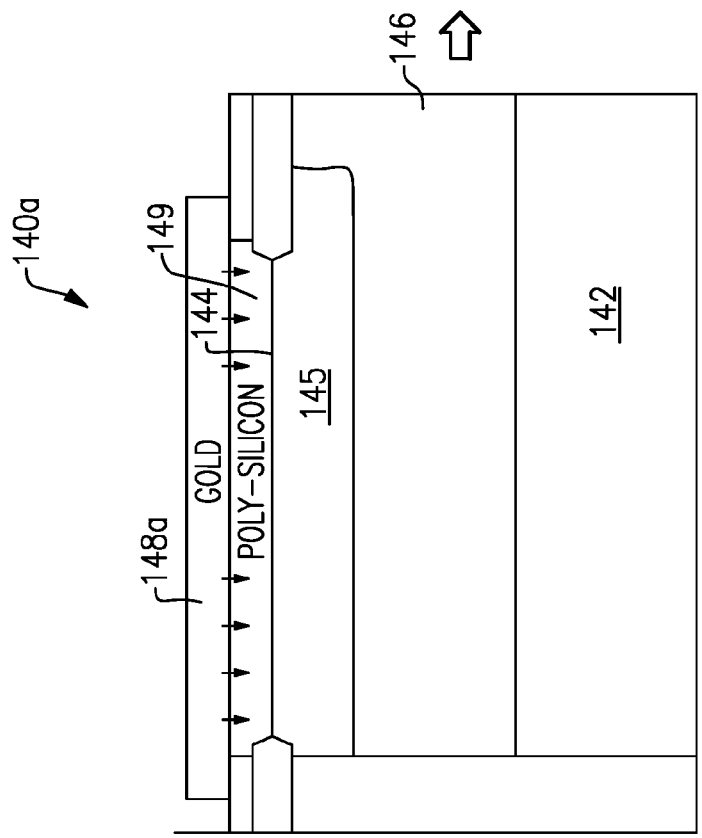

Referring to FIGS. 14A-14B, a method of manufacturing a wear-out monitor device is illustrated, according to some embodiments. In particular, the method relates to forming the reservoir of monitor atoms. It will be appreciated that directly contacting a layer of monitor atoms such as a layer of gold can result in defects, such as poor contact and/or delamination due to poor adhesion. Without being bound to any theory, such defects may be caused by a relatively high interfacial energy between some diffusing material and the semiconductor substrate. In order to create a reservoir of such impurity atoms without such defects, a mixture layer having the diffusing material may be formed, instead of a pure layer of the diffusing material. The mixture may be an alloy layer, a compound, a doped layer or a mechanical mixture, among other forms of mixture.

By way of example, an intermediate monitor structure 140a is shown in FIG. 14A, which includes a substrate 142 in which a first doped region 144 and a second doped region 146 interposed by an intervening region 145 are formed, similar to the monitor structures described above with respect to FIGS. 6A/6B. Unlike FIGS. 6A/6B, instead of forming a layer of monitor atoms, e.g., gold atoms, directly on the surface of the first doped region, an adhesion layer 149, such as a polysilicon layer, may be formed between a layer 148a of monitor atoms and the underlying semiconductor material of the first doped region 144. Subsequently, the intermediate monitor structure 140a may be subjected to a thermal anneal, resulting in a wear-out monitor device 140b having an adhesion layer, e.g., a polysilicon layer, that is impregnated or at least partially saturated with the monitor atoms, e.g., gold. An electrode 148b serving as a reservoir of monitor atoms is thus formed, with improved adhesion properties with the underlying silicon, compared to a pure layer of the monitor atoms. Other embodiments are possible, e.g., a mixture layer of gold and polysilicon can be formed directly on the silicon surface, or another material such as a dielectric material or a chalcogenide material that can hold a relatively high concentration of gold with good adhesion properties can be used as the intervening layer 149. It will be appreciated that the specific combination of the intervening layer and the method of forming can depend on the type and concentration of the specific wear-out diffusing material that is to be used.

Referring to FIGS. 15A-15D, various configurations 150a-150d of a wear-out monitor device including a PN junction are illustrated, according to embodiments. In each of the configurations 150a-150d, a PN junction may be formed in a substrate 152. A first doped region 154a-154d doped with a first dopant type contacts the first electrode 158a-158d serving as reservoirs of monitor atoms, while a second doped region doped with a second dopant type is formed in various configurations. In the configurations 150a-150d, the second doped region is configured as the substrate 152 (FIG. 15A), a well 155b(FIG. 15B) formed in a substrate 152, a buried collector region 156c formed in the substrate 152 (FIG. 15C) and a buried collector region 156d formed in a well 155 formed in the substrate 152 (FIG. 15D). It will be appreciated that dopant concentrations of the first and second doped regions can be varied to tailor the characteristics of the monitor region, e.g., to tailor the dimensions of the depletion region formed therein and/or to tailor the built-in voltage, among other characteristics, as described supra. For example, where a relatively large depletion region is desired, the doped region contacting the reservoir may be doped heavily, while the doped region not contacting the reservoir may be doped relatively lightly.

Referring FIGS. 16A-16D, various configurations of a wear-out monitor device are illustrated, in which the flux or the diffusion rate of monitor atoms diffusing into the underlying substrate are controlled by physically limiting access to the substrate, according to embodiments. Referring to FIG. 16A, the area (represented by the width) of contact between the first electrode 168a serving as the reservoir of monitor atoms and the first doped region 164a may be restricted by restricting the size of the opening through the dielectric mask 163 formed over the substrate, thereby limiting the diffusion of the monitor atoms into the substrate. Referring to FIG. 16B, in addition to restricting the size of the openings through the dielectric mask 163, the number of openings can be further increased or decreased as needed. Referring to FIG. 16C, the area of contact between the first electrode can be further reduced by forming additional diffusion-blocking layers 165, e.g., nitride layers, in the openings formed between or though field oxide regions. Referring to FIGS. 16D-16E, the flux of monitor atoms available for diffusion into the underlying substrate can be further restricted using an adhesion layer 169d-169g under the first electrodes 168a-168d that serve as the reservoir of monitor atoms. The wear-out monitor devices 160d, 160e and 160f of FIGS. 16D, 16E and 16F are substantially identical to the wear-out monitor devices 160a, 160b and 160c of FIGS. 16A, 16B and 16C, respectively, except for the presence of the adhesion layers 169d-169f, which can be formed of, e.g., a polysilicon, and interposed between the respective first electrodes 168a, 168b, and 168c and the respective first doped regions 164a, 164b and 164c. Referring to FIG. 16G, the area of contact between the first electrode 168c and the first doped region 164c can be further reduced by forming spacers 167, e.g., nitride spacers layers, in the openings formed though the additional diffusion-blocking layers 165.

Referring to FIGS. 17A and 17B, wear-out monitor devices 170a and 170b configured as bipolar junction transistors (BJTs) are illustrated, according to embodiments. A first doped region 174 doped with a first dopant type, which is contacted by a first electrode 178a serving as a reservoir of impurity atoms, may be formed at a surface region and configured as an emitter of a BJT. A second doped region 175 doped with a second dopant type opposite the first dopant type, which is contacted by a second electrode 178b, may serve as a base of the BJT. Third doped regions 176a and 176b doped with the first dopant type, which are contacted by the third electrodes 178c, may serve as a collector of the BJT. In FIG. 17A, the collector region is formed of a deep well, while in FIG. 17B, the collector region is formed of a buried collector region. In addition, in FIG. 17B, the buried region doped with the first dopant type can be formed below the well doped with the second dopant type, thereby forming a base/collector junction of the BJT. Thus formed BJT can be configured for monitoring wear-out resulting from various stresses including thermal, current and/or voltage stresses.

Figure 18A:
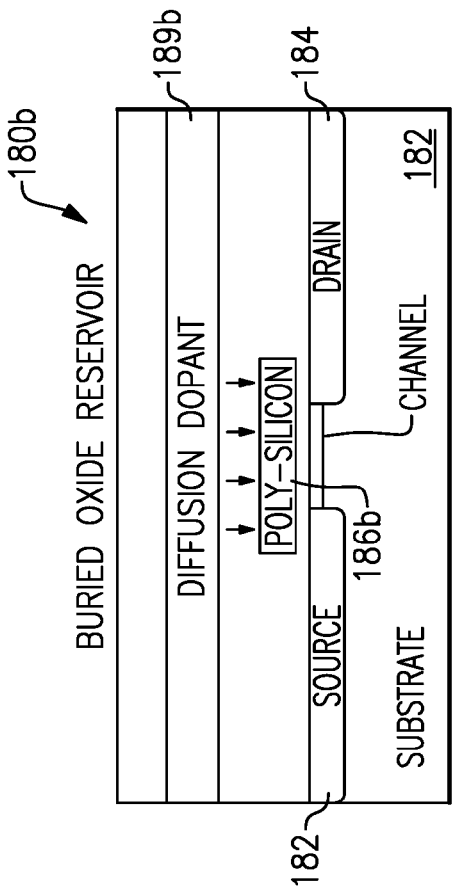
FIGS. 18A-18D illustrate wear-out monitor devices configured as metal oxide semiconductor (MOS) transistors, according embodiments.
Figure 18B:
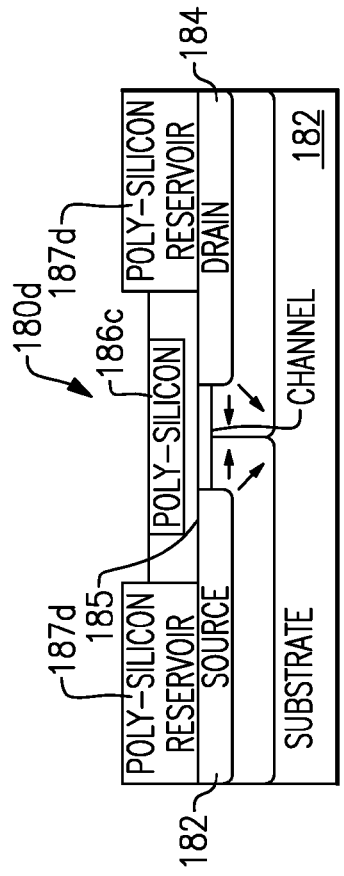
Figure 18C:
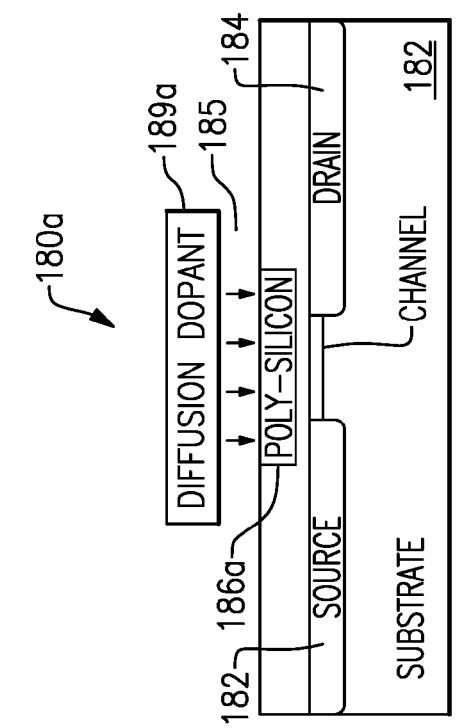
Figure 18D:
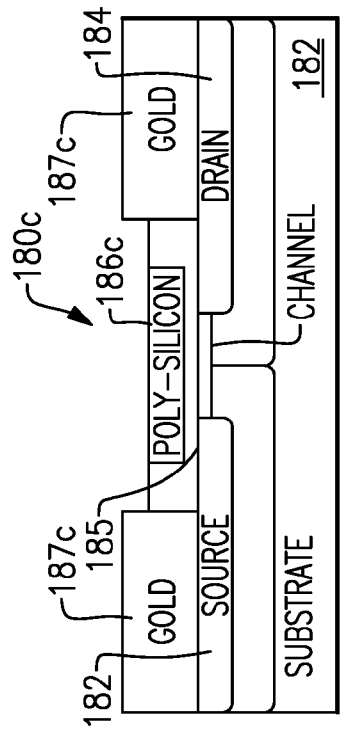

Referring to FIGS. 18A-18D, wear-out monitor devices 180a-180d configured as MOS transistors are illustrated, according to embodiments for monitoring wear-out of a monitored structure in a core circuitry (not shown for clarity, see FIGS. 2A/2B), which may be a similarly configured MOS transistor elsewhere on the same substrate, e.g., in the core circuitry. Each of the wear-out monitor devices 180a-180d comprises a source 182 and a drain 184 formed in a semiconductor substrate 182. Each of the wear-out monitor devices 180a-180d additionally comprises a gate dielectric 185 and a gate 186a-186d. Each of the wear-out monitor devices 180a-180d has a different configuration for disposing the reservoir of monitor atoms. For example, the monitor atoms may be disposed as a separate layer 189a, e.g., a polysilicon layer, over a gate 186a (FIG. 18A), as a separate layer 189b (FIG. 18B), e.g., a buried oxide doped with the diffusing material, over a gate 186b, or on one or both of the source 182 and the drain 184, either as a layer 187c of monitor atoms directly on the source/drain 182/184 (FIG. 18C), or as reservoir layers 187d doped with the monitor atoms formed on the source/drain 182/184 (FIG. 18D). When disposed on or as part of the gate 186a/186b, the wear-out monitor devices 180a/180b may be used to monitor various wear-out mechanisms related to degradation in threshold voltage, subthreshold slope, interfacial charge, gate dielectric (e.g., time-dependent dielectric breakdown), off state leakage, on/off ratio, hot channel injection, etc. When disposed on or as part of one or both of the source 182 and the drain 184, the wear-out monitor devices 180c/180d may be used to monitor punch-through, short-channel effect, junction capacitance, etc.

Figure 19A:
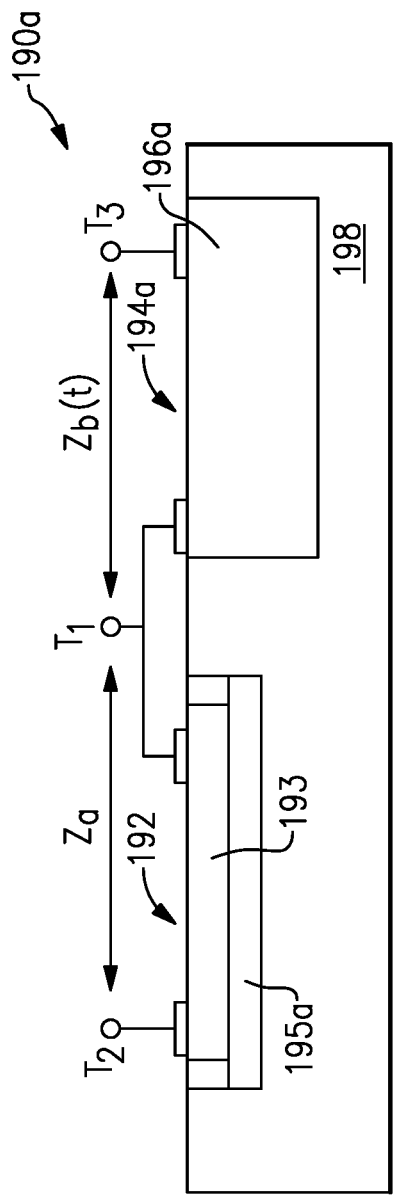
Figure 19B:
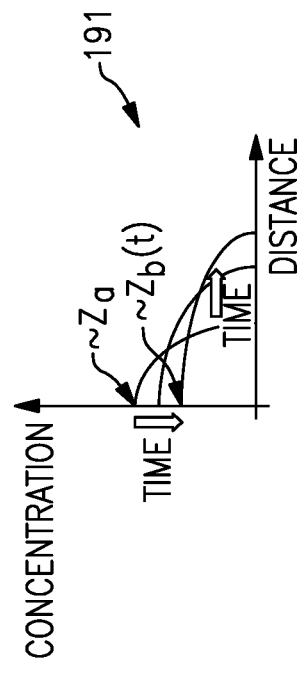
FIG. 19B schematically illustrates time evolutions of concentration profiles of wear-out monitor devices of FIGS. 19A and 19C-19D.

Referring FIG. 19A, a wear-out monitor device 190a configured for sensing impedance as an indicator of the state of wear-out is illustrated, according to embodiments. The wear-out monitor device 190a includes a substrate 198 having formed therein a monitor structure 194a and a reference structure 192 that are commonly connected to a first terminal T1. The reference structure 192 is further connected to a second terminal T2 and has an impurity region 193 doped with monitor atoms. The monitor structure 194a is further connected to a third terminal T3 and has an impurity region 196a doped with the same monitor atoms as the impurity region 193 of the reference structure 192. While the impurity region 193 of the reference structure 192 is enclosed by a diffusion barrier structure 195, no such enclosure exists for the monitor structure 194. In some embodiments, the impurity region 193 and the impurity region 193 have the same or similar concentration profile of monitor atoms. Upon receiving a wear-out stress, e.g., a thermal wear-out stress, the impurity region 196a of the monitor structure 194a would have a lower concentration of the monitor atoms compared to an initial concentration and compared to the impurity region 196a of the monitor structure 194a, due to free diffusion of the monitor atoms in the impurity region 196a compared to limited diffusion of the monitor atoms in the impurity region 193. In contrast, the impurity region 192 of the reference structure 192 would have a relatively unchanged concentration of the impurity atoms. The degree of wear-out of a monitored device in a core circuitry (not shown for clarity, see FIGS. 2A/2B) can be measured based on the resulting changes in impedance measurements, which can resolve relatively small changes in concentration of the monitor impurity atoms at small time scales and/or lower temperatures, thereby making the wear-out monitor device 190a particularly suitable for shelf-life applications. FIG. 19B illustrates a graph 191 schematically illustrating time evolutions of the impedance $Z_a$ of the reference structure 192 measured between T1 and T2 and the varying impedance $Z_b(t)$ of the monitor structure 196a measured between T1 and T3. As illustrated, the Za changes by a relatively small degree after receiving the wear stress, while the $Z_b(t)$ changes by a relatively large degree as illustrated. Based on the time evolution of the $Z_b(t)$, the wear-out state of the monitored device in the core circuitry can be determined.

Referring FIG. 19C, a wear-out monitor device 190c configured for sensing impedance as an indicator of the state of wear-out is illustrated, according to embodiments. The wear-out monitor device 190c is substantially identical to the wear-out monitor device 190a of FIG. 19A except, in the wear-out monitor device 190c, an impurity region 196b of a monitor structure 194a is partially enclosed by a partial diffusion barrier structure 197. The partial diffusion barrier structure 197 has an opening such that diffusion of the monitor atoms out of the impurity region 196b is partially restricted. Such configuration can be beneficial when the expected diffusion of the monitor atoms is relatively rapid, to prevent too rapid of a change in concentration of the monitor atoms, or in the $Z_b(t)$.

Referring FIG. 19D, a wear-out monitor device 1909d configured for sensing impedance as an indicator of the state of wear-out is illustrated, according to embodiments. Unlike the wear-out monitor devices 190a of FIG. 19A and 190c of FIG. 19C, the wear-out monitor device 190d does not have a monitor structure and a reference structure that are discrete. Instead, the wear-out monitor device 190d has a monitor region 194d and reference region 192d that are enclosed by a barrier structure 195d, such the monitor atoms in the reference region 192d are configured to laterally diffuse into the monitor region 194d.

It will be appreciated that the wear-out monitor devices 190a, 190b and 190d can be advantageous, among other reasons, because a semiconductor junction is not needed for impedance measurement-based determination of the wear-out level. As a result, the material of the substrate 198 can be any suitable diffusing medium, including an insulator (e.g., SiO2, sapphire) or any semiconductor substrate disclosed herein. Thus, an additional degree of freedom, i.e., the diffusing medium, is available for designing the monitor device. In addition, because the monitor atoms are prevented from freely diffusing away at least from the reference region, relatively small amount of monitor atoms may be needed.

Sensing Circuitry for Wear-Out Monitors

In the following, various circuitry that can be included in the sensing circuitry for sensing the various electrical signatures associated with the wear-out monitor devices and the reference devices according to embodiments are described. It will be appreciated that each of the various circuitry disclosed herein can be part of the sensing circuit 25a/25b described above with respect to FIGS. 2A/2B.

FIGS. 20A-21B illustrate various conversion circuits configured for converting measured input signals from wear-out and/or reference monitor devices described herein into output signals, according to various embodiments.

Figure 20A:
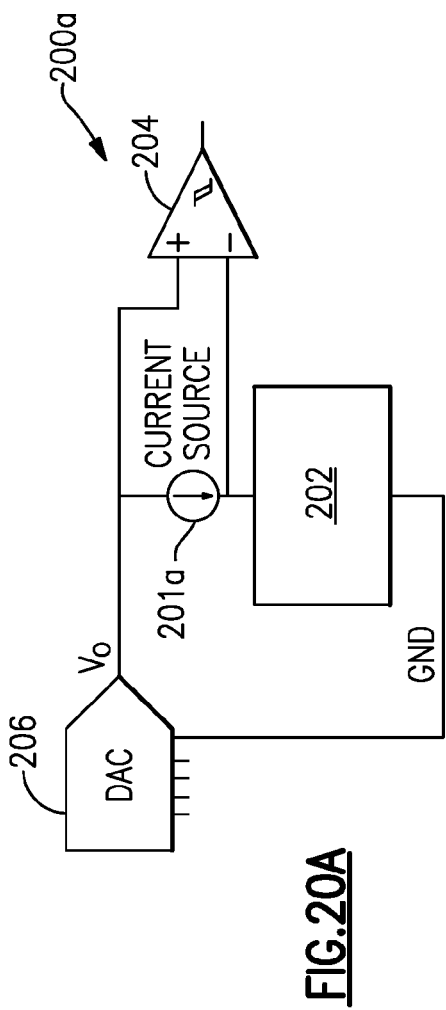
FIGS. 20A-20C illustrate conversion circuits configured to be used with wear-out monitor devices, according to some embodiments.

FIG. 20A illustrates a punch-through wear-out monitor conversion circuit 200a configured for conversion of monitor signals from various monitor devices and reference devices described above, according to embodiments. In particular, the conversion circuit 200a may be configured for monitoring punch-through characteristics of semiconductor devices. For example, the conversion circuit 200a may be electrically connected to wear-out monitor devices configured for monitoring punch-through characteristics described above, e.g., with respect to FIGS. 11A-11B and 12A-12B. The conversion circuit 200a is configured such that, below a predetermined punch-through voltage, no current flows through a punch-through monitor device 202. When no current flows through the punch-through the device 202, potentials of the + and − terminals of a comparator 204 are equal. Once a punch-through occurs, the comparator 204 is activated, and a current flows through the punch-through device 202. The punch-through voltage is output through a DAC 206, which may be recorded.

Figure 20C:
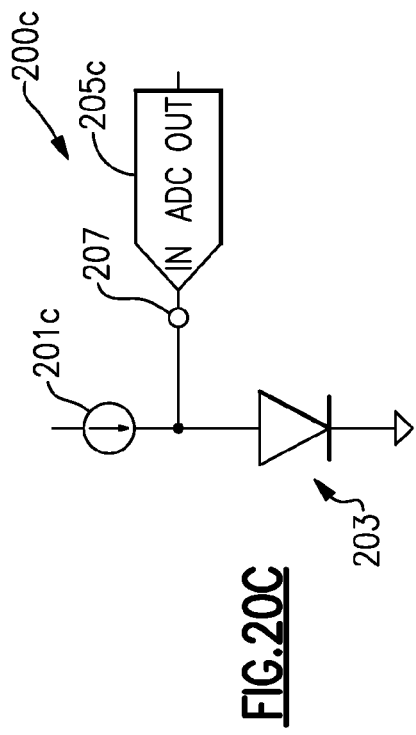
Figure 20B:
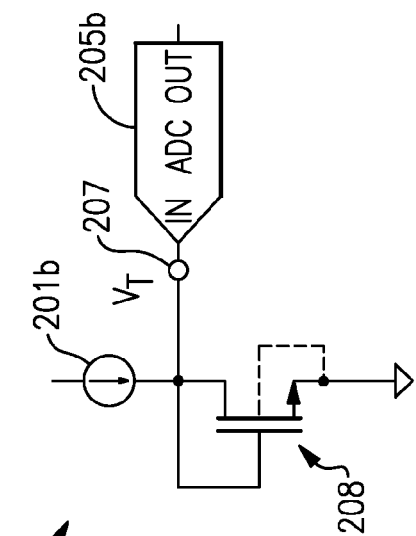

FIG. 20B illustrates a threshold voltage (Vth) wear-out monitor conversion circuit 200b configured for conversion of monitor signals from various monitor devices and reference devices described above, according to embodiments. In particular, the conversion circuit 200b may be configured for monitoring Vth variation characteristics of MOS devices. In operation, the current source 201b raises the voltage on a VT node 207 (ADC input) until the voltage saturates. If a constant current is output from the current source 201b, the saturation in voltage at the VT node 207 varies according to the variation of Vth of the transistor 208. The Vth voltage is output to ADC 205b and recorded over time.

FIG. 20C illustrates a diode forward voltage wear-out monitor conversion circuit 200c configured for conversion of monitor signals from various monitor devices and reference devices described above, according to embodiments. In particular, the conversion circuit 200c may be configured for monitoring forward voltages of diodes. In operation, the current from current source 201c raises the voltage on a node 207 (ADC input) until the voltage saturates. If a constant current is output from the current source 201c, the saturation voltage at the node 207 will vary with of forward voltage of the diode 203, which can be output to ADC 205c and recorded over time.

FIG. 21A illustrates a conversion circuit 210a configured for conversion of monitor signals from various monitor devices and reference devices described above, according to some embodiments. In operation, in a first stage, the conversion circuit 210a is configured to monitor a voltage on a wear-out monitor 212a at a node 214a. This is achieved by, in a first stage, buffering the voltage of a wear-out monitor device 212a at the node 214a using a first amplifier 216 and a first resistor R1. In a second stage, the buffered voltage at a node 217 is subsequently gained up by a second amplifier 218a, and subsequently converted for output at an ADC 219a.

FIG. 21B illustrates a conversion circuit 210b configured for conversion of monitor signals from various monitor devices and reference devices described above, according to some embodiments. In operation, in a first stage, the conversion circuit 210b is configured to monitor a voltage on a wear-out monitor 212b at a node 214b by first low pass-filtering the input signal, followed by gaining using a first amplifier 218a, and subsequently converting for output at ADC 219.

Figure 22A:
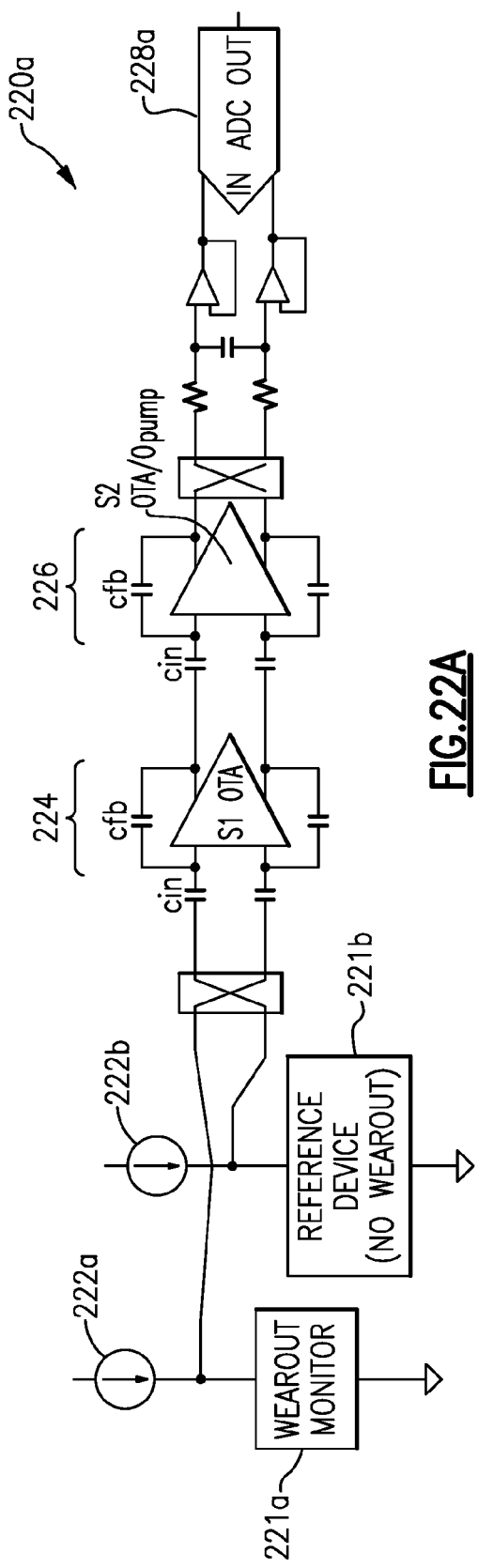
FIGS. 22A-22C illustrate a capacitive programmable gain amplifier (PGA) circuits configured to compare output signals between a wear-out monitor device and a reference device, according to embodiments.

FIG. 22A illustrates a capacitive programmable gain amplifier (PGA) circuit 220a configured to compare output signals between a wear-out monitor device 221a and a reference device 221b, according to embodiments. The PGA circuit 220a includes two current sources 222a and 222b configured to supply currents to a wear-out monitor 221a and a reference device 221b, respectively. The PGA circuit 220a further includes two fully differential voltage-mode capacitive amplifiers 224 and 226 connected to each of the wear-out monitor device 221a and the reference device 221b. As illustrated, the PGA circuit 220a is configured as a chopped capacitive PGA with an output filter and a buffer, and is particularly adapted for amplifying small signal differences (~ tens to hundreds of nV) between outputs of the wear-out monitor device 221a and the reference device 221b.

Figure 22B:
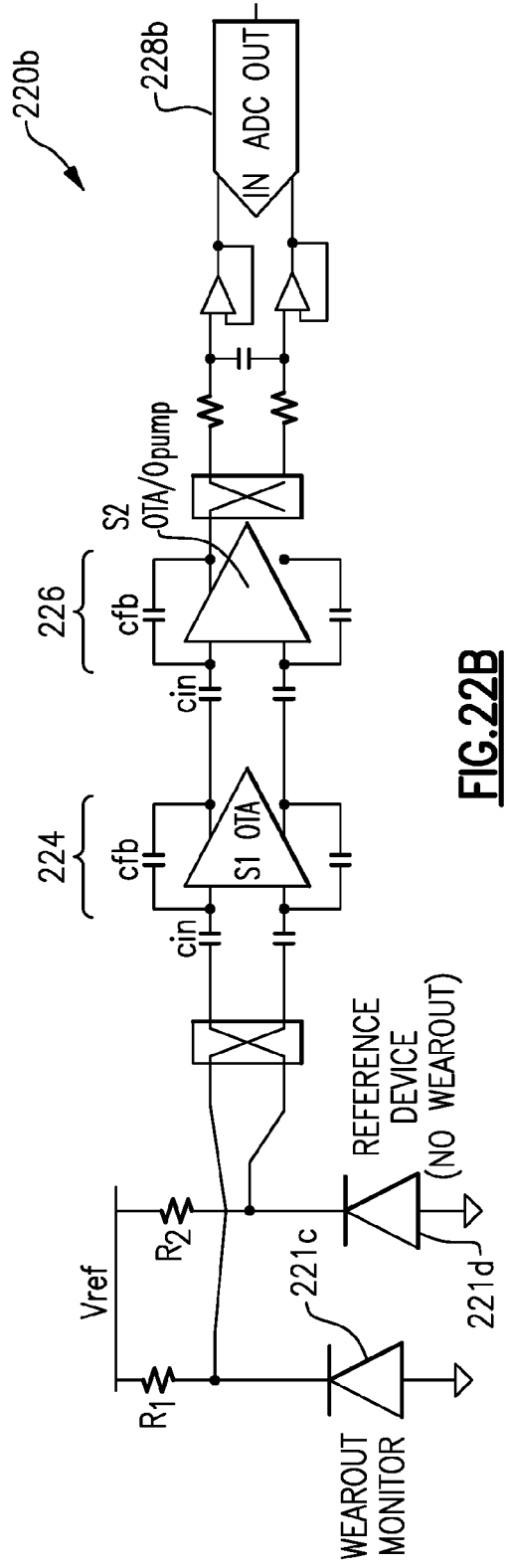

FIG. 22B illustrates a capacitive programmable gain amplifier (PGA) circuit 220b configured to compare output signals between a wear-out monitor device 221c comprising a diode, and a reference device 221d comprising a diode, according to embodiments. Unlike the PGA circuit 220a of FIG. 22A, in the PGA circuit 220b, the wear-out monitor device 221c and reference device 221d are each connected to a common reference voltage, Vref. Similar to the PGA circuit 220a of FIG. 22A, the PGA circuit 220b is configured as a chopped capacitive PGA with an output filter and a buffer, and is particularly adapted for amplifying small signal differences (~nV~100 nV) between outputs of a wear-out monitor device 221c and a reference device 221d.

Figure 22C:
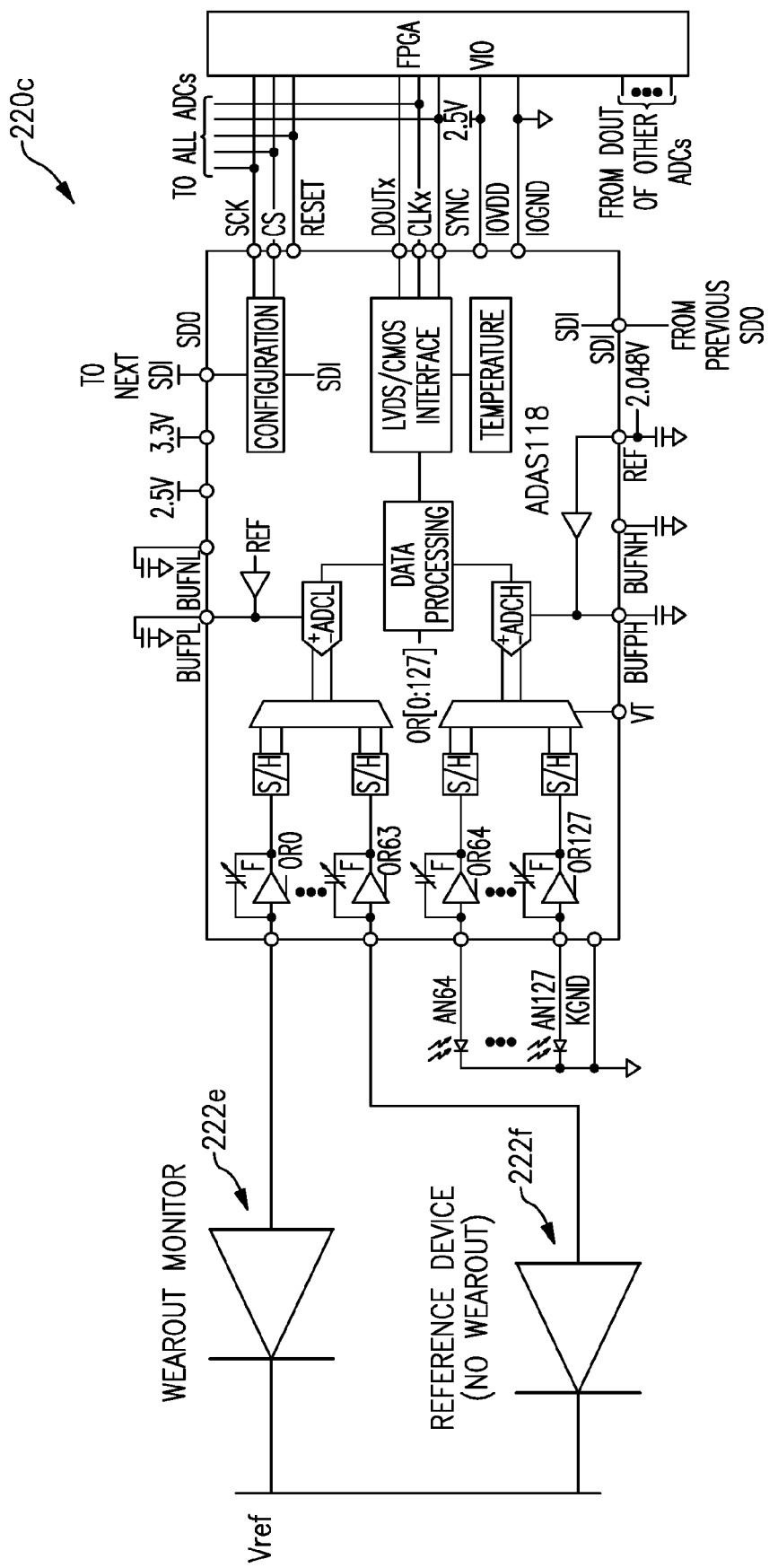

FIG. 22C illustrates a current-to-digital ADC conversion circuit 220c configured to compare output signals between a wear-out monitor device 221e comprising a diode and a reference device comprising a diode, according to embodiments. For illustrative purposes, in the illustrated embodiment, the ADC conversion circuit 220c is a 128-channel, current-to-digital, analog-to-digital converter (ADC). The ADC conversion circuit 220c includes 128 low power, low noise, low input current integrators, simultaneous sample-and-holds, and two high-speed, high-resolution ADCs with configurable sampling rate and resolutions up to 24 bits. The converted channel results are output on a single LVDS self-clocked serial interface, which reduces external hardware. An SPI-compatible serial interface allows configuration of the ADC using the SDI input. The SDO output allows the user to daisy-chain several ADCs on a single, 3-wire bus. The ADC circuit 220c can use the separate supply IOVDD to reduce digital noise effect on the conversions.

FIGS. 23A-23C illustrate trans-impedance amplifiers (TIAs) 230a-230c, respectively, each configured to amplify and to convert current output of monitor signals from various wear-out monitor devices or reference devices described herein to a voltage signal, according to embodiments. In some embodiments, the TIAs can be used where a wear-out monitor has a current response that is more linear than the voltage response. For example, the illustrated TIAs 230a-230c can be used with a wear-out monitor 234 which include a diode, e.g., a photodiode, where the current response may have better than, e.g., 1% linearity over a wide range of light input. The TIAs 230a-230c present low impedance to the wear-out monitor 234 and isolate it from the output voltage of the operational amplifier. Each of the TIAs 230a-230c has an amplifier 232 in an inverting configuration and a feedback resistor, $R_F$, which sets the gain of the amplifier 232, whose value is $-R_F$. The output each of TIAs 230a-230c can be converted by an ADC. Each of the TIAs 230a-230c is particularly suitable for converting low-level current of a wear-out monitor to a voltage, as described infra.

Referring to FIG. 23A, in operation, the wear-out monitor device 234 is connected between ground and the inverting input of the amplifier 232. The non-inverting input of the amplifier 232 is also connected to ground. This provides a low impedance load for the wear-out monitor device 234, which keeps the bias low. The high gain of the amplifier 232 keeps the current through the wear-out monitor device 234 equal to the feedback current through $R_F$.

Referring to FIG. 23B, the TIA 230b is similar to the TIA 230a of FIG. 23A, except, the TIA 230b includes a DC supply $V_1$, e.g., a battery, between the wear-out monitor device 234 and ground, such that a wear-out monitor can be measured with a positive output voltage. For example, if a reverse bias leakage current ($I_D$) through a wear-out monitor device 234 having a diode is 5 nA, and $R_F$ is 1 MΩ, and $V_{bias}$ is =−0.1V, $V_{out}$=5 nA*1 MΩ=5 mV.

Referring to FIG. 23C, the TIA 230c is similar to the TIA 230a of FIG. 23A, except, the TIA 230c includes a DC supply $V_2$, e.g., a battery, having a Vbias between the non-inverting input of the amplifier 232 and ground, such that a wear-out monitor can be measured with a positive output voltage. For example, if a reverse bias leakage current through a wear-out monitor device 234 having a diode is 5 nA, and $R_F$ is 1 MΩ, and $V_{bias}$ is =+0.1V, $V_{out}$=(5 nA*1MΩ)+0.1V=105 mV.

Thus, the trans-impedance amplifiers (TIAs) 230a-230c have input offset voltage due to the monitor device 234 that is very low while the gain is very high, such that they allow for very low input bias current (~+/−20 fA) to be measured and amplified.

Figure 24:
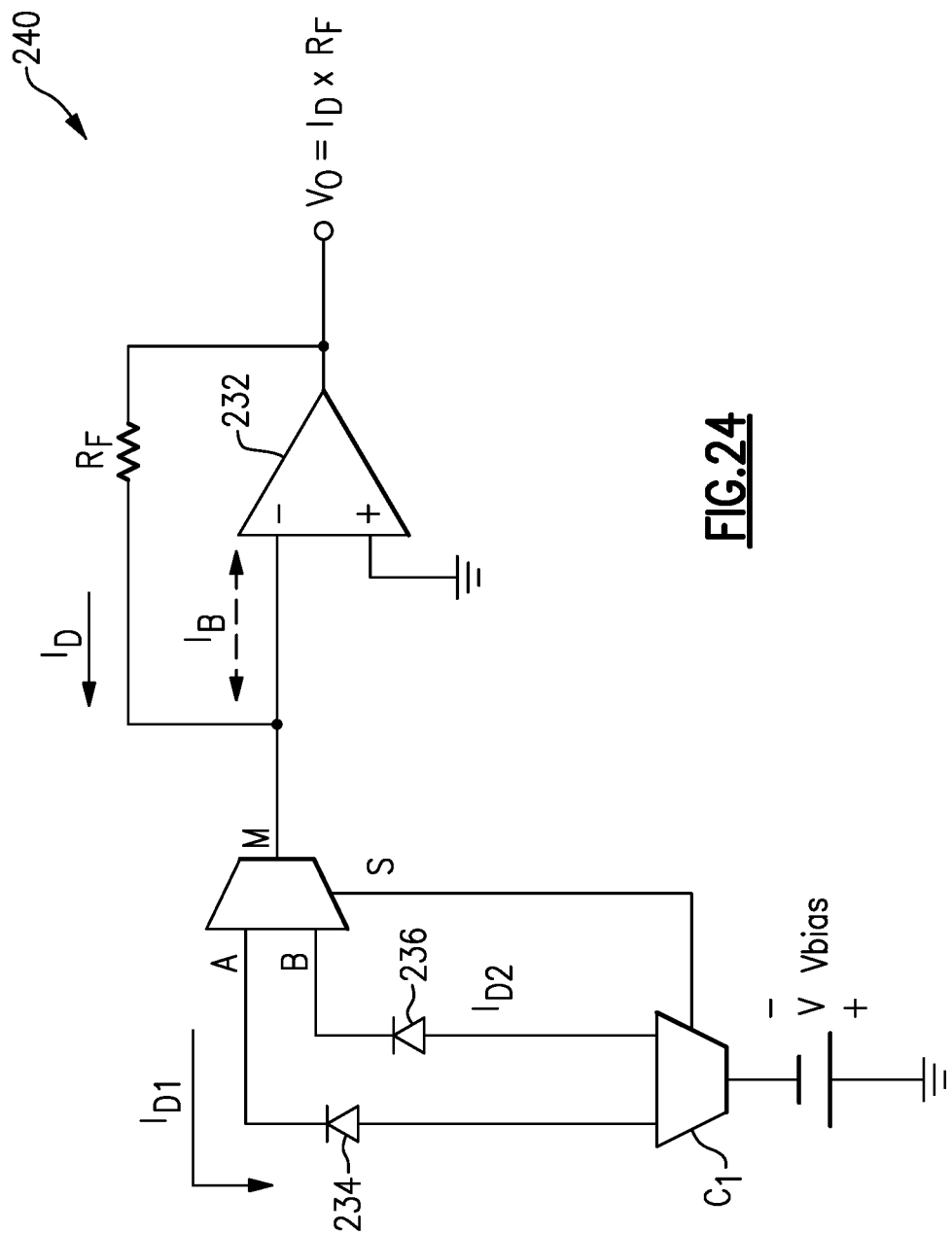
FIG. 24 illustrates a trans-impedance amplifier (TIA) with anode bias multiplexed to amplify and to convert current outputs of a monitor device and a reference device to a voltage signal, according to some embodiments.

FIG. 24 illustrates a trans-impedance amplifier (TIA) 240 with anode bias multiplexed such that the TIA amplifier 240 is configured to amplify and to convert current outputs ($I_{D1}$, $I_{D2}$) of monitor signals from both a monitor device 234 and a reference device 236 into voltage outputs, according to some embodiments. Advantageously, since the monitor device 234 and the reference device 235 use the same $V_{bias}$ and the same amplifier 232, errors in conversion of the current outputs ($I_{D1}$, $I_{D2}$) are cancelled. In operation, the TIA 240 can be part of the front end of a sensing circuit. The output from each device can be converted by an ADC whose result can be stored, and subsequently subtracted to calculate a difference in leakage current, for example. Storing the difference in leakage current over time would track, e.g., the temperature the wear-out monitor device was exposed to over time.

Lifetime Indicator Systems

Figure 25:
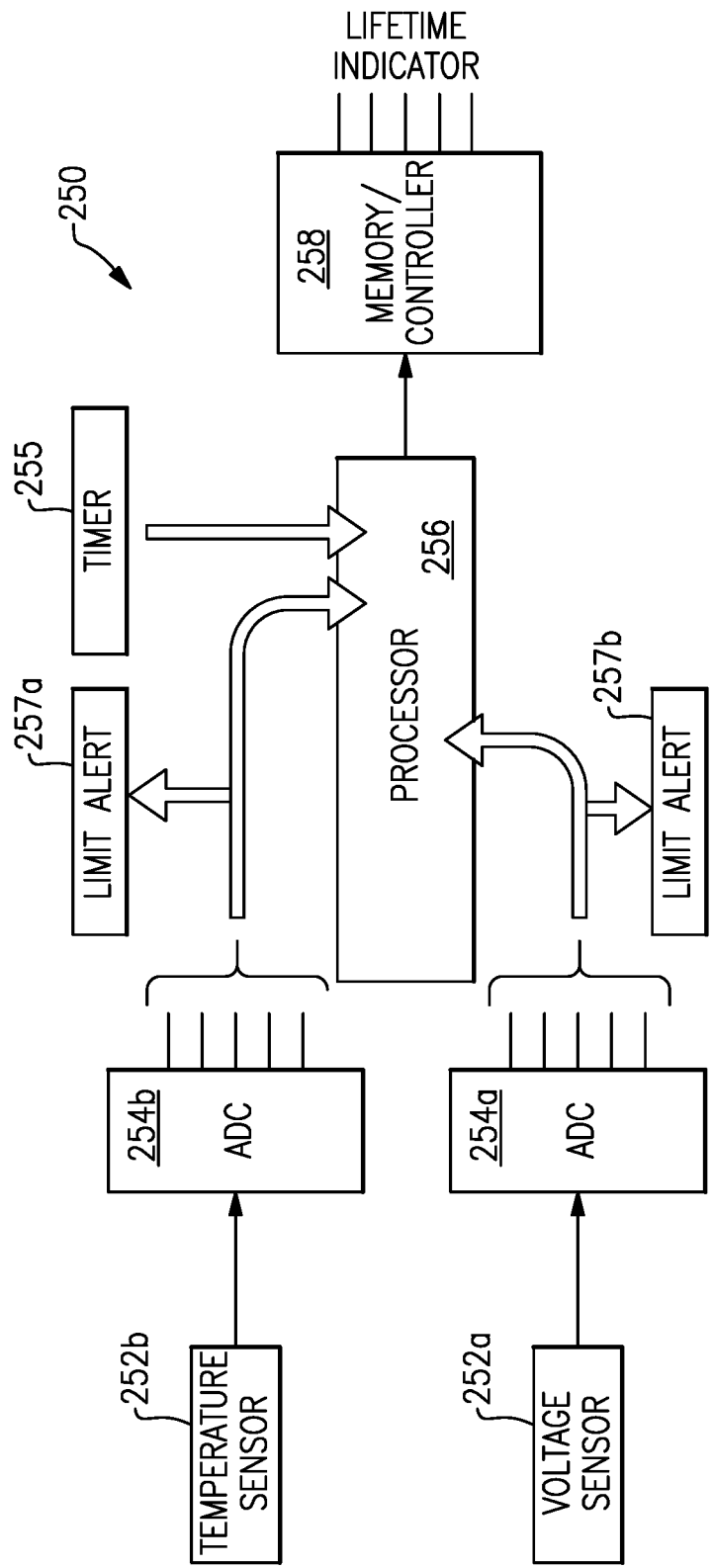
FIG. 25 illustrates a lifetime indicator system having one or more wear-out monitor devices, according to embodiments

FIG. 25 illustrates a lifetime indicator system 250 having one or more wear-out monitor devices, according to embodiments. It will be appreciated that the lifetime indicator system 250 disclosed herein can be part of the sensing circuit 25a/25b described above with respect to FIGS. 2A/2B.

The plurality of different monitor devices 252a, 252b, can be different types wear out monitor devices formed in a common platform (e.g., a single chip or a single substrate), according to embodiments. The one or more different monitor devices 252a, 252b can provide, e.g., parallel and/or simultaneous monitoring data of different types of wear-out stresses. In the illustrated embodiment, the one or more wear-out monitor devices include a temperature wear-out monitor 252b and a voltage or current wear-out monitor 252a. In operation, the one or more wear-out devices 252a, 252b can provide parallel and/or simultaneous monitoring data to a respective ADC 254a, 254b, whose output can be fed into a common processor 256. Simultaneously, respective limit alerts 257a, 257b can be generated based on the monitoring data from each of the one or more wear-out devices 252a, 252b. Each limit alert 257a, 257b can be pre-established based on individual minimum and maximum values limits placed by the user for respective monitors. The lifetime indicator system 250 can also include a timer 255. The processor 256 is configured to receive the monitoring data from each of the wear-out monitor devices 250a, 250b and to determine, either based on information from an individual wear-out monitor device 252a or 252b, or by combining information from the more than one monitor devices 252a, 252b, a wear level of a relevant core circuit device (not shown for clarity, see FIGS. 2A/2B) in a core circuitry. Thus, calculated wear-out level may be stored in a memory device 258, e.g., a nonvolatile memory device. In some implementations, the calculated wear-out level data stored in the memory device can be transmitted in an encrypted form for protection.

In some embodiments, the lifetime indicator system 250 can be configured as a supply current wear-out monitoring system. Many IC failures are caused by wear-out of supply current modules, such as supply current modules configured for providing standby or power-save currents. Failures can occur when the supply current degrades due to wear-out caused by EOS, ESD, corrosion and latent defects to name a few. When configured as a supply current wear-out monitoring system, the wear-out monitor 252a can be configured as a supply current wear-out monitor. When a failure does occur, by monitoring time-stamped supply current values and recording them in the memory 258, and "playing back" such current values leading up to failure, information related to the cause of the failure can be obtained.

In other embodiments, the lifetime indicator system 250 can be configured as a device failure monitoring system, e.g., a transistor device wear-out monitoring system for monitoring device failures that depend on voltage, current, temperature, and/or time. Examples of such wear out mechanisms include wear-out due to hot carrier injection (HCI) and negative bias temperature instability (NBTI), which are known to negatively affect transistor performance (speed and voltage). Accuracy of wear-out models for failures resulting from such mechanisms can be improved by simultaneously monitoring a cumulative voltage stress on the transistor, while also monitoring the temperature at which the voltage stress is applied.

Mission Profile Monitoring Systems

A mission profile generally describes loads and stresses acting on an item, e.g., a component, a device or a system in actual use. As used herein, a mission profile refers to a time-phased description of events and environments the item experiences from initiation to completion of a specified mission for a specified time. The events and environments, e.g., loads and stresses, include, for example, changes in temperature, temperature profile, humidity, vibration, electric/magnetic fields, or a combination of these factors, among other environmental factors. It can be important to specify the relevant stresses in their nature, intensity and duration of exposure, as well as the mix as closely as possible. With these details it is possible, within specified accuracy, projections regarding reliability of application and its components in field applications.

Generally two different types of mission profiles exist. A pre-determined mission profile refers to a mission profile that is predetermined before the item is put in use and may be pre-programmed to a storage device, such as a non-volatile memory device. In contrast, a "smart" mission profile is an evolving mission profile that self-adjusts over time based on the output from on-board sensors, e.g., wear-out sensors, that sense the mission profile parameters under actual operating conditions. Thus, a "smart" mission profile more closely reflects the actual conditions that the component, the device or the system sees over its lifetime. The "smart" mission profile can be particularly important in applications where specific mission profiles are not well known, because the "smart" mission profile can be updated and improved periodically based on the changing output from the on-board sensors. In the following, a mission profile monitoring system comprising on-chip wear-out sensors is described, according to embodiments.

Figure 26:
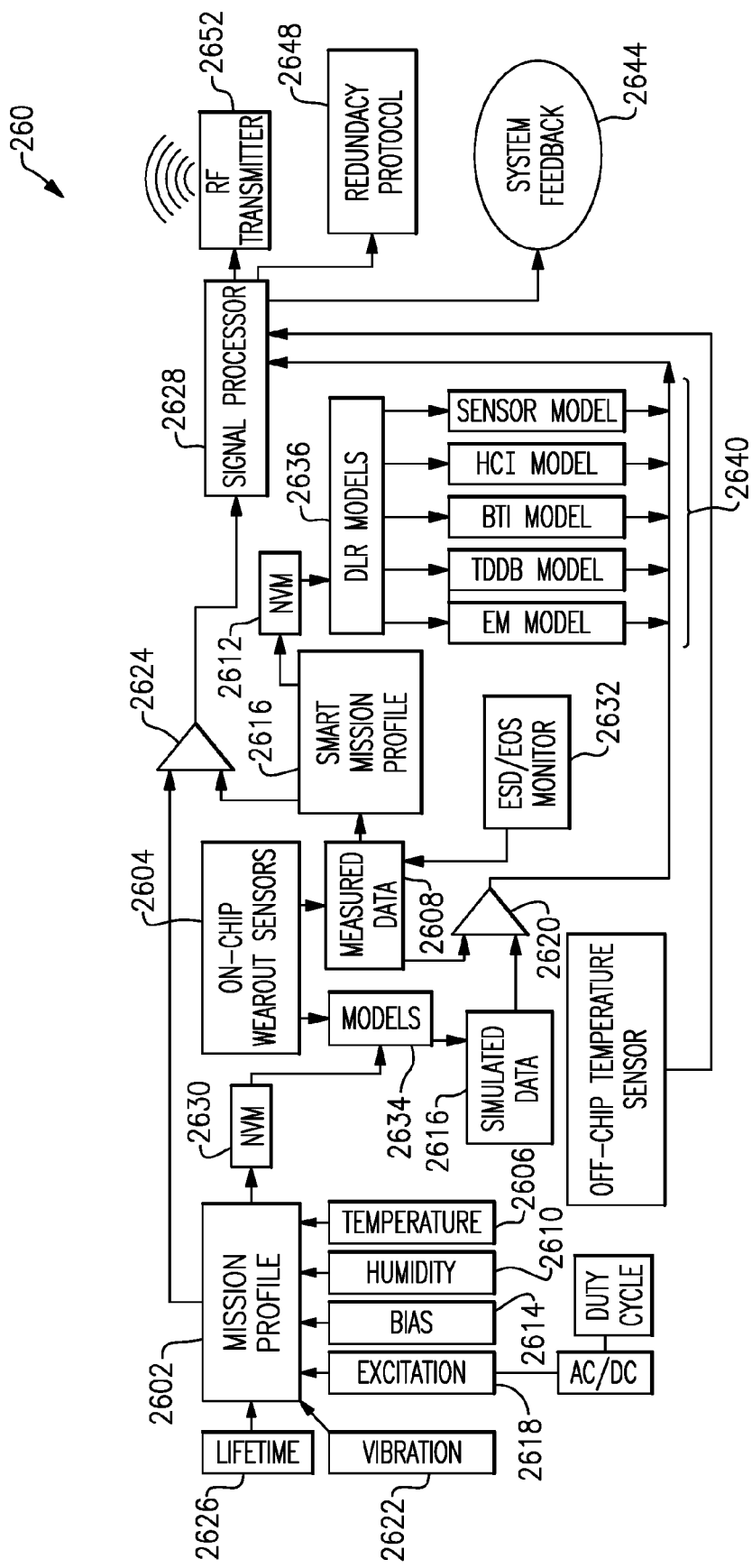
FIG. 26 illustrates a mission profile monitoring system comprising one or more wear-out sensors, according to embodiments.

Referring to FIG. 26, a block diagram of a mission profile monitoring system 260 comprising one or more wear-out sensors is illustrated for monitoring a mission profile of a component, a device or a system, according to embodiments. The component, a device or a system can be included or electrically connected to the core circuitry (not shown for clarity, see FIGS. 2A/2B). The one or more wear out sensors 2604 can include one or more of any of the wear-out sensors described herein, including sensors configured to measure wear-out from temperature, voltage, current, humidity, motion (e.g. vibration), etc. The system 260 is configured to periodically generate measured output data 2608 from the wear-out sensors 2604 over the lifetime of the component, the device or the system. The output data can be stored in a first storage/memory component 2612, which can be, e.g., a non-volatile memory device or a volatile memory device. The stored data can include instantaneous data as well as statistical data, e.g., average data and variability data. The output data cumulated over time that is stored in the first storage/memory component 2612 make up a "smart" mission profile 2616.

The system 260 additionally includes a predetermined mission profile 2602, which includes a set of pre-determined mission profiles that can be used as reference profiles. The predetermined mission profiles include temperature profile 2606, humidity profile 2610, bias (voltage) or current profile 2614, excitation profile 2618, vibration profile 2622 and lifetime profile 2626, among other profiles. The predetermined mission profile 2602 can be stored in a second storage/memory component 2630, e.g., a non-volatile memory device or a volatile memory device. The system 260 additionally includes a modelling module 2634 that is configured to retrieve the predetermined mission profiles from the second storage component/memory component 2630 and to generate simulated data 2616 of the wear-out state of the component, the device or the system using a predetermined set of physical models 2634.

The system 260 additionally includes a first comparator 2620 configured to compare the simulated data from the modelling module 2634 and the measurement output data from the on-chip wear-out sensors 2604. The output from the first comparator 2620 can be sent to a signal processor 2628 configured to determine the health of the component, the device or the system being monitored based at least in part on the output from the first comparator 2620.

The system 260 may additionally include a second comparator 2624 configured to compare the pre-determined mission profile 2602 and the "smart" mission profile 2616. The output from the second comparator can also be sent to the signal processor 2628. The processor 2628 is further configured to, based on a deviation or a difference between the pre-determined mission profile and the "smart" mission profile, determine whether a system fault exists.

The monitoring system 260 can be used to monitor the mission profile of the component, the device or the system throughout its lifetime using the one or more wear-out sensors 2604. In some other embodiments, the monitoring system 260 can additionally employ an electrostatic discharge (ESD)/electrical overstress (EOS) monitor 2632. An output from the ESD/EOS monitor 2632, which can signify a triggered event, can be utilized in conjunction with the output data from the one or more wear-out sensors 2604. When an ESD/EOS event occurs, the output from the wear-out sensors 2604 before and after the ESD/EOS event can be compared. Any significant change in output characteristics may indicate damage internal to the IC that is induced by the ESD/EOS event. Such information can also be stored in the first storage/memory component 2612, e.g., non-volatile memory or a volatile memory, and cumulated over time to make up the "smart" mission profile 2616.

In some embodiments, the system 260 additionally includes a device-level reliability (DLR) modelling module, according to embodiments. The DLR modelling module 2636 includes therein various modeling modules 2640 associated with various wear-out mechanisms, including, e.g., hot carrier injection (HCI) modelling module, time-dependent-dielectric-breakdown (TDDB) modelling module, electromigration (EM) modelling module, bias temperature instability (BTI) modelling module and magnetoresistance (MR) modelling module. The modeling modules 2640 can also include one or more internet-of-things (TOT) sensor modelling modules including one or more of energy harvesting modelling module, gas-sensing modelling module, humidity sensing modelling module, resonator modelling module and biometric sensing modelling module, to name a few. Using these models and data from the "smart" mission profile, potential wear-out issues can be detected and used to alert the user of latent system failure. The data can also be used as part of a feedback loop 2644 to adjust the performance of the component, the device or the system and/or to initiate a redundancy protocol 2648. The system 260 additionally can include a communication module 2652, which include wired or wireless means for alerting the user of potential or latent component, device or system failure. In some implementations, the data generated and transmitted by the communication module 2652 can be encrypted for protection.

Applications of mission profile monitoring include, e.g.:

Functional Safety Standard (FuSa ISO26262) applications;

Internet-of-Things (TOT) wear-out sensors;

Warranty Returns/Mis-use: The mission profile monitoring system can be utilized to highlight component, device, or system mis-use. For example, while the on-chip wear-out sensor can monitor junction temperature it may be desirable to also monitor the ambient temperature, which can help distinguish between an IC fault, a product specific fault and a system fault. The information stored on chip can be useful for failure analysis and in particular warranty failures. The system can be utilized in conjunction with an EOS/ESD monitor to aid fault analysis.

IC/System Redundancy Protocol: For safety critical applications, redundancy is often desirable. The mission profile monitoring system can be used to trigger the redundancy protocol prior to IC/product failure hence preventing potential system damage via thermal runaway and other effects.

Temperature Mapping: Some wear-out sensors capable of monitoring temperature can be used in conjunction with the mission profile monitoring system to map temperature gradients of systems. On screen temperature maps can be displayed along with system alerts to highlight wear-out and latent system failure.

Humidity Mapping: Some wear-out sensors capable of monitoring humidity can be used in conjunction with the mission profile monitoring system to map humidity gradients of systems. On screen humidity maps can be displayed along with system alerts to highlight wear-out and latent system failure.

Vibration Mapping: Some wear-out sensors capable of monitoring vibration can be used in conjunction with the mission profile monitoring system to map vibration gradients of systems. On screen vibration maps can be displayed along with system alerts to highlight wear-out and latent system failure.

Operating Voltage Guard Banding

Figure 27:
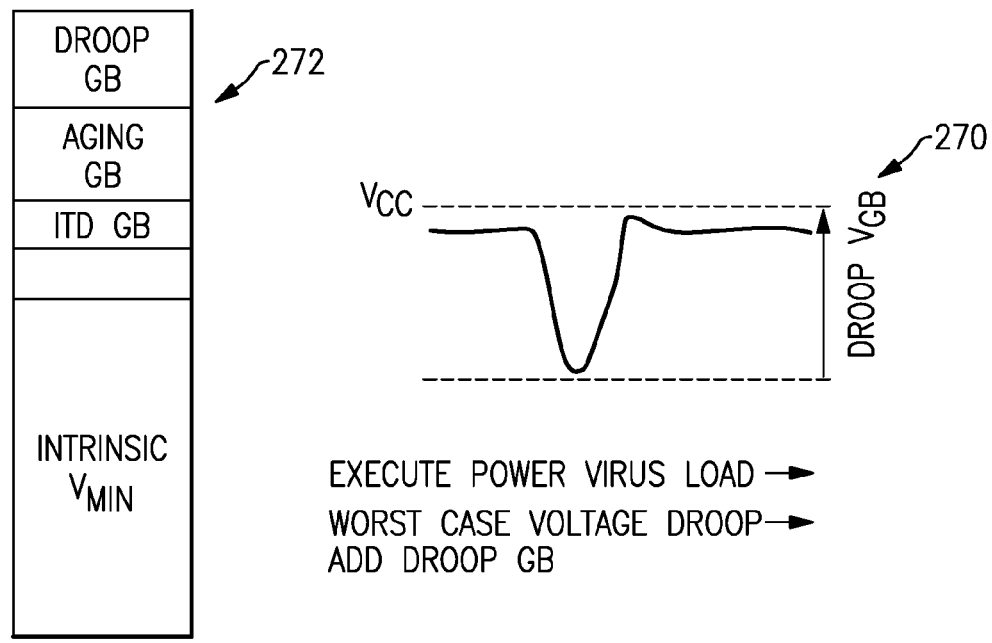
FIGS. 27-28 illustrate supply voltage guard-banding in IC devices for application of wear-out monitor devices, according to embodiments.
Figure 28:
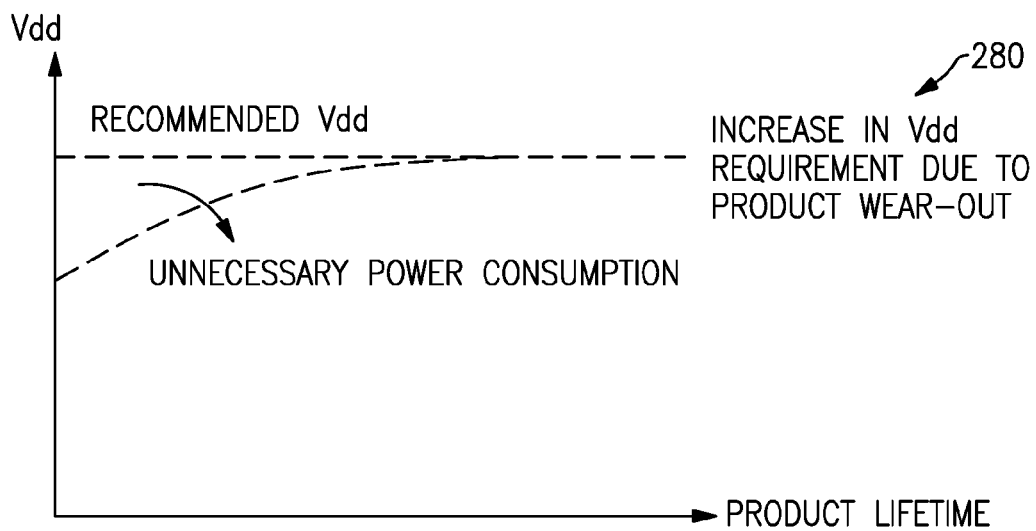

FIGS. 27-28 illustrate a method of supply voltage guard-banding in IC devices using wear-out monitor devices, according to embodiments. While not shown, the sensing circuit 25a/25b described above with respect to FIGS. 2A/2B can be configured to implement the method described with respect to FIGS. 27-28.

Generally, the operating voltage of an IC device can be determined during manufacturing test and characterization processes based on the IC's intended operating environment. Referring to FIG. 27, at the test and characterization steps, various extra margins can be added to the intrinsic minimum voltage, to arrive at an overall voltage guard banding budget 272. For example, a voltage droop guard band can be added to the guard banding budget 272 in an attempt to guarantee proper operation even during worst-case voltage droop events, as illustrated in the schematic time evolution curve 270 of the guard-banded operating voltage of the IC device. Additional guard bands can be added, e.g., aging guard band.

Referring to FIG. 28, under typical conditions, the voltage droop experienced by an IC device can be much smaller than under worst-case conditions depicted in the time evolution curve 270, and the IC can operate correctly with a much smaller guard band. However, because the actual wear-out state of the IC device that may be causing the voltage droop is unknown, the IC devices are often operated under such worst-case conditions. For example, referring to graph 280 of FIG. 28, the IC device may be operated under a "recommended Vdd" which may represent the Vdd level which takes into account of the worst-case conditions. However, using an unnecessarily large voltage guard band can waste energy. By using various wear-out monitor devices, e.g., in conjunction with the lifetime indicator system 250 (FIG. 25) or mission profile monitoring system 260 (FIG. 26), the amount of guard banding can be minimized, thereby saving energy consumed by the IC device. That is, by tracking the actual wear-out state of the IC, the difference between the recommended Vdd and the actual Vdd can be minimized, thereby saving valuable energy.

Thus, in various embodiments, a method of voltage guard banding includes periodically determining the wear-out state of the IC using a wear-out monitor according to various embodiments described herein, and determining therefrom an instantaneous expected voltage droop that corresponds to the wear-out state. Once the expected instantaneous voltage droop that corresponds to the wear-out state is determined, the recommended Vdd curve can be updated. By increasing the periodicity of such determination, the amount of wasted energy can be minimized.

Self-Powering Wear-Out Monitors

Figure 29:
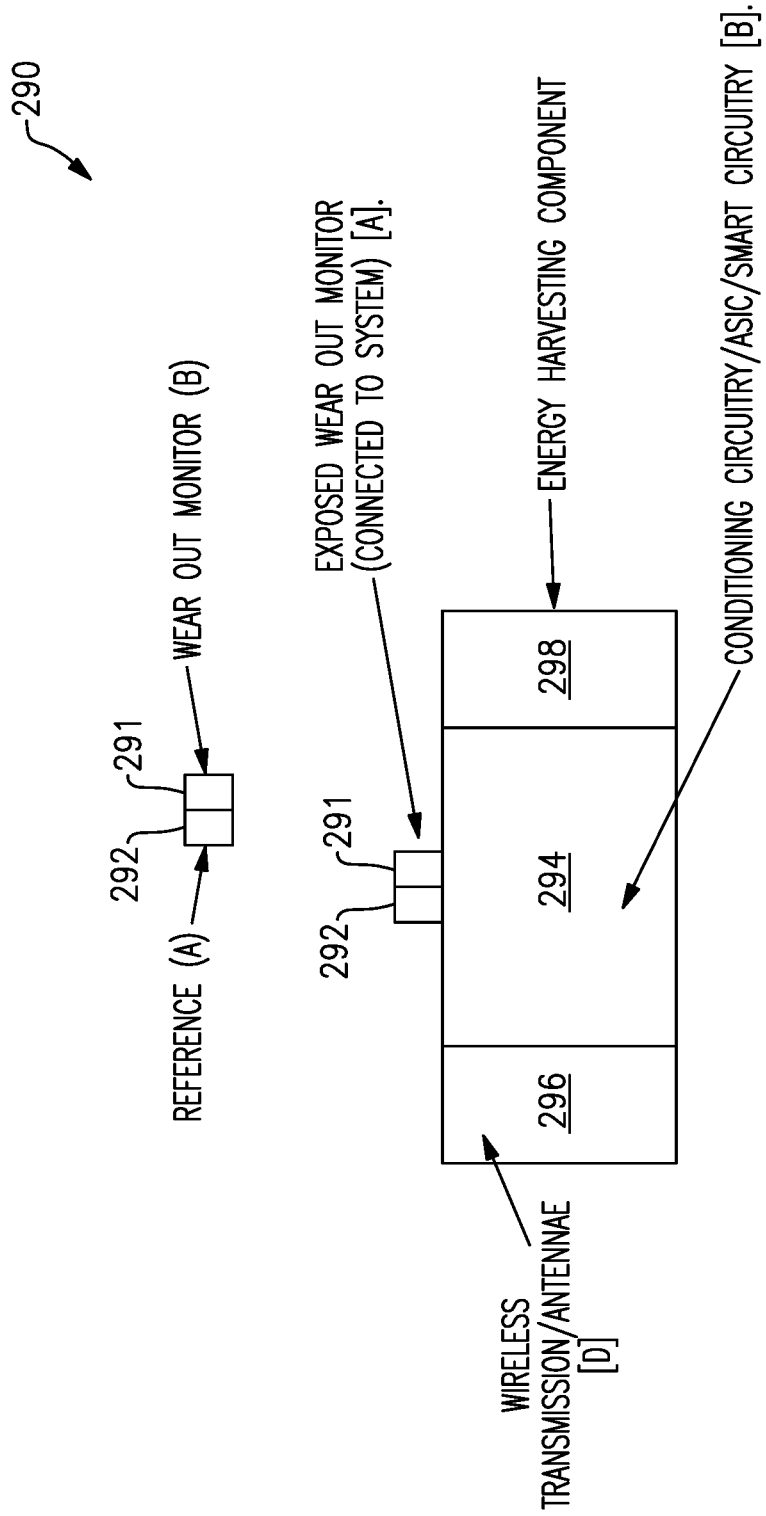
FIG. 29 illustrates an IC apparatus comprising a wear-out monitor device and configured to wirelessly transmit the monitored data while using minimum or no energy, according to embodiments.

FIG. 29 illustrates an IC apparatus 290 comprising a wear-out monitor 291 and configured to wirelessly transmit the monitored data while using minimum or no energy supplied by a power source, or using energy scavenged from the environment in the form of, e.g., solar energy, according to embodiments.

The IC apparatus 290 comprises a wear-out monitor 291, which can be one of wear-out monitor devices described supra, a sensing circuit 294 for sensing the wear-out signal from the wear-out monitor device 291, a wireless communications module 296 for wirelessly communicating the wear-out signal and an energy harvesting component 298 for powering the sensing circuit 295 and the wireless communications module 296. The IC apparatus 290 may also include a reference device 292, which can be configured as one of reference devices described supra. As described supra, the wear-out monitor device 291 and the reference device 292 rely on atomic diffusion and do not include a separate power supply to monitor wear-out stresses that cause the atomic diffusion. However, the sensing circuitry 294 and the wireless communication module 296 can still include a separate power supply. However, for usage in remote, harsh or otherwise difficult-to-access locations, e.g., top of a skyscraper, a bridge or remote base stations, extended monitoring using battery power may not be desirable or practical. Advantageously, the IC apparatus 290 includes the energy harvesting component 298. Energy harvesting can involve converting a non-electrical form of energy into charge. The energy harvesting component 298 can be any suitable device configured to harvest energy from the environment, e.g., a photovoltaic device, a thermoelectric device or a piezoelectric device. The energy harvesting component 298 is configured to partially or fully supply the power to the sensing circuit 294 and the wireless communication module 296 of the IC apparatus 290, such that the IC apparatus 290 can be used for an extended period of time in remote, harsh or otherwise difficult-to-access locations, while receiving the monitor information at the cost of little or no separate power supply. Furthermore, it will be appreciated that the IC apparatus 290, by being remotely located from processing circuitry (not shown for clarity) while being communicatively coupled thereto using the wireless communication module 296, the monitor device can be operated in an environment that is much more harsher than the environment in which the processing circuitry is operated, such as, e.g., a processing environment of a remote server.

Oxidation/Corrosion Wear-Out Monitors

In addition to detecting changes in the rate of atomic diffusion, chemical reactions, e.g., oxidation and/or corrosion reactions, can be used to gauge the wear-out level of some IC devices. Various reactions between the environmental atoms and the monitor impurity atoms, which can include corrosion and/or oxidation, can provide a history of the wear-out stresses associated with the environmental atoms. According to various embodiments, substances/materials that chemically react, e.g., corrode and/or oxidize, can additionally be included in monitor devices that include monitor impurity atoms, e.g., Au or other materials that diffuses at a defined/predictable rate. In some implementations, the rate of reaction of oxidizing/corroding materials can be directly correlated to a measurable electrical quantity. In some other implementations, the oxidizing/corroding materials can produce a discernible effect on the rate of diffusion of monitor impurity atoms, e.g., Au atoms, and thereby be indirectly correlated to a measurable electrical quantity. A system can thus be constructed that could provide an indication of a level of corrosion or oxidation, which could be used independently or in combination with other wear-out mechanisms and conditions described in other embodiments disclosed herein. Similar to diffusion, the wear-out stresses associated with oxidation and/or corrosion can also be thermally activated, such that the concepts described above with respect to diffusion can be applicable in monitor devices described herein with respect to FIGS. 30A-30D.

FIGS. 30A-30D illustrate various embodiments of monitor devices 300a-300d having structures that oxidize/corrode under various usage environments, where changes in the rate of oxidation/corrosion can be used to determine the state of wear-out of the core circuitry. The structures that oxidize/corrode can be used by themselves, i.e., without structures that have monitor atoms configured to diffuse, or in conjunction with structures having monitor atoms configured to diffuse. When structures that oxidize/corrode are used in conjunction with structures having monitor atoms that diffuse, the presence of structures that oxidize/corrode can affect the rate of diffusion of the monitor atoms, and the presence of structures having monitor atoms can affect the rate of oxidation/corrosion. Such monitor devices can be configured to detect wear-out stresses associated with certain environmental atoms, including various gases or liquids, e.g., oxygen, moisture, water, $CO_2$, etc.

Referring to FIGS. 30A-30D, each of the wear-out monitor devices 300a-300d includes a substrate 302, which can include measurement structures described supra, e.g., PN junctions or impedance measurement structures, a diffusion barrier 304 formed thereon to limit or inhibit the diffusion, oxidation, or corrosion of the underlying substrate 302.

Figure 30A:
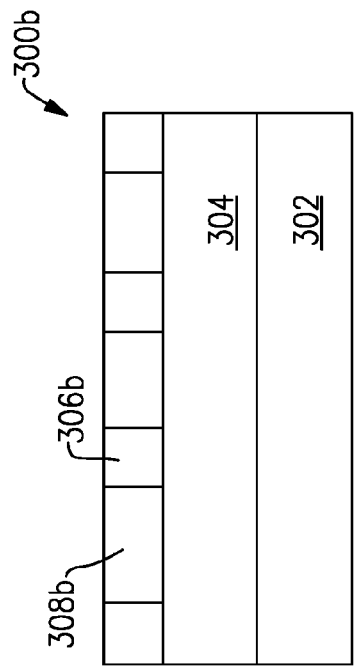
FIGS. 30A-30D illustrate various embodiments of wear-out monitor devices having structures configured to oxidize or corrode for determining cumulative wear-out stresses, according to embodiments.

Referring to FIG. 30A, the wear-out device 300a includes a plurality of layers 306a of monitor atoms configured to diffuse into the underlying layers and a plurality of oxidizing layers 308a that are adapted to oxidize at a predetermined rate for known oxidizing environments. The oxidizing layers 308a can include a metal or a semiconductor material that have known oxidation rates. The layers 306a of monitor atoms and the oxidizing layers 308a laterally alternate in the illustrated embodiment.

Figure 30B:
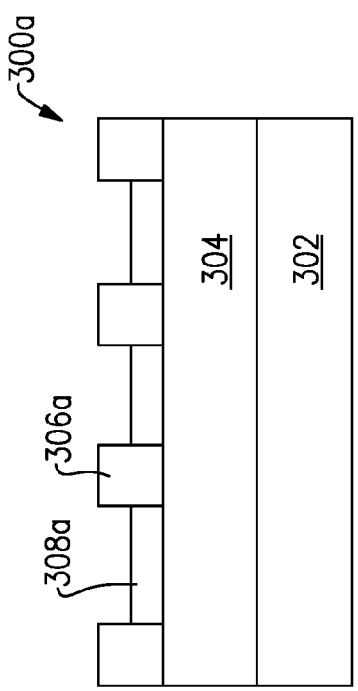

Referring to FIG. 30B, the wear-out device 300b is similarly arranged as the wear-out device 300a of FIG. 30A, except, instead oxidizing layers of the monitor device 300a, the wear-out device 300b includes a plurality of layers 308b that are adapted to corrode at a predetermined rate for known corroding environments. The corroding layers 308b of can include a metal or a semiconductor material that have known corrosion rates. The layers 306b of monitor atoms and the corroding layers 308a laterally alternate in the illustrated embodiment.

Figure 30C:
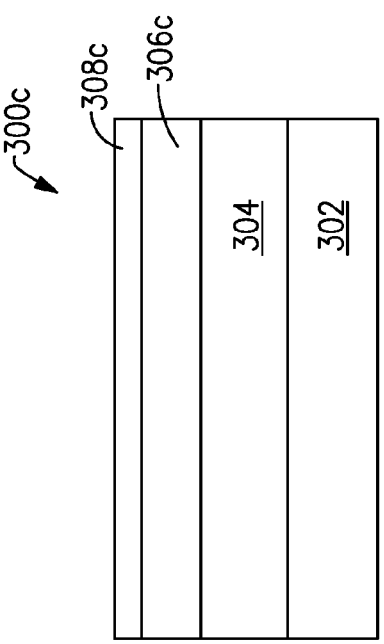

Referring to FIG. 30C, the wear-out device 300c is similarly arranged as the wear-out monitor devices 300a/300b of FIG. 3A/FIG. 30B, except, the wear-out device 300c of FIG. 30C has a stacked configuration in which the oxidizing layer/corroding layer 308 is formed on top of the layer 306c of monitor atoms.

Figure 30D:
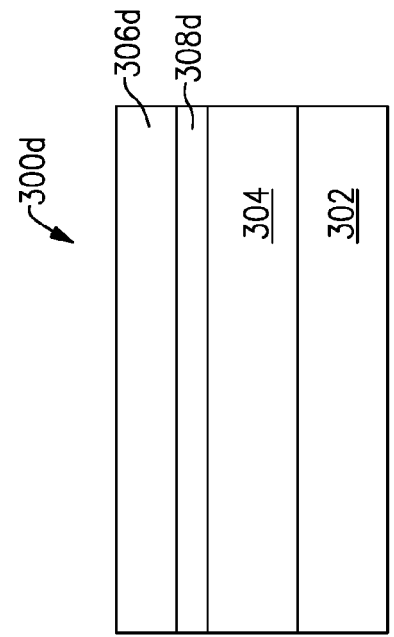

Referring to FIG. 30D, the wear-out device 30d is similarly arranged as the wear-out devices 300c of FIG. 30C, except, instead of a stacked configuration in which the oxidizing layer 308c is formed on top of the layer 306c of monitor atoms, the wear-out device 300d of FIG. 30D the oxidizing layer/corroding layer 308d formed below the layer 306d of monitor atoms.

Wear-Out Monitor Arrays

Figure 31:
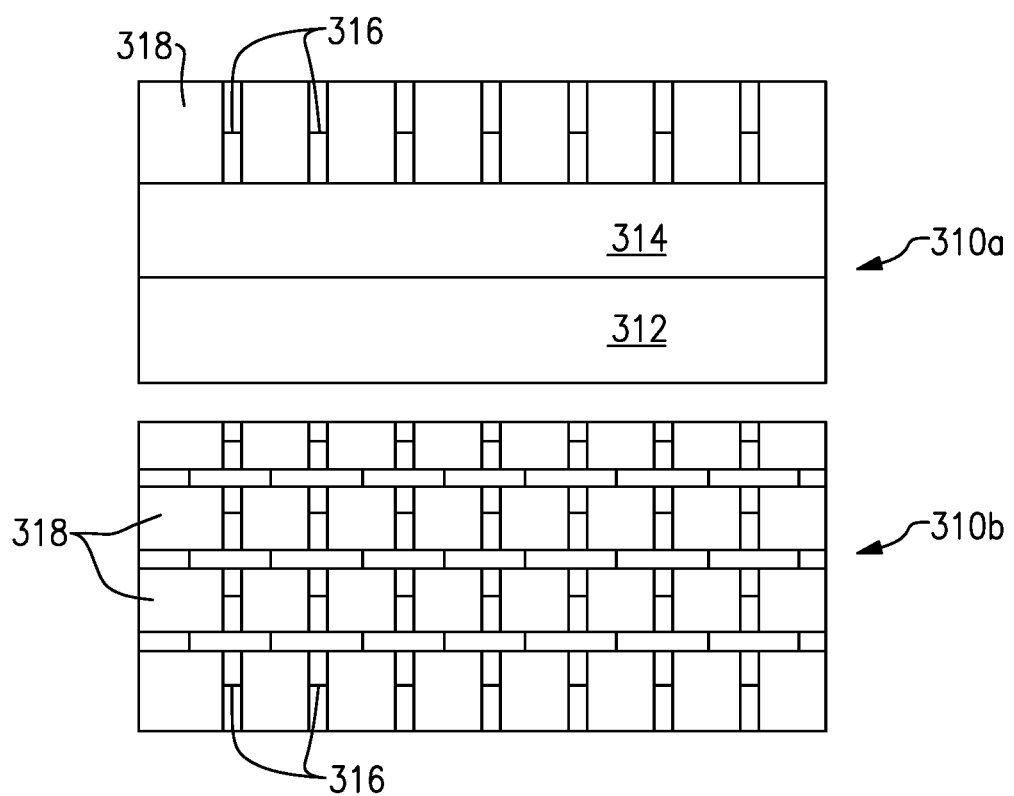
FIG. 31 illustrates a plurality of wear-out monitor devices that are laterally arranged as an array of wear-out monitor devices, according to embodiments.

FIG. 31 illustrates a plurality of wear-out monitor devices that are laterally arranged as an array 310a (cross-sectional view)/310b (plan view) of wear-out monitor devices 318, according to embodiments. The array 310a/310b can be implemented as part of a system, such a system in a chip (SoC) or a system in a package (SIP). The array 310a/310b comprises the plurality of monitor devices 318 formed over a substrate 312 and can include a diffusion barrier 314. The monitor devices 318 may be the same type or different types, depending on the application. For example, for some applications, some of the monitor devices 318 may be configured to monitor thermal stresses, while other monitor devices 318 may be configured to monitor voltage or current stress. When the monitor devices 318 are of the same type, they may be configured to monitor stresses over the same or different stress ranges. For example, some of the monitor devices 318 may be configured to monitor wear-out under a first temperature range, while others of the monitor devices 318 may be configured to monitor wear-out under a second temperature range. In some implementations, the monitor devices 318 may interconnected and communicatively coupled by electrical links or connections 316 that may allow for sensing a plurality of monitor devices 318 in series or in parallel. In some implementations, the electrical links 316 may be fuse link or antifuse links that can be modified after fabrication to form a particular pattern of active monitor devices 318 to target specific regions of the core IC device and/or particular ranges of stresses (e.g., temperature range).

Figure 32A:
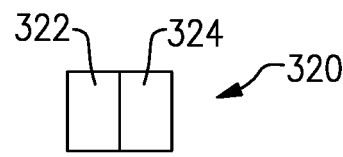
FIGS. 32A and 32B illustrate a plurality monitor devices paired with reference devices and laterally arranged as an array, according to embodiments.
Figure 32B:
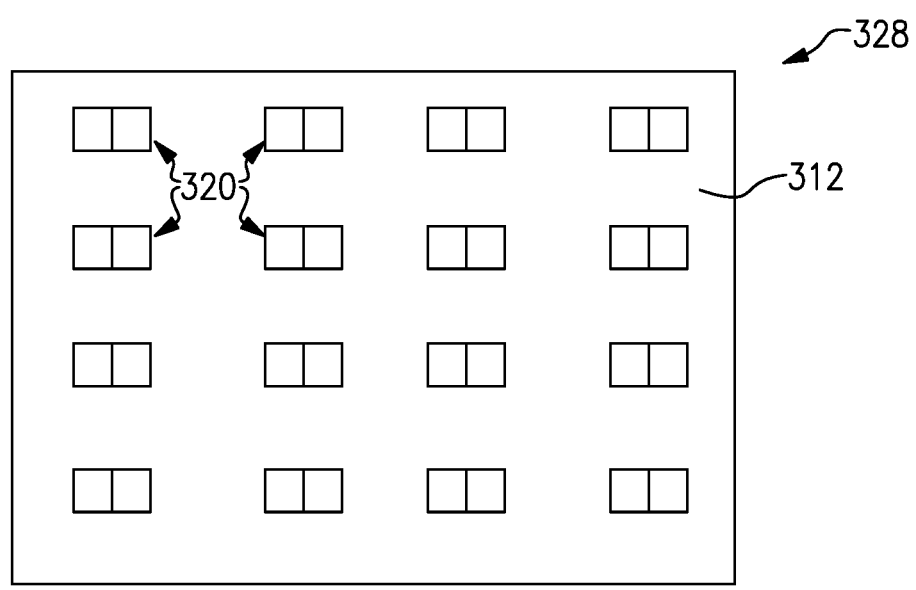

FIGS. 32A and 32B illustrate a plurality monitor device/reference device pairs 320 (FIG. 32A) that are laterally arranged as an array 328 (FIG. 32B), according to embodiments. The array 328 may be configured similarly to the array 310a/310b of FIG. 31, and the description of similar aspects will be omitted. However, unlike the array 310a/310b of FIG. 31, each monitor device 322 of the array 328 is paired with a reference device 324, whose arrangements and advantages for reasons described supra.

Figure 33A:
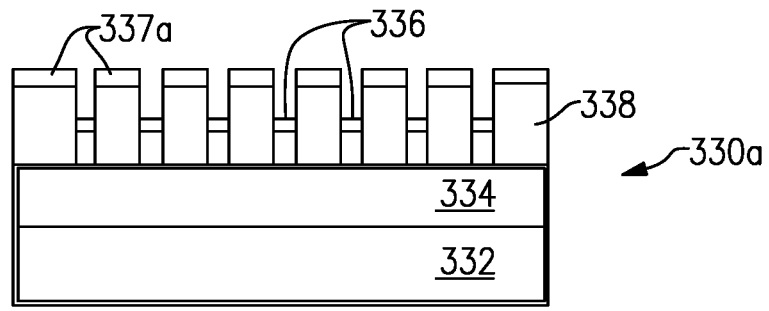
FIGS. 33A-33C illustrate a plurality of monitor devices that are laterally arranged as an array, according to embodiments.
Figure 33B:
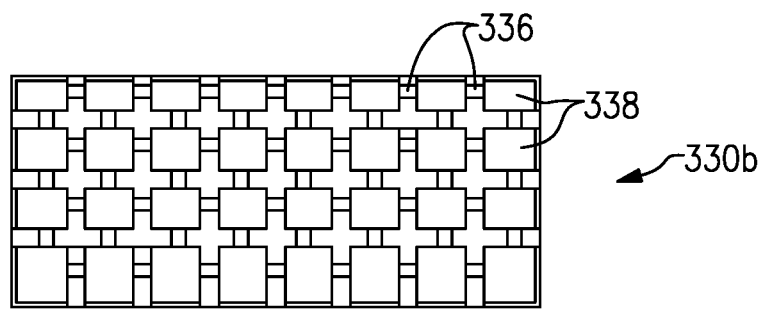

FIGS. 33A-33B illustrate a plurality of monitor devices that are laterally arranged as an array 330a (cross-sectional view)/330b (plan view) of monitor devices 338 formed over a substrate 332 and a diffusion barrier 334, according to embodiments. Similar to the array of wear-out monitor device described above with respect to FIG. 31, the array 330a/330b includes monitor devices 338 that are interconnected and communicatively coupled by electrical links or connections 336. The electrical links or connections 336 are configured to be intentionally exposed to conditions that may result in their corrosion and/or oxidation, and are formed of materials that can corrode/oxidize under such conditions. As a result, a system is created in which a discernible electrical change develops over time based on the corrosion/oxidation (and potentially the consumption of the links or connections 336 themselves). The array 330a/330b of FIGS. 33A-33B may be configured similarly to the array 310a/310b of FIG. 31, and the description of similar aspects will be omitted. Unlike the array 310a/310b of FIG. 31, however, at least some of the monitor devices 338 have formed thereon a passivation layer 337a, which can be a polymeric passivation layer or a dielectric passivation layer.

Figure 33C:
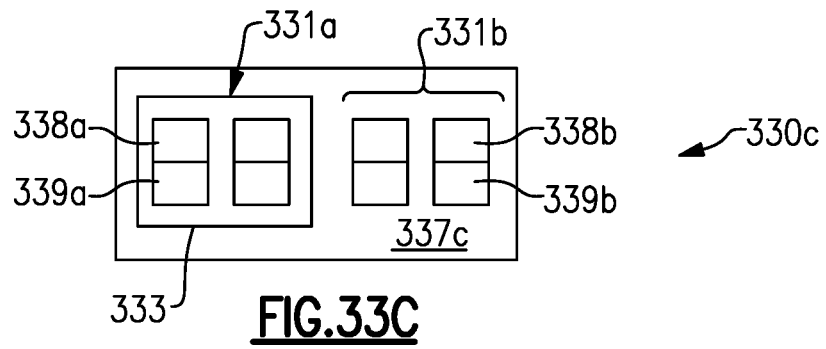

FIG. 33C illustrates another embodiment of an array 330c of monitor devices 338a in which, unlike the passivation layer 337a of FIG. 33A, the passivation layer 337c forms a blanket layer over a plurality of monitor devices 338a, except where openings 333 are formed through the blanket passivation layer 337c. In the illustrated embodiment, an array of monitor device/reference device pairs 331a/133b, which includes monitor devices 338a/338b and reference devices 339a/339b, similar to the monitor device/reference device pairs 320 of FIG. 32A, is illustrated. In the plan view of a portion of an array 330c, exposed pairs 331a are directly exposed to the environment, while unexposed pairs 331b remain covered by the passivation layer 337c. The illustrated array 330c may be particularly beneficial in monitoring environments where at least some of the monitor devices 338a and reference devices 339a are exposed to oxidizing or corroding environments as described supra, while others of the monitor devices 338b and reference devices 339b and of electrical links 336 are prevented from being exposed to oxidizing and/or corroding environments to preserve the integrity of the electrical interconnections between the monitor devices 338a/338b and the reference devices 339a/339b.

System in a Package Wear-Out Monitor

Figure 34:
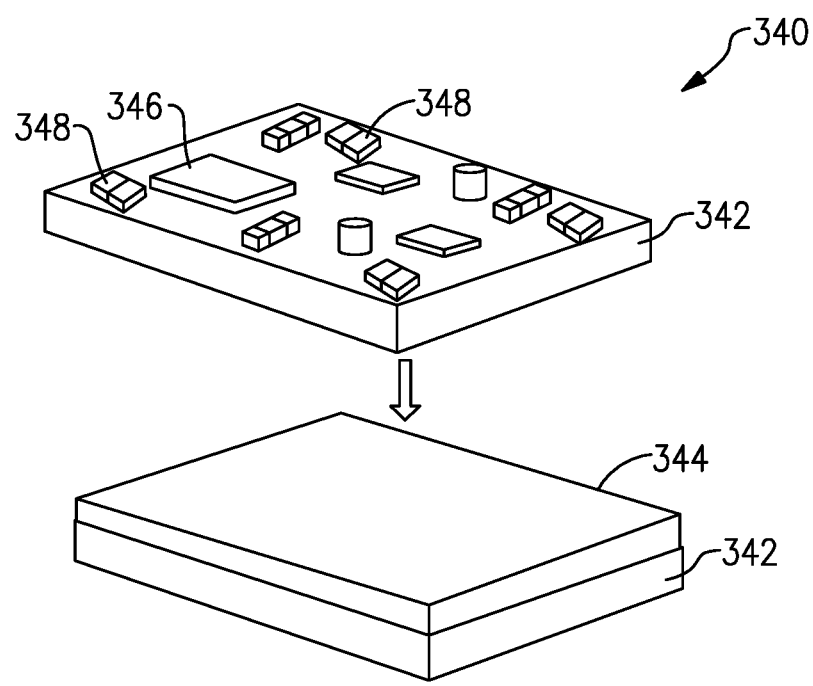
FIG. 34 is a diagram of a system in a package (SIP) or a system having embedded components that includes one or more wear-out monitor devices, according to embodiments

FIG. 34 is a diagram of a system in a package (SIP), or a system with embedded components embedded, e.g., systems with components embedded within a substrate(s). 340 that includes one or more wear-out monitor devices 348, according to embodiments. In the illustrated embodiment, the substrate 342 has formed thereon the wear-out monitor devices 348 in close proximity to core circuit devices 346 to be monitored, thereby providing a relatively accurate indications of the level of wear of the core circuit devices 346. For example, the wear-out monitor devices 348 can be disposed immediately adjacent to the core circuit devices 346. The die 342 and the other components can be encased within a single package to form the system 340. The monitor devices 348 can be disposed at a suitably specific location that may be a particular area of concern, e.g., suitably adjacent a high power device or a sensitive/critical processing device. The SIP 340 can include an over mold compound 344 that encapsulates the die 342 and other components. The SIP 340 can be configured such that signals can be communicated externally to and from the SIP 340 by the die 342 and/or the other components, for example, wirelessly or by being provided to an output contact of the SIP 340.

Electrical Overstress (EOS) and Electrostatic Discharge (ESD) Wear-Out Monitors

Transient electrical events such as electrostatic discharge (ESD), electrical overstress (EOS) or electromagnetic compatibility (EMC) transients can cause wear-out of IC devices. As described herein transient electrical events are electrical events having a time duration less than DC regime. Without being bound to any theory, it has been predicted that there are three regimes of device failure due to transient electrical events. In the adiabatic regime, the duration of transient electrical events is of the order of <100 ns. Due to such short duration, there is little heat transfer and the time-to-fail roughly shows a 1/t correlation. In the thermal diffusion regime, the duration of transient electrical events is of the order of about 100 ns to about 10 ms. In this regime, heat transfer duration is of the order of heat transfer time and the time-to-fail roughly shows a $1/t^{1/2}$ correlation. In the DC/steady state regime, the duration of electrical events is greater than about 0.1/10 ms. In this regime, the device is in thermal equilibrium and the time-to-fail roughly shows no correlation with time. These regimes have been described in what is known as Wunch-Bell curve.

Various protection devices for protection against various transient electrical events can be incorporated into apparatuses as off-chip modules or be integrated on-chip, e.g., as part of a multi-die package with built-in protection. Various protection devices include a combination of PN diodes, BJTs and field-effect transistors. Using various configurations of wear-out monitor devices described above with respect to these and other devices, some protection devices can be used to monitor wear-out caused by transient electrical events. According to various embodiments herein, a wear-out monitor device can detect non catastrophic electrical overstress (EOS) events. Such functionality can monitor an IC with slightly lower breakdown than other circuits and provide wear-out information about the IC device.

FIGS. 35A and 35B illustrate schematic diagrams of ESD detection circuits 350a and 350b, respectively, according to embodiments. Each of the ESD detection circuits 350a and 350b includes a first ESD protection device 352 and a second ESD protection device 354.

The first ESD protection device 352 can include, e.g., a diode having a relatively low breakdown voltage and a relatively small physical area and the second ESD protection device 352 include, e.g., a diode having a relatively high breakdown voltage and a relatively large physical area. These ESD protection devices can include diodes, bipolar junction transistors and semiconductor-controlled rectifiers (SCRs). The first ESD protection device 352 can trigger at a lower voltage than the second ESD protection device 354. In an illustrative example, the first protection device 352 can trigger at, e.g., about 6.5 Volts and the second ESD protection device 354 can trigger at, e.g., about 7 Volts. The second ESD protection device 354 can handle more current than the first ESD protection device 352. In the illustrated embodiment of FIG. 35A, a resistor 355 (FIG. 35A) or a fuse 367 (FIG. 35B) is in series with the first ESD protection device 352, for example, to prevent thermal runaway and/or to provide a voltage for the detection circuit 356.

With the first ESD protection device 352, ESD events below the threshold for triggering the second ESD protection device 354 can be detected and associated data can be used to determine the wear-out of a component, device or a system. The ESD protection offered by the first ESD protection device 354 may not be sufficient to protect an internal circuit, but the ESD protection offered by the first ESD protection device 352 can provide a way to monitor what is happening in the second ESD protection device 354 without including a resistance, which should diminish the effectiveness of the second ESD protection device 3544, in series with the second ESD protection device 354.

The ESD detection circuits 350a and 350b can detect an ESD event using the voltage across the resistor 355 (FIG. 35A). Alternatively, the detection circuit 350b can blow the fuse 357 when an ESD event is detected. After a certain number of ESD events (e.g., 10 events) are detected, an alarm signal can be provided. For instance, the alarm signal can be toggled when all fuses can be blown and/or memory cells can overflow. The alarm signal can provide an alert to warn that a device has been aged by ESD events.

EOS detection circuitry can provide functional safety information at the die level and/or at a system level. At the die level, recording and monitoring EOS events can provide an indication of the functional safety of the die. Such information can be reported external to the die. An alarm signal can be provided external to the die to provide a warning about the functional safety of the die and/or to suggest that action be taken, such as replacement of the die. At the system level, detecting EOS events can provide information about functional safety at a system level. Such information can be used for predictive maintenance, for example.

Certain physical layouts of ESD protection devices can be implemented for high performance. The physical layouts discussed below can be implemented in connection with any of the EOS protection devices discussed herein. Example physical layouts are illustrated in FIGS. 36A to 36C.

Figure 37A:
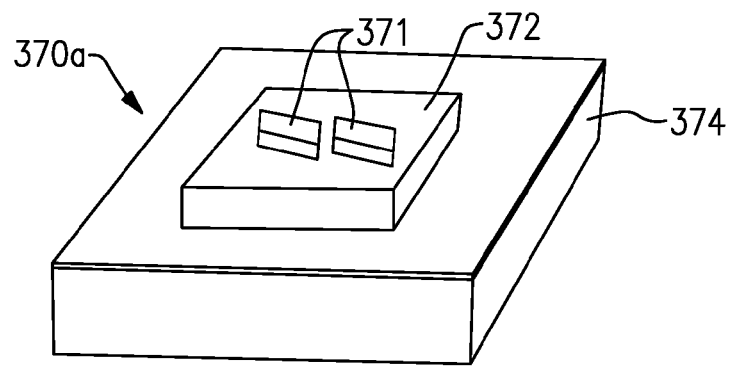
FIG. 37A-37C schematically illustrate vertically integrated systems that include one or more wear-out or corrosion monitor devices integrated with ESD protection and/or energy harvesting circuitry on a single chip, according to embodiments.

FIG. 36A provides an example of a physical layout of an ESD protection device 360. In FIG. 37A, the ESD protection device is an annular structure in plan view. This can enable relatively high current handling capability. Anode 362 and cathode 364 of the ESD protection device 360 can be provided around a bond pad 366. The weakest point of an ESD protection device can be at the end of a finger, even with increased spacings, resistances and/or curvature, as this is the location of that typically has the highest electric field. An annular ESD silicon controlled rectifier (SCR) can be used for system level ESD protection to mimic a circular device enclosing a bond pad. Such a SCR can include any combination of features described in U.S. Pat. No. 6,236,087, the entire technical disclosure of which is hereby incorporated by reference herein.

An annularly shaped ESD protection device in plan view can have a relatively large perimeter area and hence a relatively large cross sectional area through which the current can flow. As one example, the perimeter can be about 400 μm and the diode junction can be about 3 μm deep, thus the cross section area can be about 1200 μm². Additionally, with the annular structure, metal can come out from a bond pad on four sides. This can combine to substantially minimize the resistance to an ESD zap and hence the voltage experienced by sensitive circuitry internal in the chip can be substantially minimized. Another approach that may provide an even lower resistance path to an ESD zap is a pure vertical diode where the conduction is vertically down through the silicon. In such a diode, for a 100 μm by 100 μm pad, the cross section area is 10,000 μm² and the metal resistance can also be relatively small as there can be a thick low resistance metal paddle on one side and a low resistance bond wire in close proximity on the other side.

In some instances, an ideal ESD device can be circular, as substantially the same electric field can be present along the entire a junction in such a structure. Circular ESD device layouts may not be area efficient and/or an inner anode can be smaller in junction area than an outer cathode. Circular ESD device layouts can conduct larger currents than some other common ESD layouts that consume approximately the same area. Circular ESD device layouts can conduct relatively large currents, such as currents associated with EOS events. Accordingly, such ESD device layouts can be desirable in certain applications in which an ESD device is used to harvest energy associated with an EOS event.

FIG. 36B provides an example of a physical layout of an ESD device 361. The physical layout of the ESD device 361 is a relatively large circular shape in plan view. This can reduce the difference between junction area between the anode 362 and the cathode 364.

FIG. 36C provides an example of a physical layout of an ESD device 368. The ESD device 368 is implemented by a relatively dense array of smaller circular ESD devices 369. The smaller circular ESD devices 369 can be butted against each other laterally and/or vertically. An array of smaller circular ESD devices 369 can be implemented in wearable computing devices such as smart watches, for example.

FIG. 37A is a schematic diagram of a vertically integrated system 370a that includes one or more wear-out or corrosion monitor devices 371 integrated with an ESD protection and/or energy harvesting circuitry on a single chip, according to embodiments. A combined ESD protection and storage chip 372 with the one or more wear-out monitor device includes, in addition to circuitry capable of harnessing energy from ESD events and storage elements configured to store charge associated with the ESD events, circuitry for sensing the wear out level of the system or components of the system. The combined chip 372 can be stacked with an ASIC 374. Combining the ESD protection devices and storage elements in a single die can reduce height of the vertically integrated system relative to two separate die stacked in a pyramid configuration. Combining the ESD protection devices and storage elements in a single die can reduce the length and/or resistance of a path from a surge conduction point and storage elements relative to two separately stacked die. The ASIC 374 can receive charge from storage elements of the combined chip 372. Having the energy harvesting circuitry on a different chip than the ASIC can allow EOS protection devices, such as ESD protection devices, to be scaled up to store charge from larger EOS events, such as larger ESD events. It will be appreciated that the one or more wear-out or corrosion monitor devices 371 can be integrated within any SIP (System in package) or system independently to monitor or measure different stress conditions, e.g., temperature, voltage, etc., as discussed elsewhere herein.

Figure 37B:
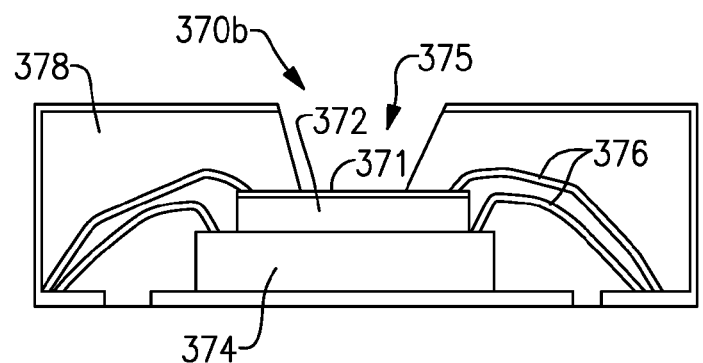

FIG. 37B is a cross-sectional view 370b of a fully packaged vertically integrated system 370a illustrated in FIG. 37A. The cross-sectional view 370a shows an opening (or an aperture, a conduit or a path) 375 formed though a packaging material (or a barrier or an encapsulant) 378 such that air or moisture can directly contact the wear-out or corrosion monitor device 371. The combined chip 371 and the ASIC main die are electrically connected to each other and externally through wire bonding 376, or some other suitable electrical connection or a conductive path.

Figure 37C:
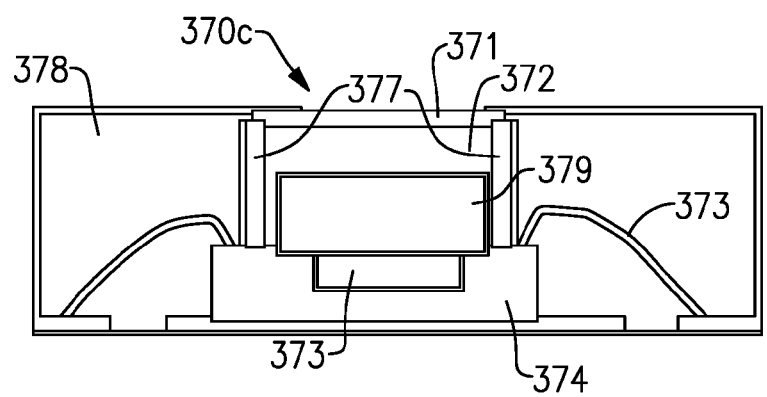

FIG. 37C is a cross-sectional view a fully packaged vertically integrated system 370c similar to that of the system 370a/b of FIGS. 37A/37B, except the system 370c additionally includes micro electro mechanical sensor (MEMS) 373 electrically connected to the sensor die. In addition, unlike the system 370a/b of FIGS. 37A/37B, the system 370c additionally includes a plurality of through-silicon vias (TSVs) 377 electrically connecting a wear-out or corrosion monitor device 371 to an ASIC 374 (or a processing die within a system) that is physically separated from the MEMS 373 and/or the ASIC 374 by a cavity 379. By separating the monitor device 371 from the MEMS 373 and/or the ASIC 374, the circuitry of the monitor device 371 could be selectively exposed, e.g., through openings formed at the package/module/system level. Advantageously, by doing so, the monitor device 371 can be kept separated from the ASIC 374, and can be configured to be exposed to higher temperatures and/or harsher environments. In the illustrated embodiment, the cavity 379 is formed by etching a portion of the substrate of the monitor device 371 such that the cavity overlaps with the MEMS 373. However, embodiments are not so limited and other suitable processes can be used to dispose the cavity 379 between the monitor device 371.

The combined chip 372 and the ASIC main die are electrically connected to each other and externally through wiring 376. The combined chip 372 can be electrically connected by one or more through-silicon vias (TSV's) 377 as illustrated, or using wire bonding 376 as illustrated in FIG. 37B.

Diffusion-Enhancing Monitor Device Structures

For some applications, it may be desirable to monitor effects of mechanical wear-out stress on core devices. In some applications, the core device to be monitored may be a static device under stress, e.g., a transistor device under a stress from adjacent shallow trench isolation or a semiconductor device under a stress from a flexible substrate on which it is formed. In other applications, the core device to be monitored may be may be a dynamic device, e.g., a micro electro mechanical system (MEMS) device. For these applications, it can be desirable to monitor wear-out stress arising from such mechanical wear-out stress.

Under some circumstances, mechanical stress can cause changes in diffusion rate of dopant atoms. FIGS. 38A-38E illustrate various embodiments of wear-out monitor devices that are formed in or on a flexible substrate such that wear-out stresses associated with mechanical deformation can be monitored, e.g., by utilizing mechanical stress-enhanced diffusion of monitor atoms. Each of monitor devices 380*a*-380*e* has a plurality of doped regions formed in a flexible substrate 383. The plurality of doped regions may form an array. The flexible substrate 382 can be formed of a flexible material, e.g., flexible polymeric materials, or a semiconductor/dielectric substrate that has been substantially thinned, e.g. to less than about 500 μm such that the semiconductor/dielectric substrate is flexible. The substrate 382 may be doped, e.g., lightly doped, with a first dopant type, or be undoped. The monitor device is configured such that a mechanical deformation caused by, e.g., bending or deflection, results in an electrical signatures associated with the wear-out stress such as fatigue. In some embodiments, the substrate 382 may include or at least be partially formed of materials such as piezoelectric materials to convert the mechanical deformations into electrical signals.

Figure 38A:
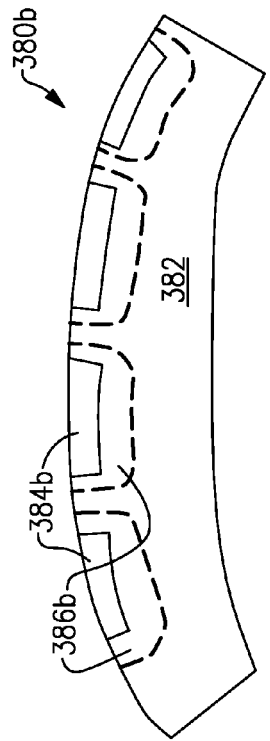
FIGS. 38A-38E illustrate various embodiments of wear-out monitor devices formed in or on a flexible substrate for monitoring wear-out stresses associated with mechanical deformation, according to embodiments.
Figure 38B:
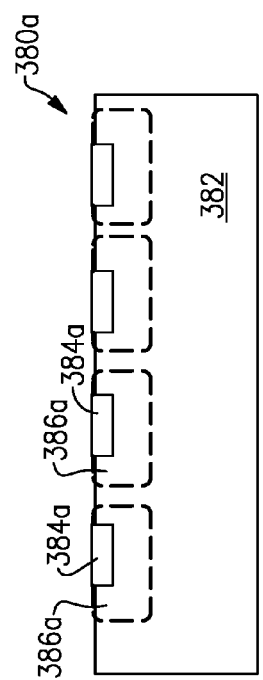

FIGS. 38A and 38B illustrate a wear-monitor device 380*a*/380*b* before (FIG. 38A) and after (FIG. 38B) the substrate 382 has undergone bending, according to embodiments. The monitor devices 380*a* and 380*b* each has a plurality of doped regions 384*a* and 384*b*, which can be doped with a second dopant type. When the substrate 382 is doped with a first dopant type, a PN junction is formed, such that depletion regions 386*a* and 386*b* are formed, which can be used for detecting diffused monitor atoms, as described with respect to various embodiments described supra. As described above, the doped regions 384*a* and 384*b* may include monitor atoms that are adapted to diffuse into the underlying substrate, e.g., into the depletion region. In some embodiments, the monitor atoms may be formed on the doped regions 384*a* and 384*b*, while in other embodiments the monitor atoms may be formed in addition to, or to at least partially replace the dopants of the doped region that is doped with the second dopant type. In operation, bending of the monitor device 380*a* into a bent monitor device 380*b* as shown in FIG. 38B results in the doped regions 384*b* being placed under either a tensile strain as shown, or under a compressive strain when bent in an opposite direction (not shown). The tensile or compressive strain may change the rate of the diffusion of monitor atoms into the underlying substrate material, whose change can be detected using the sensing circuit, as described supra.

Figure 38C:
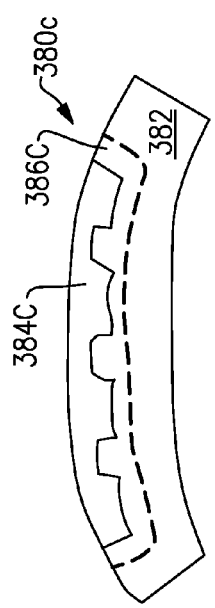

FIG. 38C illustrates another wear-monitor device 380*c* that is configured for monitoring stresses associated with mechanical deformation, according to embodiments. Similar to the wear-out device 380*a*/380*b* of FIGS. 38A/38B, the wear-out monitor device 380*c* has a plurality of doped regions 384*c* in a flexible substrate 382. However, unlike the wear-out monitor device 380*a*/380*b*, the doped regions 384*c* are merged to form a plurality of connected doped regions 384*c* and a corresponding depletion region 386*c*.

Figure 38D:
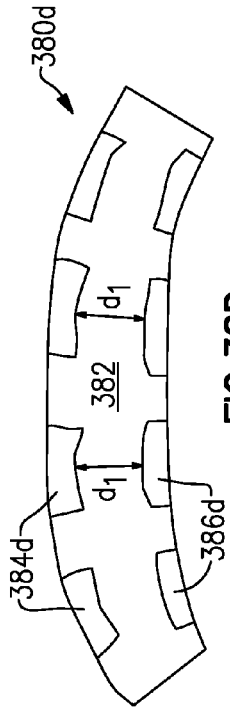
Figure 38E:
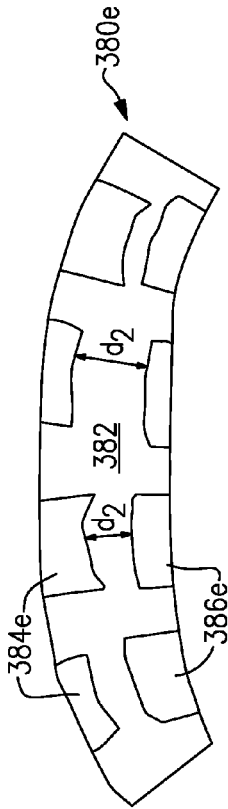

FIGS. 38D and 38E illustrates additional embodiments of wear-out monitor device 380*d* and 380*e* that are configured for monitoring stresses associated with mechanical deformations, according to embodiments. Similar to the wear-out device 380*a*/380*b* of FIGS. 38A/38B, the wear-out monitor devices 380*c* and 380*d* have a plurality of first doped regions 384*d* and 384*e*, respectively, in a flexible substrate 382. However, unlike the wear-out monitor device 380*a*/380*b*, the wear-out monitor devices 380*d* and 380*e* have a plurality of second doped regions 386*d* and 386*e* in a flexible substrate 382. The second doped regions 386*d* and 386*e* may be oppositely doped compared to the first doped regions 384*e* and 384*e* and configured as a punch-through monitor, as described supra with respect to FIGS. 11A and 11B. In some embodiments, as illustrated in FIG. 38D, laterally adjacent first doped regions 384*d* and laterally adjacent second doped regions 386*d* may have similar or varying dopant concentrations while having similar depths such that the vertical separation distances $d_1$ between corresponding first and second doped regions 384*d* and 386*e* is relatively constant. In some other embodiments, laterally adjacent first doped regions 384*e* and laterally adjacent second doped regions 386*e* may have similar or varying dopant concentrations and different depths such that the vertical separation distances $d_2$ between corresponding first and second doped regions 384*e* and 386*e* are varying, as illustrated and in the wear-out monitor device 380*e* of FIG. 380E.

For some applications, it may be desirable to monitor wear-out effects resulting from electric field enhancement of certain device structures. In some applications, the core device to be monitored may have structural features that having relatively sharp features, such that electric field is enhanced compared to adjacent regions. Furthermore, such enhancement of electric field can lead to EOS/ESD events, which can in turn produce lattice defects in semiconductor materials, through which the rate of atomic diffusion can be substantially enhanced. Thus, for various applications, it is be desirable to monitor wear-out stress arising from such field-enhancement effects.

Figure 39B:
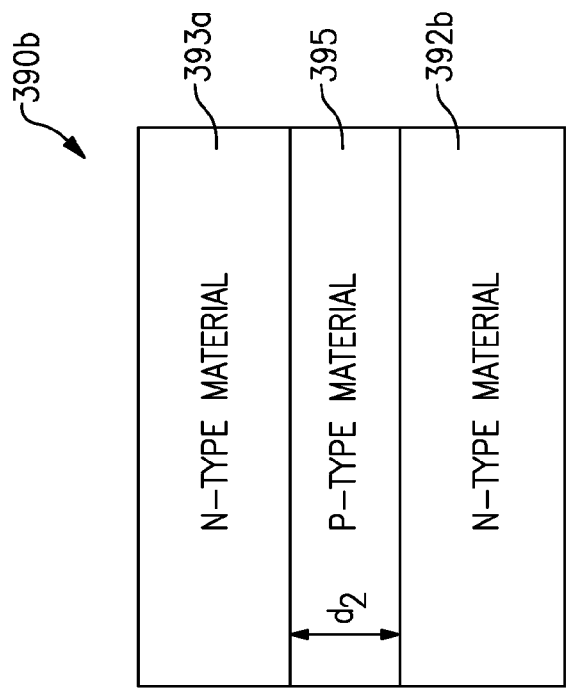
FIG. 39B illustrates a reference device for the wear-out monitor device of FIG. 39A, according to embodiments.
Figure 39A:
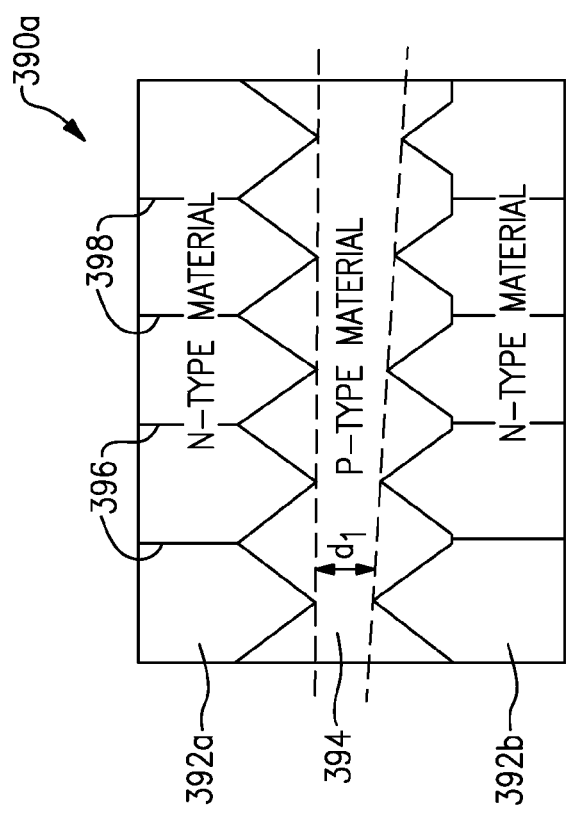
FIG. 39A illustrates a wear-out monitor device having one or more serrated structures for monitoring wear-out stresses associated with electric field enhancement, according to embodiments.

FIG. 39A illustrates a wear-out monitor device 390*a* having one or more serrated structures 392*a* that can serve as electrodes under an electric field. In some embodiments, upper and lower serrated structures 392*a* and 392*b*, respectively, are formed of a first material, which can be a semiconductor material or a conductive material. The serrated structures 392*a*/392*b* are interposed by an interposed structure 394 formed of a second material, which can be a semiconductor material or a dielectric material. In the illustrated embodiment, the first material comprises a semiconductor material doped with a first dopant type, e.g., n-type, and the second material comprises a semiconductor material dope with a second dopant type, e.g., p-type. The wear-out monitor device 390a of FIG. 39A includes monitor atoms, which can be present in either of the serrated structure 392a or the interposed structure 394, where the monitor atoms are configured to diffuse in the wear-out monitor device 390a. The serrated structures 392a/392b comprise a plurality of field-enhancement regions 396 that are configured to enhance electric field when an electric field is applied between the upper and lower serrated structures 392a/392b. In the illustrated embodiment, a gap $d_1$ and/or radii of curvature between different pairs of opposing field-enhancement regions 396 can vary, such that different pairs can be subject to a discharge event, e.g., EOS/ESD events, under different electric field values. When one or more EOS/ESD events occur between pairs of opposing field-enhancement regions 396, certain lattice defects 398, e.g., stacking faults or dislocations, can form, thereby providing an enhanced diffusion paths for monitor atoms. In operation, by applying an electric field between the upper and lower serrated structures 392a, an EOS/ESD event can be induced therebetween, leading to enhanced atomic diffusion of monitor atoms, e.g., through lattice defects 398 in the serrated structures 392a/392b. A level of wear-out of a monitored structure, e.g., in the core circuit, can be determined therefrom, as described above.

In some embodiments, a reference device 390b illustrated in FIG. 39B can be provided with the wear-out monitor device 390a of FIG. 39A. Unlike the monitor device 390a, the reference device 390b comprises upper and lower regions 393a and 393b, respectively, formed of the same material as the serrated structures 392a/392b of the monitor device 390a (FIG. 39A), and an interposed structure 395 formed of the same material as the interposed structure 394 of the monitor device 390a (FIG. 39A). In operation, by applying a similar electric field between the upper and lower structures 393a and 393b as the electric field applied between upper and lower serrated structures 392a and 392b, an EOS/ESD event can be induced between upper and lower serrated structures 392a and 392b, while a similar EOS/ESD event is not induced between upper and lower structures 393a and 393b. Therefore, the level of wear-out of a monitored structure, e.g., in the core circuit, can be determined, as described above.

Figure 40:
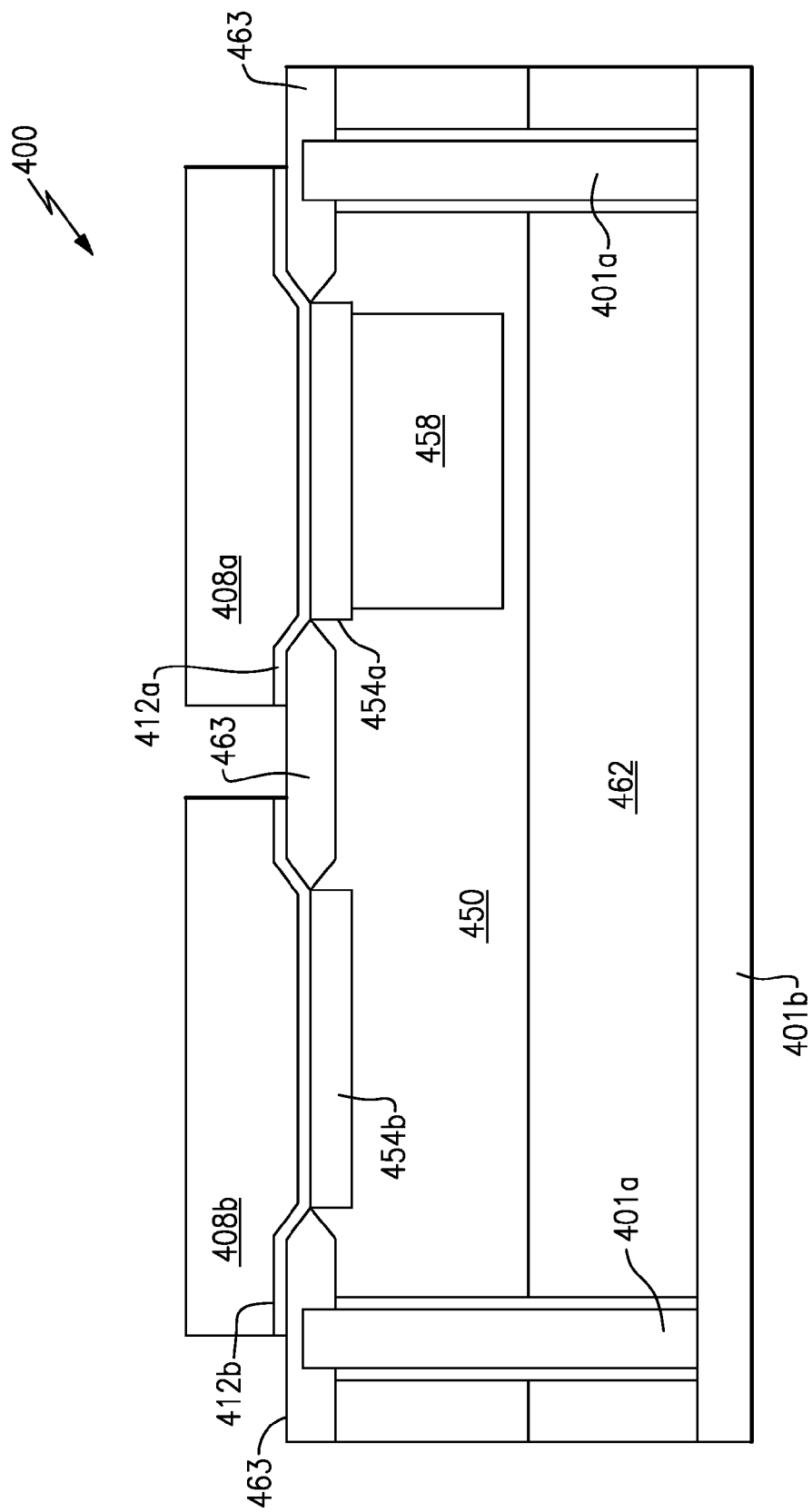
FIG. 40 is an illustration of a wear-out monitor device comprising monitor atoms configured to diffuse in a semiconductor material, according to embodiments.

FIG. 40 is an illustration of a wear-out monitor device 400 comprising monitor atoms that are configured to diffuse in a semiconductor material and configured such that a stress condition causes a change in the rate at which the monitor atoms diffuse in the semiconductor substrate 450, according to embodiments. The wear-out monitor device includes, laterally on one or both sides, isolation regions 401a, e.g., shallow trench isolation regions. The wear-out monitor device additionally includes a buried layer 401b, which may be a buried oxide layer 401b, such as a buried oxide (BOX) of a silicon-on-insulator (SOI). Thus, the device 400 may be electrically isolated from surrounding regions by the isolation regions 401a and the buried layer 401b. In some embodiments, the semiconductor substrate 450 may at least an upper portion in which various doped regions are formed, which may be an epitaxial region. The illustrated wear-out monitor device 400 additionally comprises a buried layer region 462 vertically above the buried oxide layer 401b and laterally extending between the isolation regions 401a. The wear-out monitor device 400 additionally includes a first doped region 458 formed within the semiconductor substrate 450 and may or may not be in contact with the buried layer region 462. The substrate 450, the buried layer region 462 and the first doped region may be doped with the same dopant type, according to some embodiments. For example, the substrate 450 may doped with a first dopant type, which may be an n-type dopant or a p-type dopant, at a first concentration. The first doped region 458 may be doped with the first dopant type at a higher concentration relative to the substrate 450. Similarly, the buried layer region 458 may be doped with the first dopant type at a higher concentration relative to the substrate 450. . In the illustrated embodiment, each of the substrate 450, the first doped region 458 and the buried layer region 462 are doped with an n-type dopant.

The wear-out monitor device 400 includes a first heavily doped region 454a doped with the first dopant type. In the illustrated embodiment of FIG. 40, the first doped region 454a is a heavily doped n-doped (n+) region.The wear-out monitor device 400 additionally includes a second doped region 454b that is doped with a second dopant type opposite to the first dopant type. In the illustrated embodiment, the second doped region 454b is an p-doped region, e.g. a heavily doped (p+) region.

In the illustrated embodiment, a portion of the substrate 450 forms an intervening region which laterally separates the first and second doped regions 454a and 454b such that is doped either with the first or second dopant types, at a concentration substantially lower than the first or second heavily doped regions 454a or 454b. In the illustrated embodiment, the intervening region is an n-doped region. Thus, the wear-out monitor device 400 can include first and second heavily doped regions 454a and 454b and the first doped region 458 and the substrate 450 intervening the first and second doped regions 454a and 454b such that a PN junction comprising, e.g., p+ second heavily doped region 454b/the substrate 450/the first doped region 458/n+ first heavily doped region 454a formed of P+/N−/N/N+ regions, in one example embodiment. However, it will be appreciated that various doped regions of the wear-out monitor device 400 are illustrated by way of example only, and other embodiments are possible, where each of the p+ second heavily doped region 454b, the substrate 450, the first doped region 458 and n+ first heavily doped region 454a is doped to form any one of $P^+$, P, $P^-$, $N^+$, N or $N^-$ regions, such that a PN junction is formed.

In the wear-out monitor device 400 of FIG. 40, the first and second doped regions 454a and 454a are formed by implanting respective dopants through openings formed in the dielectric layer 463; however, embodiments are not so limited. For example, other masking (e.g., photoresist) and doping (e.g., diffusion) techniques may be used in lieu or in addition to using the dielectric layer 463 as an implantation mask.

Still referring to FIG. 40, the wear-out monitor device 400 additionally includes a first electrode 408a and a second electrode 408b formed over the first heavily doped region 454a and over the second heavily doped region 454b, respectively, through openings in dielectric layer 463. One or both of the first and second electrodes 408a and 408b comprise or is formed of the monitor atoms, and serves as a reservoir of the monitor atoms, as described supra. In the illustrated embodiment, the first electrode 408a and a second electrode 408b are formed on first adhesion layer 412a and a second adhesion layer 412b, respectively. As described supra with respect to FIGS. 6A/6B, the adhesion layers 412a, 412b can enhance adhesion of the first and second electrodes 408a, 408b. One or both of the first and second electrodes 408a and 408b are configured such that, when the wear-out monitor device is subjected to a set of predetermined conditions for a predetermined duration, some of the monitor atoms in the respective electrodes diffuse thorough the respective first and second heavily doped regions 454a and 454b into a depletion formed thereunder. Depending on the concentration and/or depth of the diffused monitor atoms in the underlying semiconductor material, e.g., in the depletion region, a cumulative wear-out history, e.g., a cumulative thermal wear-out history, of the monitor device 400 can be at least indirectly determined.

Thus, as configured, the wear-out monitor device 400 has one or more reservoirs of monitor atoms (i.e., first and/or second electrodes 408a, 408b) disposed on a surface of the substrate and a monitor region (e.g., depletion region formed underneath the second heavily doped region 454b) formed in the substrate 450. The monitor atoms have diffusion characteristics in the semiconductor material of the substrate such that when the wear-out monitor device is subjected to a set of predetermined stress conditions for a predetermined duration, some of the monitor atoms diffuse into the monitor region. The reservoir can include, e.g., an electrode containing the monitor atoms or a layer formed of the monitor atoms. The monitor region can include a region in the substrate, e.g., a depletion region formed by a PN junction as described above, for example.

Various embodiments of the wear-out monitor device including the wear-out monitor device 400 of FIG. 40 are configured such that an electrical property, or an electrical signature, associated with the presence of the monitor atoms in the monitor region can be measured. The electrical signature can be, for example, any one or more of: junction leakage, junction capacitance, junction built-in potential, junction reverse recovery time, bipolar base transit time (fT), metal-oxide-semiconductor (MOS) transistor threshold voltage, MOS transistor subthreshold swing, MOS channel leakage, punch-through breakdown voltage (BV) and impact ionization breakdown voltage (BV), to name a few.

Figure 41A:
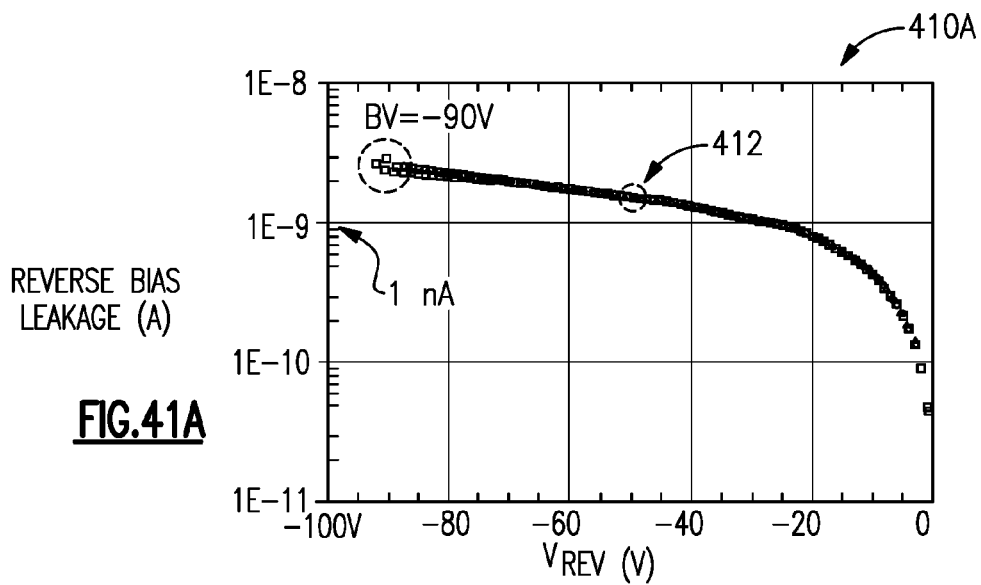
FIG. 41A is a graph showing experimental current-voltage curves under reverse bias and breakdown under reverse bias of fabricated wear-out monitor devices similar to the device schematically illustrated in FIG. 40.

FIG. 41A illustrates a graph 410A showing experimental current-voltage (IV) curves 412 under reverse bias and breakdown under reverse bias of fabricated wear-out monitor devices similar to the device schematically illustrated in FIG. 40. The IV curves 412 are those of 50 different as-fabricated devices, indicating a high degree of device-to-device uniformity in electrical performance, as indicated by similar breakdown voltages (BV) and leakage currents between different devices.

Figure 41B:
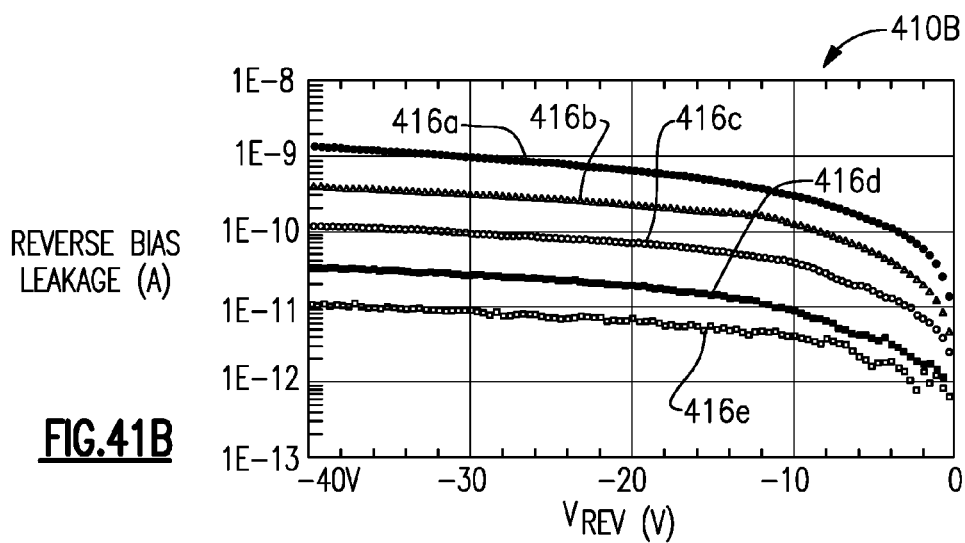
FIG. 41B is a graph showing experimental current-voltage curves under reverse bias of a fabricated wear-out monitor device similar to the device schematically illustrated in FIG. 40, after being subject to different durations of thermal stress at 200° C.

FIG. 41B illustrates a graph 410B showing experimental current-voltage (IV) curves under reverse bias of a fabricated wear-out monitor device similar to the device schematically illustrated in FIG. 40, after being subject to different durations of thermal stress at 200° C. In particular, the IV curves 416a-416e represent measurements taken after various bake times, including as fabricated (416e), after baking for approximately 1 day (416d), after baking for approximately 2 days (416c), after baking for approximately 3 days (416b) and after baking for approximately 4 days (416a), As illustrated, the leakage current increases with increasing bake time.

Figure 41C:
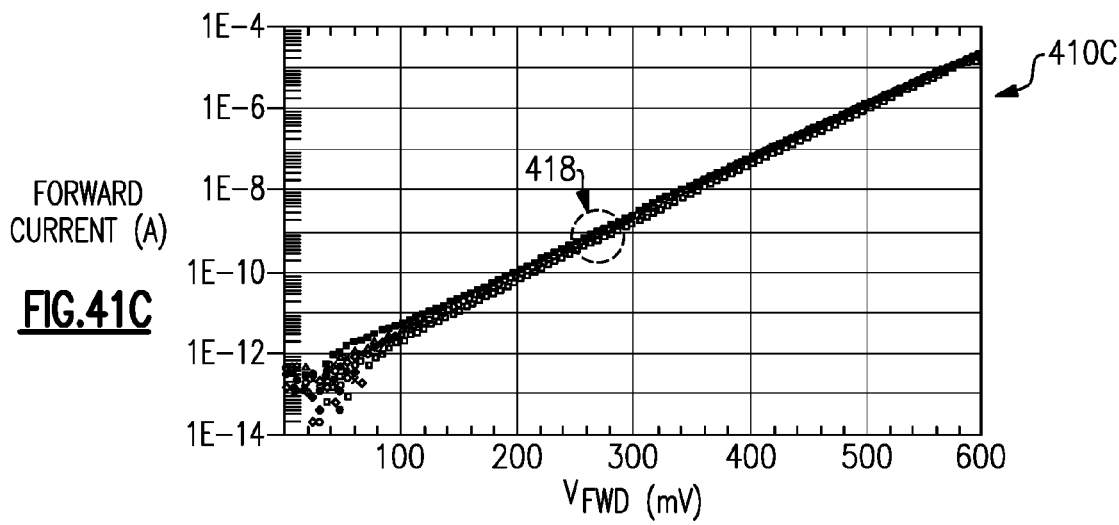
FIG. 41C is a graph showing experimental current-voltage curves under forward bias of a fabricated wear-out monitor device similar to the device schematically illustrated in FIG. 40.

FIG. 41C illustrates a graph 410C showing experimental current-voltage curves under forward bias of a fabricated wear-out monitor device similar to the device schematically illustrated in FIG. 40. In particular, the IV curves 418 represent overlapping measurements under a forward bias, taken after various bake times, including as-fabricated and after baking for approximately 1 day to 4 days, corresponding to IV curves (416e-416a) of FIG. 41B under reverse bias.

Figure 42A:
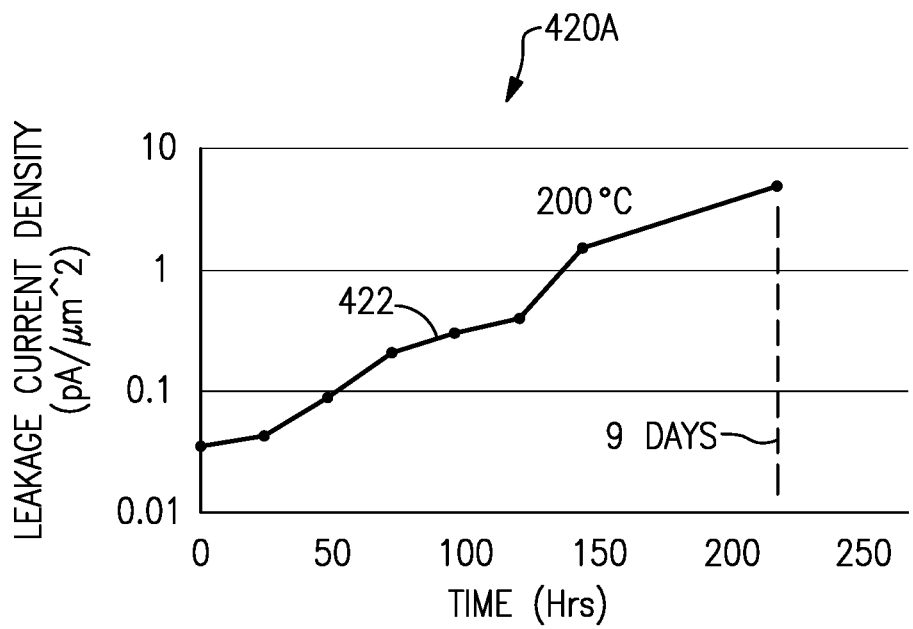
FIG. 42A is a chart plotting experimental leakage currents under reverse bias of a fabricated wear-out monitor device similar to the device schematically illustrated in FIG. 40, after being subject to different durations of thermal stress at 200° C.

FIG. 42A illustrates a chart 420A plotting experimentally measured leakage currents under reverse bias of a fabricated wear-out monitor device similar to the device schematically illustrated in FIG. 40, after being subjected to different durations of thermal stress at 200° C. The chart 420A shows a plot 422 of experimental leakage current measured at 5 V after being subject to different durations of thermal stress at 200° C. In particular, the plot 422 plots measurements taken after various bake times, including as fabricated and after baking for approximately 1-9 days. As illustrated, the leakage current increases with increasing bake time.

Figure 42B:
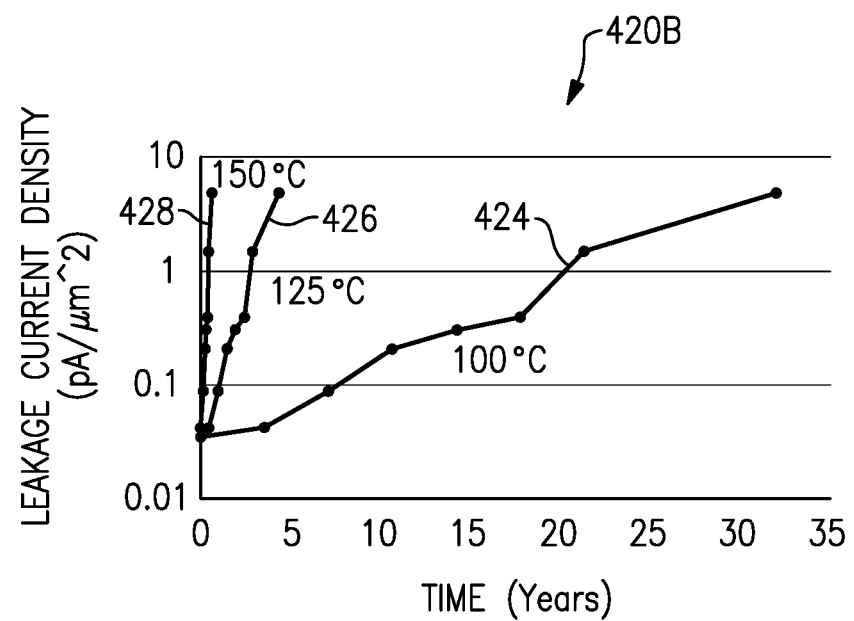
FIG. 42B is a chart plotting calculated leakage currents under reverse bias of a fabricated wear-out monitor device similar to the device schematically illustrated in FIG. 40, after being subject to different durations of thermal stress at different temperatures.

FIG. 42B is a chart 420B plotting calculated leakage currents under a reverse bias after being subjected to different durations of thermal stress at different temperatures, based on the chart 420A of FIG. 42A which plots experimentally measured leakage currents of a fabricated wear-out monitor device similar to the device schematically illustrated in FIG. 40. In particular, the chart 420B shows calculated plots 424, 426 and 428, whose calculations are based on the experimental leakage currents illustrated above with respect to the plot 422 of FIG. 42A, which represents measurements taken after various bake times, including as fabricated and after baking for approximately 1-9 days. For example, without being bound to any theory, the leakage current density as a function of bake time can be calculated based on an expression that can be derived analogously to a time-dependent diffusion equation based on Fick's Second Law, for example. Based on such expression, experimentally determined time dependence of leakage current at one bake temperature can be used to predict the time dependence of leakage current at other bake temperatures. As illustrated, the leakage current increases at a faster rate with increasing bake temperature.

Figure 42C:
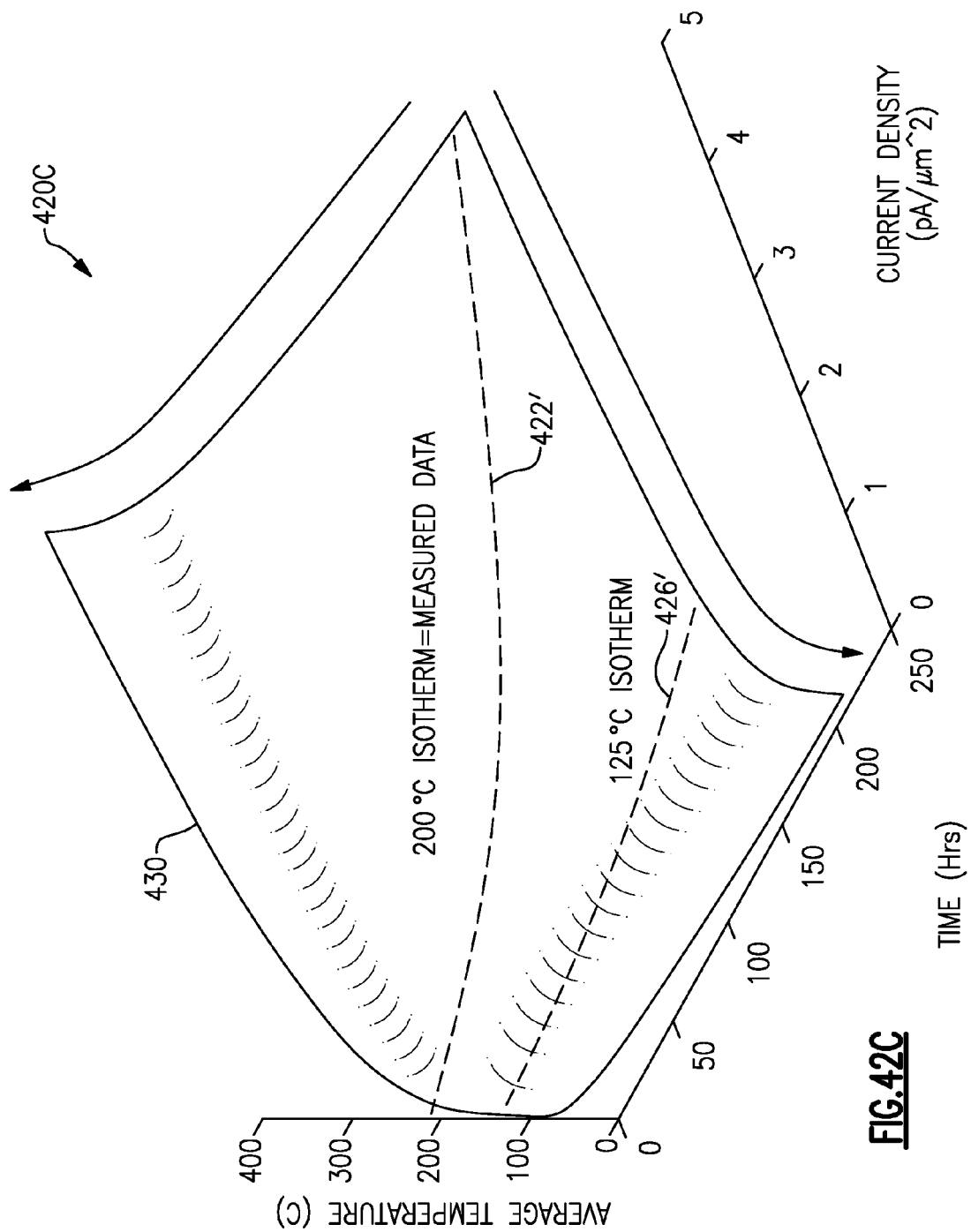
FIG. 42C is a contour chart plotting leakage currents under reverse bias of a fabricated wear-out monitor device similar to the device schematically illustrated in FIG. 40, as a function of different durations and temperatures of thermal stress.

FIG. 42C is a contour chart 420C plotting leakage currents under a reverse bias after being subjected to different durations of thermal stress at different temperatures, based on the chart 420A of FIG. 42A, which plots experimentally measured leakage currents, and based on the chart 420B of FIG. 42B, which plots calculated leakage currents, of a fabricated wear-out monitor device similar to the device schematically illustrated in FIG. 40. Based on such a contour plot, a predictive time and temperature dependence of leakage current can be determined for any temperature range and any time range in which the diffusion of monitor atoms is expected to follow a predictive behavior, as discussed supra.

CONCLUSION

In the embodiments described above, apparatus, systems, and methods for wear-out monitors are described in connection with particular embodiments. It will be understood, however, that the principles and advantages of the embodiments can be used for any other systems, apparatus, or methods with a need for monitoring wear-out. In the foregoing, it will be appreciated that any feature of any one of the embodiments can be combined and/or substituted with any other feature of any other one of the embodiments.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," "infra," "supra," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All suitable combinations and subcombinations of features of this disclosure are intended to fall within the scope of this disclosure.

What is claimed is:

1. An integrated circuit device with wear out monitoring, the integrated circuit device comprising:
   a core circuit;
   a wear-out monitor device configured to adjust an indication of wear out of the core circuit regardless of whether the core circuit is activated; and
   a sensing circuit configured to detect an electrical property associated with the wear-out monitor device, wherein the electrical property is indicative of the wear out of the core circuit,
   wherein the wear-out monitor device comprises a substrate and monitor atoms configured to diffuse in the substrate, wherein a doping profile of the monitor atoms in the substrate is indicative of wear out of the core circuit.

2. The integrated circuit device of claim 1, wherein the monitor atoms have a diffusion activation energy between 0.75 eV and 2.5 eV in the substrate.

3. The integrated circuit device of claim 1, wherein the monitor atoms include one or more elements selected from the group consisting of aluminum (Al), cobalt (Co), platinum (Pt), sulfur (S), nickel (Ni), silver (Ag), zinc (Zn), gold (Au), chromium (Cr), copper (Cu), iron (Fe), sodium (Na), and potassium (K).

4. The integrated circuit device of claim 1, wherein the core circuit and the wear-out monitor device are formed in the substrate that is a common substrate formed of a semiconductor material and configured such that the monitor atoms remain in the wear-out monitor device under a wear-out stress without diffusing into the core circuit.

5. The integrated circuit device of claim 1, wherein the wear-out monitor device comprises a reservoir of the monitor atoms formed on a surface of the substrate, wherein the reservoir serves as a first electrode of the wear-out monitor device, and wherein the wear-out monitor device further comprises a second electrode on the surface formed of a different material than the first electrode.

6. The integrated circuit device of claim 5, wherein the substrate comprises a semiconductor material as a diffusing medium for the monitor atoms.

7. The integrated circuit device of claim 6, wherein the monitor device comprises a PN junction, wherein the reservoir physically contacts one of a p-doped region or an n-doped region of the PN junction, and wherein the second electrode electrically contacts the other of the p-doped region or the n-doped region.

8. The integrated circuit device of claim 7, wherein the electrical property includes a reverse bias current of the PN junction.

9. The integrated circuit device of claim 6, wherein the monitor device comprises a first doped region and a second doped region that are separated from each other and configured to punch-through under a bias between the first doped region and the second doped region, wherein the first doped region and the second doped region have opposite conductivity types, and wherein the monitor atoms are configured to diffuse from the first doped region towards the second doped region under the bias.

10. The integrated circuit device of claim 9, wherein the second doped region is a buried region that is vertically separated from the first doped region that is formed at a surface of the semiconductor material.

11. The integrated circuit device of claim 9, wherein the first doped region and the second doped region are formed at a surface region of the semiconductor material and are laterally separated from each other.

12. The integrated circuit device of claim 6, wherein the monitor device comprises a field effect transistor comprising a source region and a drain region that are separated from each other by a channel region, and wherein, under a bias, the monitor atoms are configured to diffuse from one of the source region or the drain region into the channel towards the other of the source region or the drain region.

13. The integrated circuit device of claim 6, further comprising a reference device coupled to the sensing circuit, wherein the sensing circuit is configured to provide an indication of wear-out based on a comparison of the electrical property of the wear-out monitor device with a corresponding electrical property of the reference device.

14. The integrated circuit device of claim 13, wherein the reference device comprises the same type of device as the wear-out monitor device while having at least one electrode formed of a material different than a corresponding electrode of the wear-out monitor device having the monitor atoms.

15. The integrated circuit device of claim 1, wherein the monitor atoms are configured such that a wear-out stress causes a change in a rate at which the monitor atoms diffuse in the substrate.

16. The integrated circuit device of claim 1, wherein the wear-out monitor device comprises a p-doped region and an n-doped region, wherein the p-doped region comprises a p-type dopant different from the monitor atoms and the n-doped region comprises an n-type dopant different from the monitor atoms.

17. The integrated circuit device of claim 1, wherein the indication of wear-out is indicative of one or more of a thermal stress, a voltage stress, or a current stress.

18. The integrated circuit device of claim 1, wherein the indication of wear out is based on diffusion of monitor atoms in the wear-out monitor device.

19. The integrated circuit device of claim 1, wherein the wear-out monitor device and the core circuit are integrated in a common substrate.

20. The integrated circuit device of claim 1, wherein the substrate comprises a semiconductor substrate.

21. The integrated circuit device of claim 1, wherein the substrate comprises an insulating substrate.

22. A method of monitoring a wear-out of an integrated circuit device comprising a core circuit and a wear-out monitor device, the method comprising:
    detecting an electrical property of a wear-out monitor device, wherein the wear-out monitor device comprises a semiconductor material and monitor atoms configured to diffuse into the semiconductor material, and wherein the electrical property corresponds to a concentration profile of the monitor atoms in the semiconductor material that is indicative of wear-out of the core circuit; and
    reporting the electrical property of the wear-out monitor device.

23. The method of claim 22, wherein, prior to detecting, subjecting the integrated circuit device to a stress condition that causes the monitor atoms to diffuse in the semiconductor material.

24. The method of claim 23, wherein the monitor device comprises a plurality of doped regions and a reservoir of the monitor atoms physically contacting one of the doped regions and serving as an electrode, and wherein detecting the electrical property comprises measuring a current or a voltage using the electrode.

25. The method of claim 23, wherein the stress condition comprises one or more of a thermal stress condition, a voltage stress condition, or a current stress condition.

26. The method of claim 22, further comprising determining whether the wear-out of the core circuit has reached a predetermined level based on the detected electrical property of the wear-out device.

27. The method of claim 22, wherein the monitor atoms have a diffusion activation energy between 0.75 eV and 2.5 eV in the semiconductor material.

28. The method of claim 22, wherein the wear-out monitor device and the core circuit are integrated in a common substrate.

29. An integrated circuit device with wear-out monitoring, the integrated circuit device comprising: a core circuit;
    means for recording wear-out of the core circuit as a doping profile of a diffusing material in a substrate wherein the doping profile is indicative of wear out of the core circuit; and means for detecting an indication of wear-out of the core circuit, the means for recording wear-out being in communication with the means for recording the indication of wear-out.

30. The integrated circuit device of claim 29, wherein the diffusing material has a diffusion activation energy in the substrate between 0.75 eV and 2.5 eV.

31. The integrated circuit device of claim 29, wherein the diffusing material include one or more elements selected from the group consisting of aluminum (Al), cobalt (Co), platinum (Pt), sulfur (S), nickel (Ni), silver (Ag), zinc (Zn), gold (Au), chromium (Cr), copper (Cu), iron (Fe), sodium (Na), and potassium (K).

32. The integrated circuit device of claim 29, wherein the substrate comprises a semiconductor substrate.

33. The integrated circuit device of claim 29, wherein the means for recording wear-out and the core circuit are integrated in a common substrate.

* * * * *